(12) United States Patent
Sharma et al.

(10) Patent No.: US 8,473,874 B1
(45) Date of Patent: Jun. 25, 2013

(54) METHOD AND APPARATUS FOR AUTOMATICALLY FIXING DOUBLE PATTERNING LOOP VIOLATIONS

(75) Inventors: Karun Sharma, San Jose, CA (US);
Min Cao, San Ramon, CA (US); Roland Ruehl, San Carlos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 4 days.

(21) Appl. No.: 13/215,113

(22) Filed: Aug. 22, 2011

(51) Int. Cl.
*G06F 17/50* (2006.01)
*G03F 1/00* (2006.01)
*G21K 5/00* (2006.01)

(52) U.S. Cl.
CPC .............. *G06F 17/5081* (2013.01); *G03F 1/00* (2013.01); *G21K 5/00* (2013.01)
USPC .................... 716/52; 716/53; 716/54; 716/55; 716/119; 716/122; 716/123; 716/124; 716/132; 700/98; 700/120; 700/121

(58) Field of Classification Search
CPC ............ G06F 17/5081; G03F 1/00; G21K 5/00
USPC ................ 716/52, 53, 54, 55, 119, 122, 123, 716/124, 132; 700/98, 120, 121; 430/5; 378/35
See application file for complete search history.

(56) References Cited

U.S. PATENT DOCUMENTS

| | | | |
|---|---|---|---|
| 5,552,996 A | 9/1996 | Hoffman et al. | |
| 5,739,898 A | 4/1998 | Ozawa et al. | |
| 5,784,289 A | 7/1998 | Wang | |
| 5,923,566 A | 7/1999 | Galan et al. | |
| 6,047,116 A * | 4/2000 | Murakami et al. | 716/54 |
| 6,083,275 A | 7/2000 | Heng et al. | |
| 6,189,130 B1 | 2/2001 | Gofman et al. | |
| 6,518,180 B1 | 2/2003 | Fukuda | |
| 6,553,562 B2 | 4/2003 | Capodieci et al. | |
| 6,574,782 B1 | 6/2003 | Dewey, III et al. | |
| 6,578,190 B2 | 6/2003 | Ferguson et al. | |
| 6,586,341 B2 | 7/2003 | Moniwa et al. | |
| 6,625,802 B2 | 9/2003 | Singh et al. | |
| 6,670,080 B2 | 12/2003 | Sugita et al. | |
| 6,721,938 B2 | 4/2004 | Pierrat et al. | |

(Continued)

OTHER PUBLICATIONS

U.S. Appl. No. 12/251,455, filed Oct. 14, 2008, Wang, Xiajun, et al.

(Continued)

*Primary Examiner* — Phallaka Kik
(74) *Attorney, Agent, or Firm* — Adeli & Tollen LLP

(57) ABSTRACT

A method for automatically generating and prioritizing several design solutions that resolve a double patterning (DP) loop violation in an IC design layout. The method of some embodiments receives a DP loop violation marker and identifies pairs of edges of shapes that form a double patterning loop based on the DP loop violation marker. For each pair of edges that violates the design rule, the method generates one or more design solutions. Each design solution moves a single edge or both edges to resolve the violation. The method of some embodiments computes the cost of applying each design solution to the IC design layout and prioritizes the generated solutions for all the identified pairs of edges based on the computed cost for each solution. The method in some embodiments then selects a solution from the prioritized solutions and applies the selected solution to the design layout.

22 Claims, 39 Drawing Sheets

U.S. PATENT DOCUMENTS

| | | | |
|---|---|---|---|
| 6,893,800 B2 | 5/2005 | Jessen et al. | |
| 7,266,803 B2 | 9/2007 | Chou et al. | |
| 7,546,556 B1 * | 6/2009 | Wagner | 716/110 |
| 7,831,942 B1 | 11/2010 | Gennari et al. | |
| 7,861,196 B2 | 12/2010 | Huckabay et al. | |
| 7,930,653 B2 | 4/2011 | Ivansen et al. | |
| 8,069,423 B2 | 11/2011 | Ghan et al. | |
| 8,151,219 B2 | 4/2012 | Huckabay et al. | |
| 8,209,656 B1 | 6/2012 | Wang et al. | |
| 8,239,806 B2 | 8/2012 | Chen et al. | |
| 8,365,102 B2 * | 1/2013 | Wang et al. | 716/51 |
| 2003/0087193 A1 * | 5/2003 | Okada et al. | 430/311 |
| 2003/0229881 A1 | 12/2003 | White et al. | |
| 2004/0058255 A1 | 3/2004 | Jessen et al. | |
| 2004/0216065 A1 | 10/2004 | Cobb et al. | |
| 2004/0219441 A1 * | 11/2004 | Nakao et al. | 430/5 |
| 2005/0044514 A1 | 2/2005 | Wu et al. | |
| 2005/0076316 A1 | 4/2005 | Pierrat et al. | |
| 2005/0162627 A1 | 7/2005 | Finders et al. | |
| 2006/0062445 A1 | 3/2006 | Verma et al. | |
| 2006/0242613 A1 * | 10/2006 | Fukazawa | 716/8 |
| 2007/0031740 A1 | 2/2007 | Chen et al. | |
| 2007/0157154 A1 | 7/2007 | Socha | |
| 2008/0013061 A1 * | 1/2008 | Kato | 355/53 |
| 2008/0069432 A1 | 3/2008 | Hsu et al. | |
| 2008/0072207 A1 | 3/2008 | Verma et al. | |
| 2008/0144969 A1 | 6/2008 | Park | |
| 2009/0024967 A1 | 1/2009 | Su et al. | |
| 2009/0148783 A1 | 6/2009 | Socha | |
| 2009/0319978 A1 | 12/2009 | Gleason et al. | |
| 2010/0017779 A1 | 1/2010 | Kim | |
| 2010/0023914 A1 | 1/2010 | Sahouria et al. | |
| 2010/0037200 A1 | 2/2010 | Ghan et al. | |
| 2010/0119144 A1 | 5/2010 | Kulkarni et al. | |
| 2010/0315611 A1 * | 12/2010 | Kato | 355/55 |
| 2011/0022994 A1 | 1/2011 | Hu et al. | |
| 2011/0078638 A1 | 3/2011 | Kahng et al. | |
| 2011/0091797 A1 | 4/2011 | Chang et al. | |
| 2011/0097653 A1 | 4/2011 | Socha | |
| 2011/0167397 A1 | 7/2011 | Huckabay et al. | |
| 2011/0193234 A1 | 8/2011 | Chen et al. | |
| 2011/0197168 A1 | 8/2011 | Chen et al. | |
| 2011/0296360 A1 * | 12/2011 | Wang et al. | 716/106 |
| 2011/0318927 A1 | 12/2011 | Li et al. | |
| 2012/0091592 A1 * | 4/2012 | Chen et al. | 257/773 |
| 2012/0102442 A1 | 4/2012 | Ghan et al. | |
| 2012/0110521 A1 | 5/2012 | Agarwal et al. | |
| 2012/0124536 A1 | 5/2012 | Sharma | |
| 2012/0180006 A1 | 7/2012 | Baum et al. | |
| 2012/0196230 A1 | 8/2012 | Cho et al. | |
| 2012/0216157 A1 | 8/2012 | Luo et al. | |
| 2012/0227018 A1 | 9/2012 | Chih et al. | |
| 2012/0254813 A1 | 10/2012 | Chen et al. | |
| 2012/0266110 A1 * | 10/2012 | Cao et al. | 716/52 |

OTHER PUBLICATIONS

U.S. Appl. No. 12/948,755, filed Nov. 17, 2010, Sharma, Karun.
U.S. Appl. No. 13/215,118, filed Oct. 22, 2011, Wang, Xiajun.
Portions of prosecution history of U.S. Appl. No. 12/023,512, Nov. 22, 2010, Huckaby, Judy, et al.
Portions of prosecution history of U.S. Appl. No. 12/955,895, Aug. 16, 2011, Huckabay, Judy, et al.
Portions of prosecution history of U.S. Appl. No. 12/189,692, Jun. 30, 2011 Ghan, Justin, et al.
Portions of prosecution history of U.S. Appl. No. 12/251,455, Aug. 18, 2011 Wang, Xiaojun, et al.
Updated portions of prosecution history of U.S. Appl. No. 12/955,895, Feb. 27, 2012, Huckaby, Judy, et al.
Updated portions of prosecution history of U.S. Appl. No. 12/189,692, Oct. 18, 2011, Ghan, Justin, et al.
Portions of prosecution history of U.S. Appl. No. 13/271,194, Nov. 28, 2012, Ghan, Justin, et al.
Updated portions of prosecution history of U.S. Appl. No. 12/251,455, May 18, 2012, Wang, Xiaojun, et al.
Portions of prosecution history of U.S. Appl. No. 12/948,755, Jan. 30, 2013, Sharma, Karun.
Portions of prosecution history of U.S. Appl. No. 13/215,118, Nov. 13, 2012, Wang, Xiaojun, et al.
Kahng, Andrew B., et al., "Layout Decomposition for Double Patterning Lithography," ICCAD '08, Nov. 10-13, 2008, 8 pages, ACM, San Jose, CA.
Heng, Fook-Luen, et al., "A VLSI Artwork Legalization Technique Based on a New Criterion of Minimum Layout Perturbation," Proceedings of the 1997 International Symposium on Physical Design, Apr. 1997, 6 pages.

* cited by examiner

--Prior Art--

--Prior Art--

--Prior Art--

--Prior Art--

--Prior Art--

METHOD AND APPARATUS FOR AUTOMATICALLY FIXING DOUBLE PATTERNING LOOP VIOLATIONS

BACKGROUND

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect the IC's electronic and circuit components.

Design engineers design ICs by transforming logical or circuit descriptions of the ICs' components into geometric descriptions, called design layouts. Design layouts typically include (1) circuit modules (i.e., geometric representations of electronic or circuit IC components) with pins and (2) interconnect lines (i.e., geometric representations of wiring) that connect the pins of the circuit modules. In this fashion, design layouts often describe the behavioral, architectural, functional, and structural attributes of the IC. To create design layouts, design engineers typically use electronic design automation ("EDA") applications. These applications provide sets of computer-based tools for creating, editing, analyzing, and verifying design layouts. The applications also render the layouts on a display device or to storage for displaying later.

Fabrication foundries ("fabs") manufacture ICs based on the design layouts using a photolithographic process. Photolithography is an optical printing and fabrication process by which patterns on a photolithographic mask (i.e., "photomask," or "mask") are imaged and defined onto a photosensitive layer coating a substrate. To fabricate an IC, photomasks are created using the IC design layout as a template. The photomasks contain the various geometries or shapes (i.e., features) of the IC design layout. The various geometries or shapes contained on the photomasks correspond to the various base physical IC elements that comprise functional circuit components such as transistors, interconnect wiring, vertical interconnect access (via) pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

As more circuit features are packed into an IC design layout (e.g., manufacturing processes at feature sizes of 22 nm and below), the resolution of the photolithographic process makes it extremely difficult to fabricate the geometries or shapes on a single lithography mask. The difficulty stems from constraining factors in traditional photolithographic processes that limit the effectiveness of current photolithographic processes. Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain minimum width of a feature, minimum spacing between features, and other such physical manufacturing constraints.

For a particular layer of the IC fabrication process, the pitch specifies the sum of the width of a feature and the space on one side of the feature separating that feature from a neighboring feature on the same layer. The minimum pitch for a layer is the sum of the minimum feature width and the minimum spacing between features on the same layer. Depending on the photolithographic process at issue, factors such as optics and wavelengths of light or radiation restrict how small the pitch may be made before features can no longer be reliably printed to a wafer or mask. As such, the smallest size of any features that can be created on a layer of an IC is limited by the minimum pitch for the layer.

FIG. 1 illustrates a typical pitch constraint of a photolithographic process. In FIG. 1, a pitch 110 acts to constrain the spacing between printable features 120 and 130 of a design layout. While other photolithographic process factors such as the threshold 140 can be used to narrow the width 150 of the features 120 and 130, such adjustments do not result in increased feature density without adjustments to the pitch 110. As a result, increasing feature densities beyond a certain threshold is infeasible via a pitch constrained single exposure process.

To enhance the feature density, the shapes on a single layer can be manufactured on two different photolithographic masks. This approach is often referred to as "Double Patterning Lithography (DPL)" technology. FIG. 2 illustrates an example of this approach. In FIG. 2, a design layout 205 specifies three features 210-230 that are pitch constrained and therefore cannot be photolithographically printed with a conventional single exposure process. Analysis of the characteristics (e.g., the band limitation) of the available photolithographic process and of the design layout 205 results in the decomposition of the design layout 205 into a first exposure 240 for printing features 210 and 230 and a second exposure 250 for printing feature 220. As such, the features 210 and 230 are assigned to a first photomask for printing during the first exposure 240 and feature 220 is assigned to a second photomask for printing during the second exposure 250.

FIGS. 3A and 3B illustrate two different manners of using DPL technology. FIG. 3A illustrates sending different shapes of a layer to two different masks. In contrast, FIG. 3B illustrates decomposing one shape into several smaller shapes to send them to two different masks. Specifically, FIG. 3A illustrates sending five shapes 301-305 of a design layout 300 to two different masks. The shape pairs of the shapes 301 and 302; the shapes 302 and 303; the shapes 303 and 304; and the shapes 304 and 305 are all pitch constrained. Therefore, the two shapes of each pair must be sent to two different masks 310 and 315. Accordingly, the shapes 301 and 303 are sent to a first mask 310. That is, the shapes 301 and 303 are printed during a first exposure in order to produce contours 320. Similarly, the shapes 302, 304, and 305 are sent to a second mask 315. That is, the shapes 302, 304, and 305 are printed during a second exposure in order to produce contours 325. The resulting union of the contours 320 and 325 generates pattern 330 that is sufficient to approximately reproduce the original design layout 300.

FIG. 3B illustrates a decomposition of a pattern 340 defined in a layer of design layout for fabricating an IC into two sets of polygons 350 and 360. Each such decomposed set of polygons 350 and 360 is printed during an exposure of a multiple exposure photolithographic printing process. For instance, polygon set 350 is printed during a first exposure in order to produce contours 370 and polygon set 360 is printed during a second exposure in order to produce contours 380. The resulting union of the contours 370 and 380 generates pattern 390 that is sufficient to approximately reproduce the original pattern 340. Accordingly, a valid decomposition solution is such that the union of the contours created/printed from each exposure closely approximates specifications within the original design layout and satisfies multi-exposure photolithographic printing constraints (e.g., the band limit and the target layout specified within the design layout) with no resulting "opens", "shorts", or other printing errors materializing on the physical wafer.

To use DPL technology, the layout designers need to follow a set of design rules or constraints while designing the layout such that the shapes on a single design layer can be successfully fabricated using two different masks. Some available EDA tools assign two colors (e.g., red and green) to the shapes to identify the two masks with which the shapes will be fabricated. Each shape on a design layer begins with its color unassigned. The EDA tool assigns one of the two colors to each shape on the layer. Shapes that have been assigned to the same color must be spaced apart by at least a certain minimum distance specified by the design rules. Typically, the required minimum spacing between shapes assigned to the same color is greater than the required minimum spacing between two shapes with different colors because shapes with different colors are fabricated using different masks, bypassing the limitations of the single-exposure photolithographic process. In this application, the required minimum spacing between shapes assigned to the same color is referred to as a minimum same color spacing. The required minimum spacing between two shapes with different colors is referred to as a minimum spacing. Since a pitch specifies the sum of the width of a shape (i.e., feature) and the space on one side of the shape separating that feature from a neighboring shape, a minimum same color spacing is pitch minus the width of the shape in some embodiments. A specific color that is assigned to a particular shape is arbitrary. However, the assignment makes sure that the shapes adjacent to the particular shape that are spaced apart from the particular shape by less than the minimum same color spacing have different colors.

Some EDA tools model each shape in a design layout as a node in a graph. Two nodes are connected when the corresponding shapes are apart from each other at a distance smaller than the minimum same color spacing. After this modeling process, the layout is represented as clusters of graphs in which nodes are connected. Each node in a graph is assigned a color in such a way to make sure that the neighboring nodes have different colors. This is because when the neighboring nodes (e.g., a connected pair of nodes) have the same color, the corresponding shapes would violate a design rule that requires two shapes with the same color are apart from each other at a distance greater than or equal to the minimum same color spacing. However, when the nodes in a graph form a loop and there are an odd number of nodes in such graph, it is not possible to assign different colors to all pairs of nodes of the graph.

FIG. 4 illustrates a graph 405 that has three nodes that form such a loop. The graph 405 represents shapes 1-3 in a layer of a design layout 400. This figure illustrates three different color assignments 401-403 to show that it is not possible to assign different colors to adjacent nodes in a graph that has an odd number of nodes forming a loop. Nodes 1-3 of the graph 405 represent the shapes 1-3, respectively. Two different colors, a first color and a second color, are assigned to the shapes 1-3. The first color is depicted as gray and the second color is white in this example. This figure also illustrates a minimum same color spacing 410 depicted as a horizontal line with two ends having vertical bars. As shown, shape 3 is depicted as three connected rectangles. These three rectangles are connected by design and treated as one shape. The shapes depicted in the figures of this application shown as multiple connected rectangles are treated as one shape.

The shapes 1 and 2 are violating the pitch requirement. That is, the two shapes are apart from each other at a distance smaller than the minimum same color spacing 410. So are the shapes 2 and 3. So are the shapes 3 and 1 because the bottom portion of shape 3 is apart from the shape 2 at a distance smaller than the minimum same color spacing 410. Accordingly, the nodes 1-3 of the graph 405 are connected to each other, resulting in a loop. The three different colors assignments 401-403 show the three possible ways of assigning two different colors to the nodes 1-3 and the corresponding shapes 1-3. As shown, no matter how the color assignment is done, one pair of neighboring nodes has the same color. That is, there is always going to be a pair of shapes that would be violating the design rule.

FIG. 5 illustrates an example printing error that is materialized on the physical wafer when the three shapes 1-3 illustrated in FIG. 4 are sent to two different masks. Specifically, this figure shows a possible pattern 530 resulting from applying the color assignment 402 described above. As shown, the shapes 1-3 are divided into two sets of shapes 510 and 515 according to the color assignment 402. That is, the shape 2 is sent to the first of the two masks and the shapes 1 and 3 are sent to the second mask.

Each set of shapes is printed during an exposure of a double exposure photolithographic printing process (e.g., a DPL process). That is, the shape set 510 (i.e., the shape 2) is printed during the first exposure in order to produce contours 520 and the shape set 515 is printed during the second exposure in order to produce contours 525. However, because the shape 1 and the shape 3 were too close (e.g., within the minimum same color spacing 410) in the pattern 505, the contour for the shape 1 and the contour for shape 2 intersect in this example, resulting in a short. The resulting union of the contours 520 and 525 generates the pattern 530. As shown, the pattern 530 did not meet the specifications within the original design layout represented by the pattern 505 in which shapes 1 and 3 are not meant to connect to each other.

Using DPL techniques creates a new challenge for the layout designers because the designers have to satisfy the requirements of DPL techniques in addition to Design Rule Checking (DRC) and Design For Manufacturability (DFM) requirements. Moreover, fixing a double patterning (DP) loop violation is much more complex than fixing a DRC violation. This is because a DRC violation is usually a violation caused by a single shape or interaction of a few shapes whereas a DP loop violation is a set of spacing constraint violations between three or more shapes. It is also relatively more difficult to figure out whether moving a shape to fix a DP loop violation results in a new DP loop violation.

There are several existing approaches that address DP loop violations. One of the approaches is editing layouts manually. This approach is time and manpower intensive because the designers have to go through several iterations of edits to figure out the problems and fix them. Thus, this approach has to rely on skills of the designers in finding a solution to a DP loop violation, which is not as straightforward as finding a solution for a DRC violation.

Another of the existing approaches is an automatic Rip and Reroute technique. The Rip and Reroute technique rips the shapes and reroutes the shapes to resolve a design rule violation. The Rip and Reroute technique uses a minimum same color spacing as a spacing constraint. That is, this technique separates the shapes in a design layout such that all shapes are apart from one another at a distance greater than or equal to a minimum same color spacing. Using this technique therefore results in separating two shapes that have different colors at a distance that is greater than a distance at which shapes with different colors should be apart from each other.

Some Rip and Reroute techniques may be track-based. When the technique is track-based, the technique assigns different colors to predefined tracks. Thus, track-based Rip and Reroute technique may not fully utilize all available space in the design layout because the shapes may not occupy all available track spaces. In addition, the Rip and Reroute technique is computation-intensive and slow because the shapes have to be ripped and rerouted. Also, this technique is of limited use for full custom layouts because the technique modifies existing routing topology to fix a design violation. Finally, the technique also requires connectivity information in the layout.

BRIEF SUMMARY

Some embodiments of the invention provide a method for automatically generating and prioritizing several design solutions that resolve a double patterning (DP) loop violation in an IC design layout. The method of some embodiments receives a DP loop violation marker and identifies pairs of edges of shapes that form a double patterning loop based on the DP loop violation marker. For each pair of edges that violates the design rule, the method generates one or more design solutions. Each design solution moves a single edge or both edges to resolve the violation. Some design solutions may introduce new design rule violations. However, a goal of some embodiments is to find a design solution with the least chance of introducing new design rule violations. The method of some embodiments computes the cost of applying each design solution to the IC design layout and prioritizes the generated solutions for all the identified pairs of edges based on the computed cost for each solution. The method in some embodiments then selects a solution from the prioritized solutions and applies the selected solution to the design layout to resolve the double patterning loop violation in the design layout.

As described above, the method of some embodiments identifies pairs of violating edges based on a DP loop violation marker. A DP loop violation marker defines a loop formed by the violating shapes in the IC design layout. A DP loop violation marker can be rendered as a geometric shape (e.g., a rectangle, etc.) in the IC design layout. A DP loop violation marker in some embodiments has several child markers, which also can be rendered as geometric shapes in the IC design layout. Each child marker of the DP loop violation marker indicates that two shapes adjacent to the child marker are spaced at a distance smaller than a minimum same color spacing specified by a design rule.

In some embodiments, a spacing violation between two shapes is represented by a child marker positioned between the violating shapes. One edge (the violating edge) of each violating shape abuts the child marker. A design solution for the particular pair of violating shapes involves moving at least one of the two edges abutting the child marker such that the shapes no longer violate the design rule. In some cases, one or two marker-adjacent edges are moved perpendicular to one another to increase the spacing between the shapes. In other cases, one or two marker-adjacent edges are moved away from one another in a parallel direction to increase the spacing between the shapes. In yet other cases, a design solution requires both perpendicular and parallel movement of one or more of the shapes. To move edges, some embodiments move the shapes that have edges requiring movement. Some embodiments trim or enlarge shapes to move an edge.

The method of some embodiments generates several design solutions for each pair of edges that violates a design rule. For each design solution generated for a DP loop violation, the method of some embodiments computes a cost of applying the solution to the IC design layout. The method of some embodiments bases this cost on the number of shapes found within a certain threshold distance from each moved shape. This accounts for the number of potential new design rule violations introduced by moving the shape. The method also considers distances required for each shape to be moved. The method of some embodiments adjusts the computed cost based on the type of the shape found, the type of the shape to be moved, the distance at which the found shape is spaced from the moved shape, and other factors.

To prepare a design solution for cost analysis, the method of some embodiments defines a set of regions based on the new location of each moved shape in the design solution. These regions include an overlapping region, a minimum spacing region, and a minimum same color spacing region (also referred to as same color checking region). The overlapping region is the region the shape will occupy after it is moved according to the design solution. The minimum spacing region is the region outside the overlapping region and within the minimum spacing distance from the overlapping region. The minimum same color spacing region is the region outside the minimum spacing region and within the minimum same color spacing distance from the overlapping region.

The method of some embodiments uses the set of defined regions for a design solution to estimate the cost of implementing the design solution. In some embodiments, the method runs a query on each defined region in the set to find the shapes that fall in the defined regions. The method of some embodiments counts the number of shapes that fall in each region and computes costs for each region based on the numbers. When calculating costs for a defined region, the method of some embodiments does not count the shape being moved or any shape whose cost has already been computed for another defined region.

The method of some embodiments then performs local color checking operations to maintain the integrity of shape color assignments, which may change when shapes are moved. As described above, each shape on a single layer of an IC design layout may be assigned to one of two different colors (e.g., red and green) to indicate that the shape is to be fabricated on one of the two lithography masks on which the shapes on the layer will be fabricated. When a moved shape does not overlap with another shape after it is moved, the method of some embodiments removes the color assignment of the moved shape. Otherwise, the shape retains its assigned color.

In some embodiments, the method discounts the calculated cost of a design solution for amenable shapes found within the set of defined regions. The method of some embodiments finds all shapes falling outside the minimum spacing region and within the minimum same color spacing region. When the shapes found in the region have a uniform color and the moved shape has an assigned color that is different than the uniform color, the method discounts the cost of the shapes found in the minimum same color spacing region. The cost of the shapes is discounted because, while the shapes are within the same color spacing region, they do not introduce a design rule violation (or otherwise impair the movement of the shape in the direction specified by the design solution) since the shapes have a different color and are thus not subject to the same color spacing design rule. When the shapes found in the region have a uniform color but the moved shape has an assigned color that is the same as the uniform color, the discount is not applied. In some embodiments, when the shapes found in the region do not have a uniform color, the method does not apply a discount.

When no color is assigned to the moved shape and the shapes found in the minimum same color spacing region have a uniform color, the method of some embodiments discounts the cost of the shapes found in the minimum same color spacing region and assigns the moved shape to the alternate color of the uniform color. When no color is assigned to the moved shape and the shapes found in the minimum same color spacing region have non-uniform colors, the method does not discount the cost of the shapes found in the minimum same color spacing region.

Since moving contacts and vias has the potential to introduce design rule violations on two layers, the method of some embodiments adds an additional cost for design solutions requiring movement of contact or via shapes. This additional cost for moving a contact or via shape is configurable. In some cases, a shape that requires moving is not a contact or via, but encloses a contact or via such that the contact or via completely overlaps the shape. A via with such an enclosure may be subject to a minimum enclosure design rule. The method of some embodiments adds an additional cost for a contact or via shape only if, after moving the enclosing shape, the contact or via no longer completely overlaps the enclosing shape or violates the minimum enclosure design rule. That is, the method adds an additional cost for contact and via shapes that the design solution indirectly requires moving due to the movement of an enclosing shape.

The method of some embodiments weights the computed costs of a design solution based on the level of difficulty a particular type of shape found in a particular defined region is likely to present in implementing the design solution. A weight could be a multiplication factor applied to the cost calculated for a shape in some embodiments. In other embodiments, weights are scalar values assigned based on the shape and region type. The method of some embodiments assigns different weights to different shapes found in different regions. For instance, the method assigns the highest weight to an instance shape found in a region. An instance shape is a shape that belongs to a design instance, which is a group of shapes that are laid out in a pre-defined manner and can be reused for different locations of a design layout (e.g., a standard cell, custom cell, memory, hard macro, etc.). The shapes in some design instances are prearranged and immutable. The method of some embodiments assigns a cost of infinity to an instance shape found in the selected region to de-prioritize a design solution involving moving a shape from within a design instance.

The method assigns the second highest weight to the shapes that connect (or short circuit) to the moved shape. That is, a shape that falls within the overlapping region or abuts the overlapping region is assigned the second highest weight. The method assigns the third highest weight to the shapes that are found in the minimum spacing region (in violation of the minimum spacing design rule). The method assigns the fourth highest weight to contact or via shapes that are found in a region. That is, an additional weight will be assigned to the contact or via shape when a weight is already assigned to the contact or via shape, for example, by falling in a minimum spacing region. The method assigns the fifth highest weight to any non-special shapes (e.g., shapes that are not contact shapes, via shapes, or instance shapes, etc.) found in a region. The method assigns the sixth highest weight to the shapes found in the minimum same color spacing region (in violation of the minimum same color spacing design rule). The method assigns the seventh highest weight to the non-region-based costs. Non-region-based costs are described further below. The method assigns the eighth highest weight to the cost computed for moving a contact or via shape.

In some embodiments, the method computes a total cost for a design solution. The method computes costs for each shape moved by the design solution and sums the computed costs. The resulting cost is the overall cost for the design solution. The method computes the overall cost for each of the generated design solutions and prioritizes the design solutions based on the computed costs. For instance, the method assigns the highest priority to the design solution with the lowest computed cost.

The method of some embodiments then selects a design solution to apply to the design layout to resolve the DP loop violation. In some embodiments, the method analyzes each design solution from the highest priority solution to the lowest priority solution until the method finds a design solution that does not cause any new design rule violations when applied to the design layout. In some cases, none of the generated design solutions avoid creating a design rule violation when applied to the design layout. In such cases, the method of some embodiments may resolve the DP loop violation by decomposing shapes, as described below.

A DP loop violation may also be resolved using shape decomposition. Some embodiments of the invention provide a method for automatically decomposing a shape of an IC design layout into two or more shapes in order to resolve a DP loop violation involving the shape. In contrast to the method of some embodiments described above, this method does not involve moving an edge of a shape to resolve a DP loop violation. This method decomposes the shape by introducing one or more splicing graphs on the shape. These splicing graphs serve as cuts to be made on the shape. That is, the shape is decomposed based on the splicing graphs. In some cases, a splicing graph is a straight line. In other cases, a splicing graph is a curved line. By decomposing the shape into several shapes and assigning the shapes to alternating masks for the same layer, the method breaks the double patterning loop. That is, no pair of the shape and other shapes that form the loop will be assigned to the same color for a mask after the shape is decomposed. In some embodiments, the method introduces splicing graphs to more than one shape of the loop-forming shapes when necessary. Some embodiments minimize the number of splicing graphs introduced to the shape(s).

Instead of or in conjunction with receiving a DP loop violation marker, the method of some embodiments performs design rule-checking on a region of a design layout to identify a DP loop violation in the region. When a DP loop violation is identified, the method of some embodiments selects one DP loop and identifies the group of associated shapes for the DP loop. In some embodiments, two shapes in the region are deemed directly associated when the two shapes are within a minimum pitch requirement (e.g., when the two shapes are spaced apart at a distance smaller than a minimum same color spacing). Two shapes are deemed indirectly associated when the first of the two shapes is directly associated with a third shape that is directly associated with the second of the two shapes. Two shapes are also deemed associated when the first of the two shapes is directly or indirectly associated with a third shape that is directly or indirectly associated with the second of the two shapes.

Some embodiments use a shape graph to identify the group of associated shapes. The shape graph of some embodiments represents the relationships between the shapes of the design layout region. For instance, the shapes are represented as nodes of the shape graph and the nodes for any two shapes that are directly associated are connected by a link between them. Similarly, the nodes for indirectly associated shapes are indirectly connected through several links and nodes in the shape graph. Thus, all shapes of the group are directly or indirectly connected.

The method of some embodiments also identifies locations on all shapes in the identified group to place splicing graphs in the shapes. Some embodiments identify the locations based on one or more design constraints (e.g., a minimum pitch, or width plus minimum same color spacing, between portions of the shapes). For instance, some embodiments identify portions that are too close to each other to be printed in the same exposure (called "critical portions"). Some embodiments also identify the associations between these portions (e.g., identifying pairs of portions that are "adjacent" to each other and thus need to be printed in different exposures). The method of some embodiments identifies a dividing line between such portions as a splicing graph location.

Some embodiments define a set of segment graphs that represent each critical portion as a node or vertex of a segment graph, and each association between critical portions as a link in the graph. The method utilizes the set of segment graphs when assigning a color to each segment as will be described below. Some embodiments define a set of segment graphs before creating shape graphs and use the set of segment graphs to create the shape graphs. For instance, two shapes are deemed connected in a shape graph if a portion of one shape is in the same segment graph as a portion of the other shape.

The method of some embodiments uses a shape graph and a set of segment graphs for the segments (i.e., critical portions) that belong to the shapes represented in the shape graph in order to assign colors to the shapes in the group of associated shapes represented by the shape graph. Using these graphs, the method introduces one or more splicing graphs to one or more shapes in the group in such a way that minimizes the number of splicing graphs introduced. For instance, the method selects an initial node to select an initial shape and then assigns a color to the initial shape. The method of some embodiments selects a node in the shape graph that is connected to only one other node as the initial node. When there is no such node in the shape graph, the method selects a shape in the group that has the next fewest number of critical portions compared to the initial shape. The method assigns a color to the initial shape by assigning a color to each critical portion of the initial shape. In some embodiments, the method assigns the same color to all critical portions of the initial shape. When assigning a color to a critical portion, the method of some embodiments also colors all other critical portions that share the same segment graph with the critical portion of the initial shape that has just been colored. The method alternates the colors assigned to the critical portions sharing the same segment graph such that no two critical portions represented by a pair of connected nodes of the shared segment graph are assigned the same color.

When the method finishes assigning colors to all critical portions of the initial shape and all critical portions that share the same segment graphs with the critical portions of the initial shape, the method selects a next shape in the group for color assignment. The method selects the next shape based on certain criteria. In some embodiments, the criteria include (1) whether a shape includes a splicing graph (i.e., whether the shape has two or more critical portions assigned to different colors), (2) whether the shape is partially colored (i.e., whether the shape has at least one colored critical portion but not all critical portions are colored), (3) a number of critical portions that the shape has, etc. For instance, the method selects shapes that have no splicing graphs over shapes that have splicing graphs. The method selects shapes that are partially colored over shapes that are not colored. The method selects shapes with fewer critical portions over shapes with more critical portions. When two or more shapes are selected based on these criteria, the method of some embodiments uses a non-tying criterion (e.g., random selection) to select the next shape to color.

The method then colors the next shape in a similar manner to that which the method colored the initial shape. That is, the method assigns the same color to all critical portions of the shape and assigns alternate colors to all other critical portions that share the same segment graph with the critical portions of the shape being colored. When some of the critical portions of the shape are already colored, the method assigns the color that is assigned to the majority of the colored critical portions to all critical portions that have not been assigned colors. The method repeats the selection and coloring operations until all critical portions of all shapes in the group are assigned colors. The method will introduce one or more splicing graphs to one or more of the shapes in the group. One of the shapes with a splicing graph is a loop-forming shape. In this manner, the method resolves the DP loop violation by introducing one or more splicing graphs to break the DP loop. In some embodiments, when the number of splicing graphs introduced to the shapes in the group is not one, the method goes back to the point when it made a random choice in selecting a shape to assign color(s) (e.g., by undoing color assignments made after that point) and selects another shape for color assignment.

As described above, some embodiments consider all shapes in the group of associated shapes to resolve a DP loop violation. That is, these embodiments consider the loop-forming shapes as well as other shapes that are directly and indirectly associated with the loop-forming shapes. However, other embodiments consider only the loop-forming shapes to resolve the DP loop violation. That is, the method of some embodiments performs the selecting and coloring operations that are described above only on the loop-forming shapes to resolve the violation that these loop-forming shapes commit and assigns colors to the rest of the shapes in the group or design layout region.

In some cases, some DP loop violations may not be resolved by introducing splicing graphs in the shape(s) in the group of associated shapes. In such cases, the method of some embodiments attempts to resolve such DP loop violations by moving one or more edges of the shapes as described above. In some embodiments, the method determines that a DP loop violation may not be resolved by introducing splicing graphs when two critical portions of one shape are within a pitch requirement from each other (e.g., the two critical portions of the shape are spaced apart from each other at a distance smaller than a minimum same color spacing).

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

I. OVERVIEW

A. Resolving a DP Loop Violation by Moving Shape Edge(s)

Some embodiments of the invention provide a method for automatically generating and prioritizing several design solutions that resolve a double patterning (DP) loop violation in an IC design layout. The method of some embodiments receives a DP loop violation marker and identifies pairs of edges of shapes that form a double patterning loop based on the DP loop violation marker. For each pair of edges that violates the design rule, the method generates one or more design solutions. Each design solution moves a single edge or both edges to resolve the violation. Some design solutions may introduce new design rule violations. However, a goal of some embodiments is to find a design solution that does not introduce new design rule violations. The method of some embodiments computes the cost of applying each design solution to the IC design layout and prioritizes the generated solutions for all the identified pairs of edges based on the computed cost for each solution. The method in some embodiments then selects a solution from the prioritized solutions and applies the selected solution to the design layout to resolve the double patterning loop violation in the design layout.

A DP loop violation marker contains information regarding a DP loop violation in a design layout. In some embodiments, the information contained in the marker includes the coordinates of vertexes of a geometric shape that represents the marker in the design layout, the identifiers that identify the shapes that are forming the loop, the colors assigned to the violating shapes, the coordinates of the edges of the violating shapes, etc. A DP loop violation marker is represented as a geometric shape (e.g., a rectangular shape) in the design layout. The geometric shape representing the marker will share edges with the violating shapes in some embodiments. Throughout this application, a "marker" refers to the geometric shape that represents the marker as well as the data that contain the information regarding the violation, for simplicity of discussion.

Figure 1:
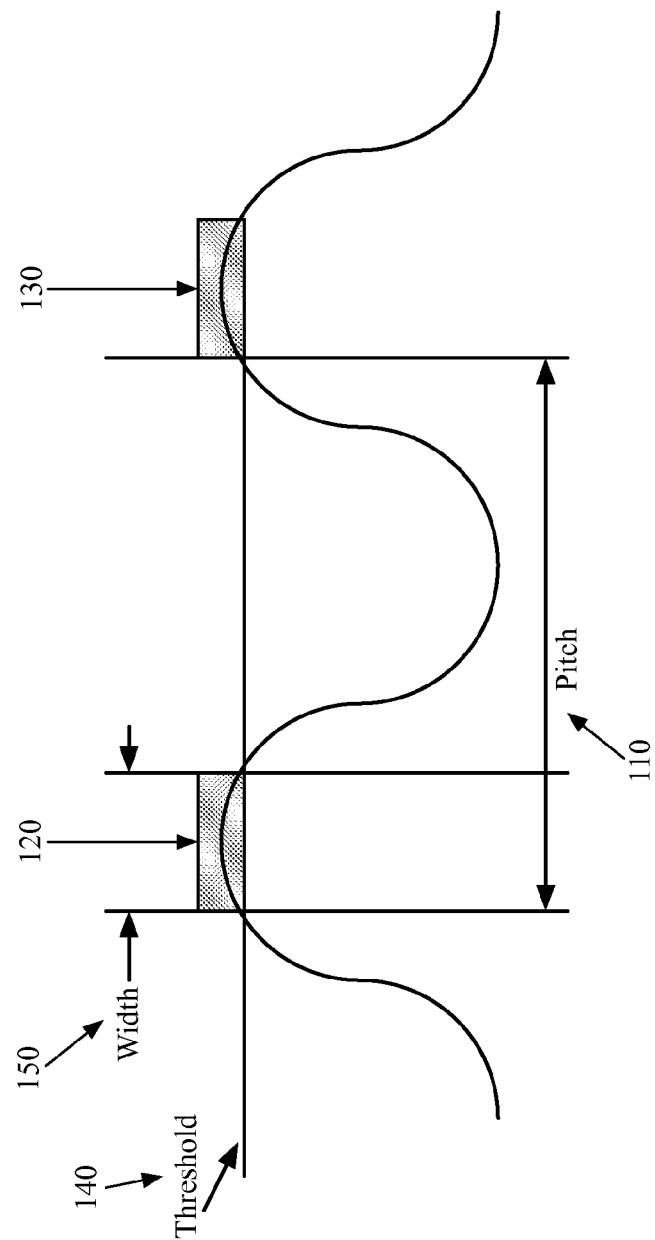
FIG. 1 illustrates a typical pitch constraint of a photolithographic process of some embodiments.
Figure 2:
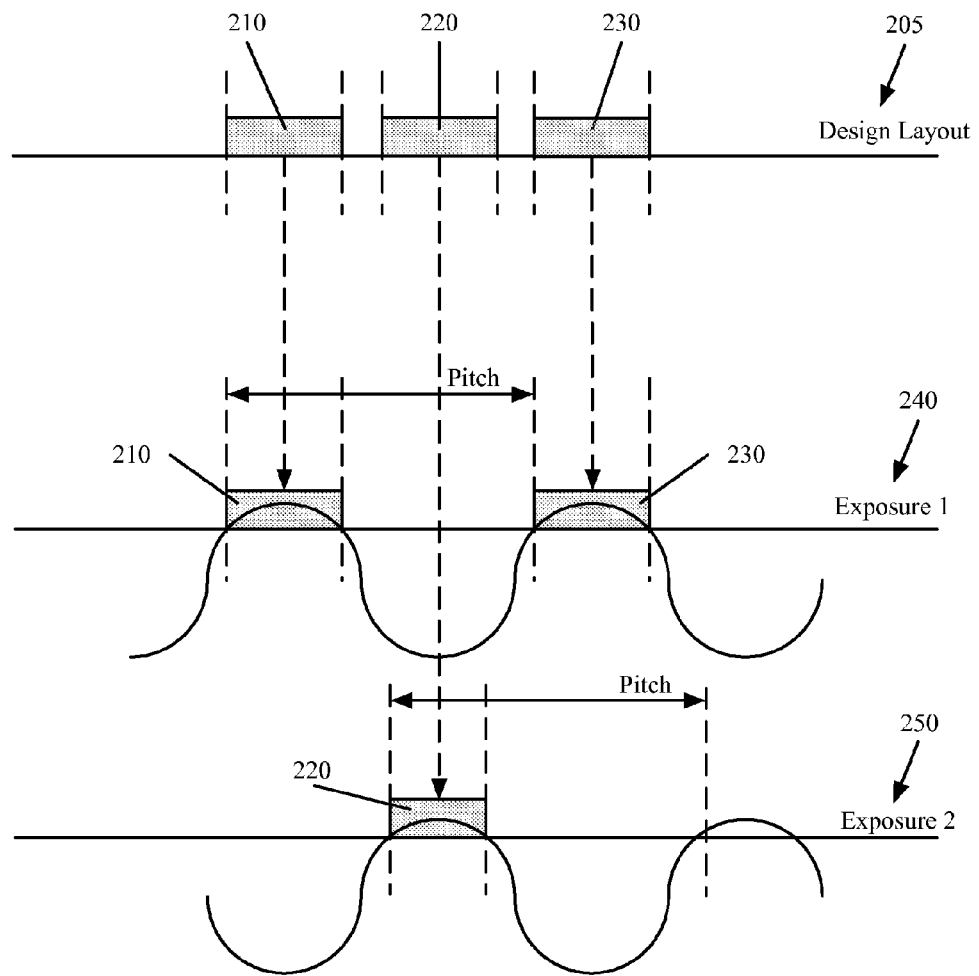
FIG. 2 illustrates an example of a multiple exposure photolithographic process of some embodiments.
Figure 3A:
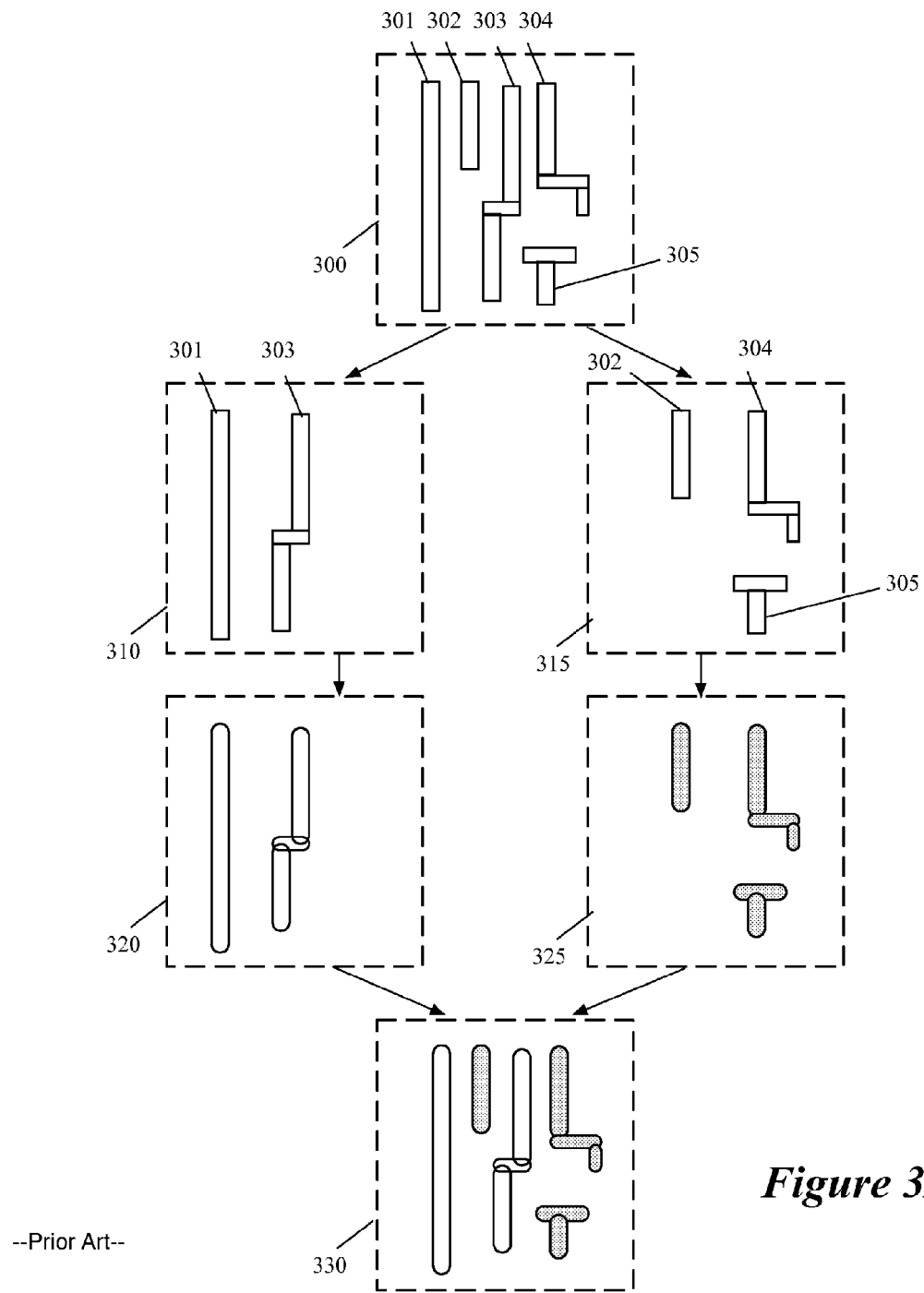
FIGS. 3A and 3B illustrates two examples of Double Patterning Lithography technology.
Figure 3B:
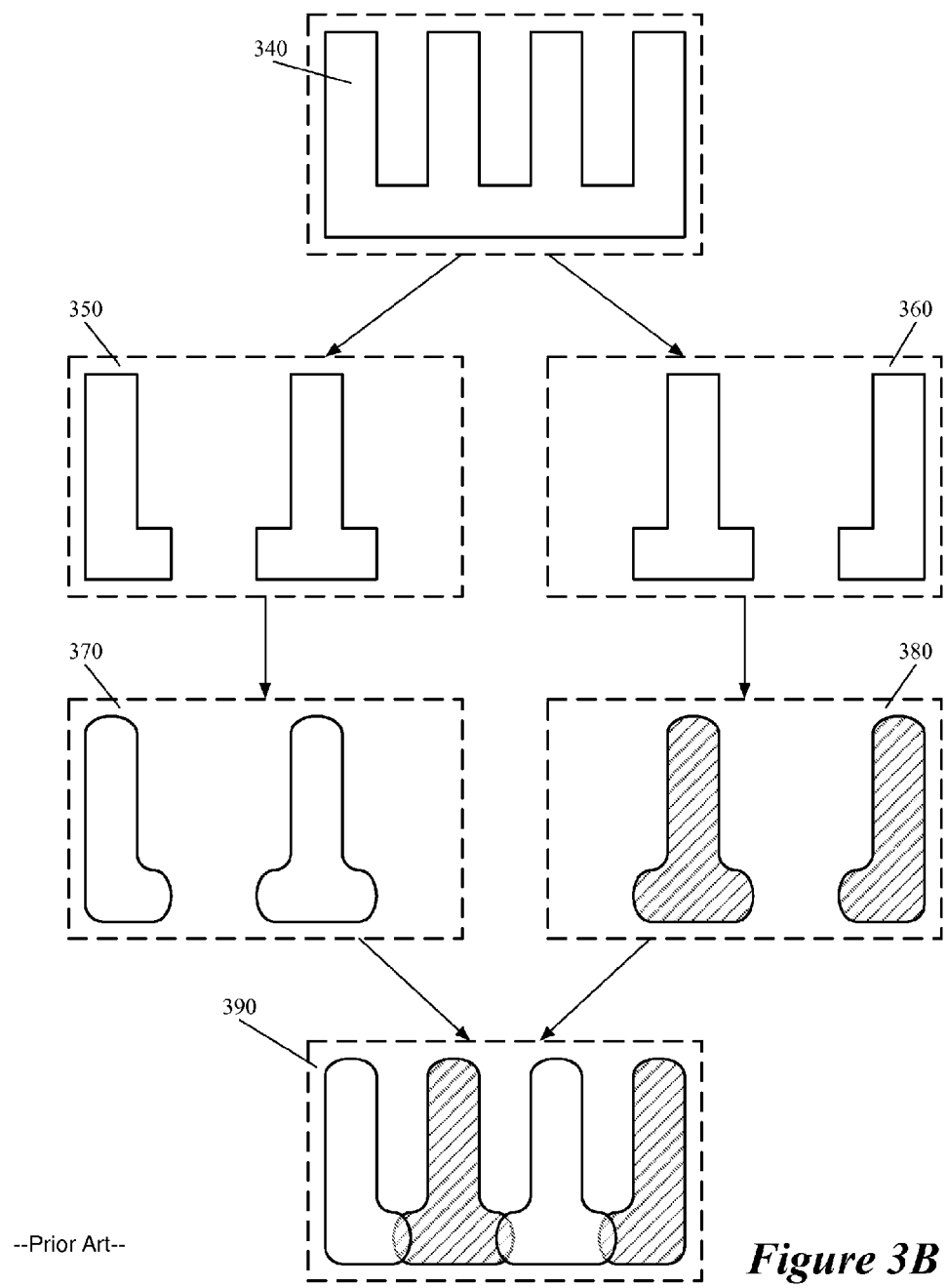
Figure 4:
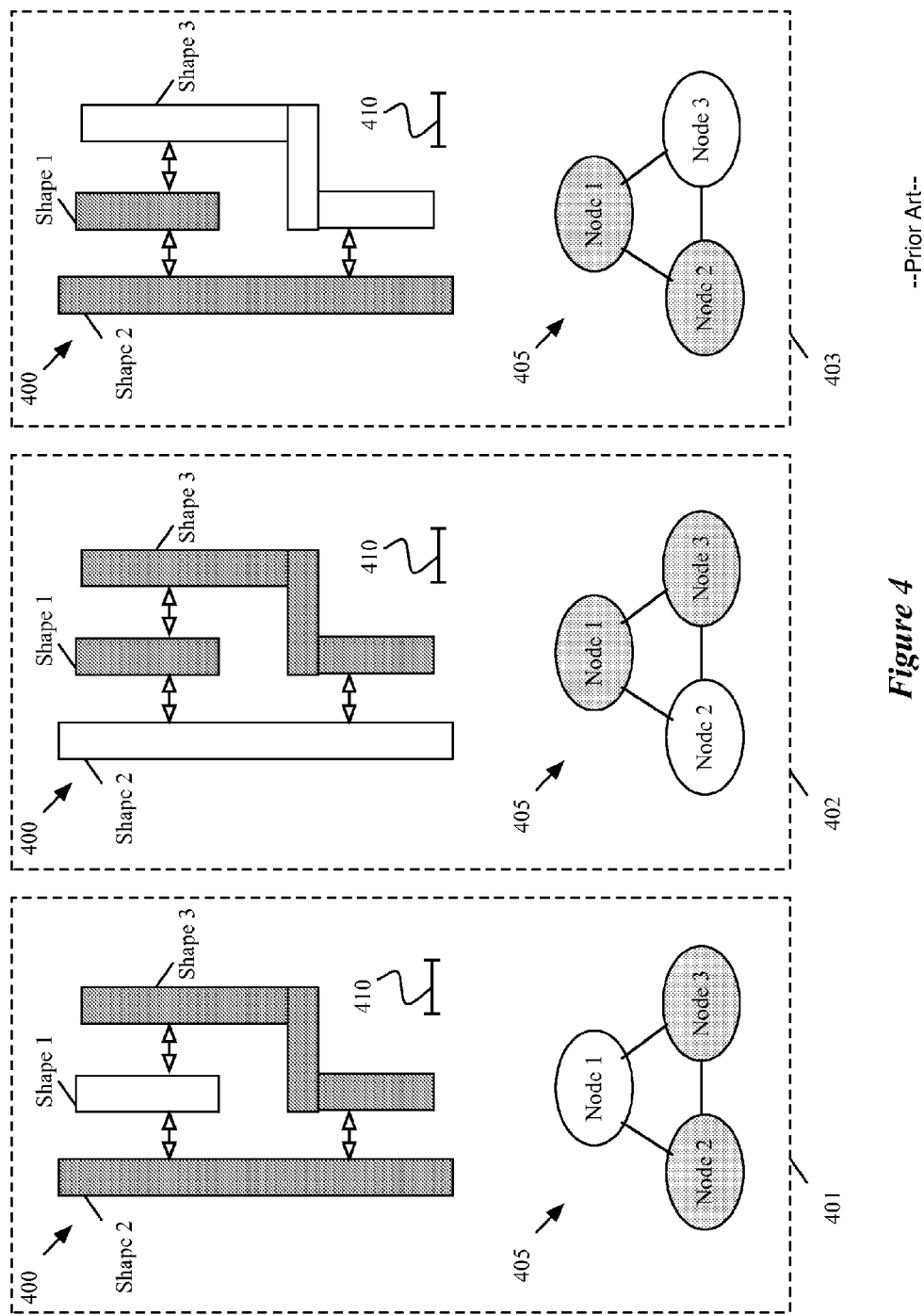
FIG. 4 illustrates a graph that has three nodes that are forming a double patterning (DP) loop.
Figure 5:
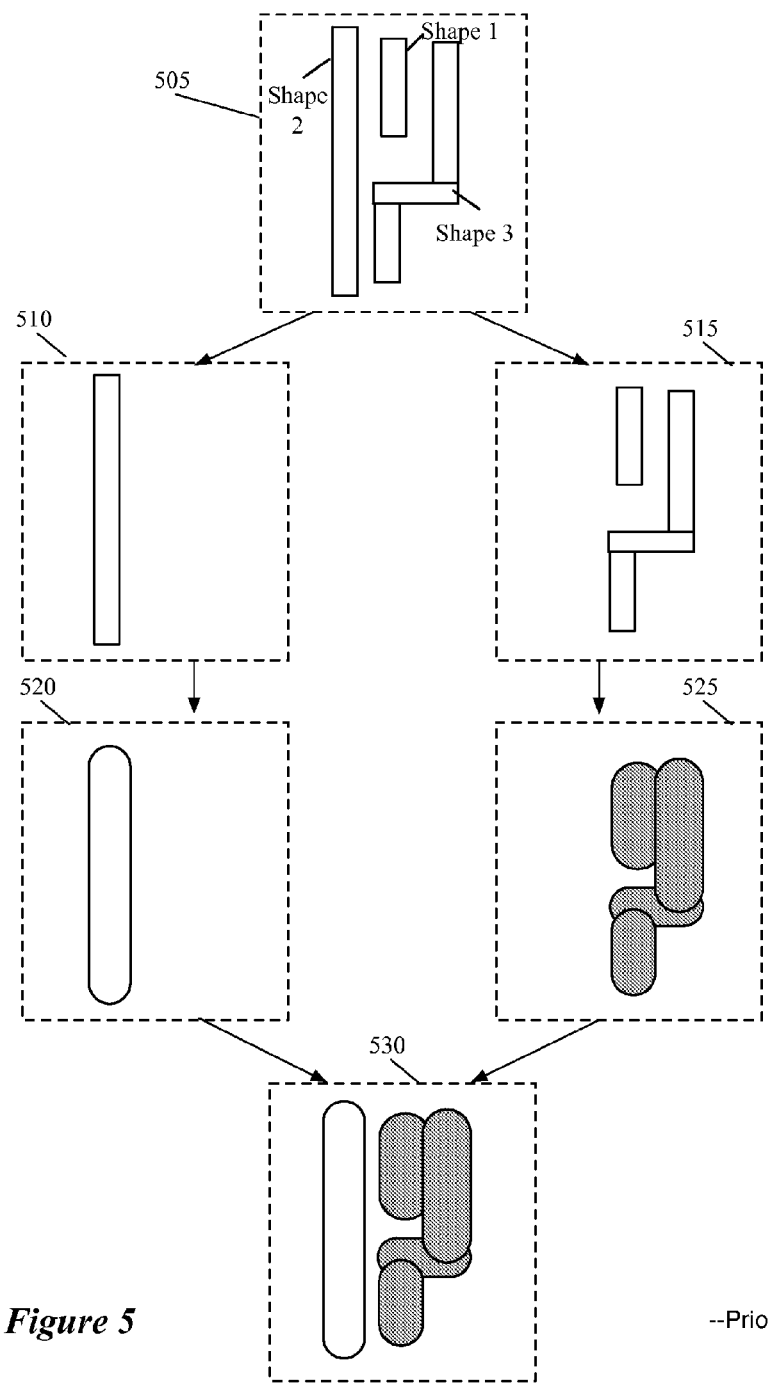
FIG. 5 illustrates an example printing error.
Figure 6:
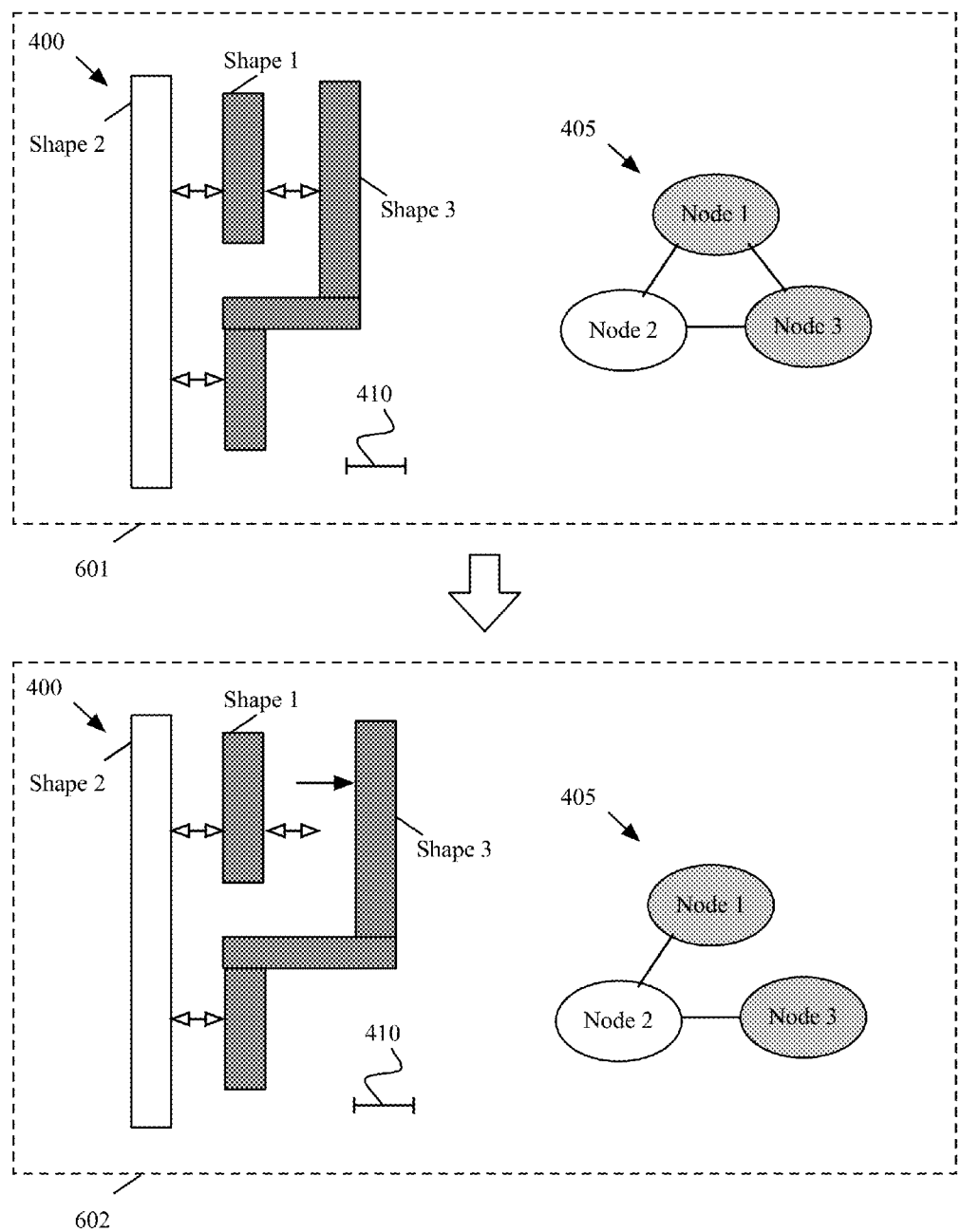
FIG. 6 illustrates an example of breaking a DP loop formed by an odd number of nodes in a graph by moving one of the corresponding shapes from a neighboring shape.

A DP loop violation can be resolved by breaking the loop with an odd number of nodes. The loop breaks when one of the shapes, which is represented by a node in the graph, is moved such that the shape is apart from one of its neighbors at a distance greater than the minimum same color spacing. FIG. 6 illustrates an example of breaking a DP loop formed by an odd number of nodes in a graph by moving one of the corresponding shapes from a neighboring shape. Specifically, this figure illustrates in two different stages 601 and 602 that a loop formed by the nodes 1-3 of the graph 405 is getting broken by moving shape 3 of the design layout 400 from shape 1. The design layout 400 and the graph 405 are described above by reference to FIG. 4.

In the first stage 601, the shapes 1-3 are apart from one another at a distance smaller than the minimum same color spacing 410. The shapes 1 and 3 are assigned to the same color and thus violating the design rule that imposes the minimum same color spacing 410 on any pair of neighboring shapes in the design layout 400. In the second stage 602, the loop formed by the nodes 1-3 is broken by moving the shape 3 to the right such that the shape 3 is apart from the shape 1 at a distance greater than the minimum same color spacing 400. To move edges, some embodiments move the shapes that have the moving edges. Some embodiments trim or enlarge shapes as the edge(s) of the shapes are moved. For instance, the horizontal rectangle of shape 3 is elongated to facilitate the movement of the upper vertical rectangle to the right.

Now the shapes 1 and 2 are apart from each other at a distance smaller than the minimum same color spacing, but these two shapes are not violating the design rule as long as different colors are assigned to these two shapes. The shapes 2 and 3 are not violating the design rule for the same reason. The shapes 3 and 1 are no longer violating the design rule because these two shapes are now further apart from each other at a distance that the design rule does not require to have different colors.

Figure 7:
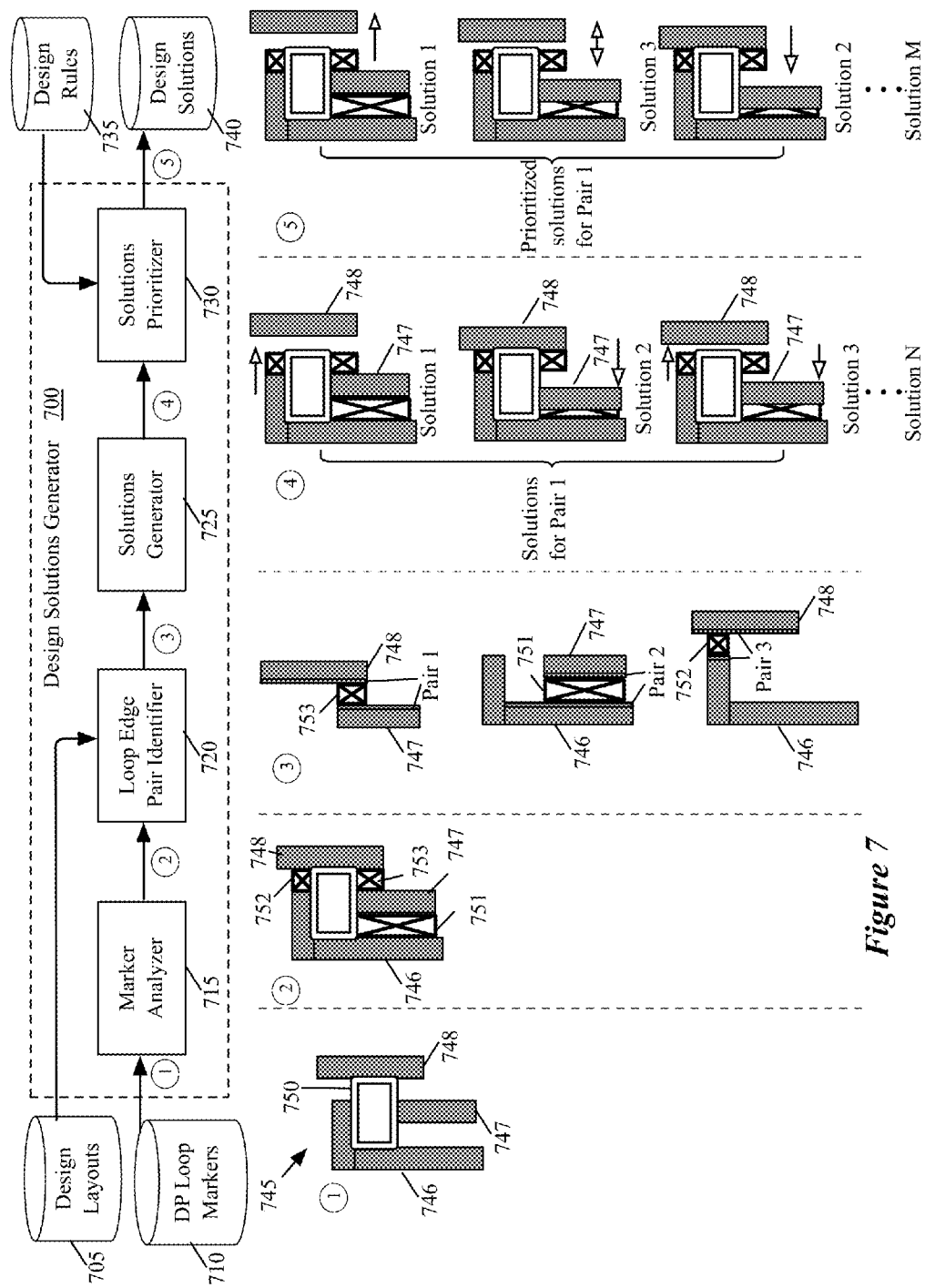
FIG. 7 conceptually illustrates a design solutions generator of some embodiments.

FIG. 7 conceptually illustrates a design solutions generator 700 of some embodiments. Specifically, the figure illustrates an example of generating and prioritizing design solutions that resolve a DP loop violation. The design solutions generator 700 retrieves a DP loop violation marker and a design layout and generates design solutions based on the DP loop violation marker. The design solutions generator 700 also prioritizes the generated design solution based on certain criteria.

This figure illustrates design layouts 705, DP loop violation markers 710, the design solutions generator 700, design rules 735, and design solutions 740. The design solutions generator 700 includes a marker analyzer 715, a loop edge pair identifier 720, a solutions generator 725, and a solutions prioritizer 730. This figure also illustrates a design layout 745, a DP loop violation marker 750, and three child markers 751, 752, and 753. The design layout 745 includes three shapes 746, 747, and 748 among other shapes (not shown).

The design layouts repository 705 stores design layouts. The design layouts repository 705 in some embodiments receives the design layouts from design software applications, which design engineers use to generate the design layouts. In some embodiments, the design layouts stored in the design layouts repository 705 are in a database file format, e.g., GDS II stream format (GDSII).

The DP loop violation marker repository 710 stores DP loop violation markers. The DP loop violation marker repository 710 in some embodiments receives markers from design software applications, which generate markers by checking the shapes in a design layout against a design rule that requires two shapes having the same color are not closer to each other than a threshold distance. By separating marker generation from design solution generation, some embodiments allow the design solutions generator 700 to be independent of the software applications that generate markers.

The marker analyzer 715 analyzes DP loop violation markers for DP loop violations in a design layout. The marker analyzer 715 retrieves a DP loop violation marker from the DP loop markers repository 710. The marker analyzer 715 identifies the necessary information for generating design solutions from a DP loop violation marker. For instance, the marker analyzer 715 identifies the design rule that is violated, the design layout that includes the set of shapes that violate the rule, the coordinates of the marker to render the marker as a geometric shape, etc. The marker analyzer 715 sends the identified information to other modules of the design solutions generator 700. For instance, the marker analyzer 715 sends the marker and the identification of the design layout 745 to the loop edge pair identifier 720. The shapes 746, 747, and 748 are only a region of a layout of the design layout 745. Other shapes are not depicted for simplicity.

In some embodiments, the marker analyzer 715 generates a set of child markers based on a DP loop violation marker. Like a DP loop violation marker, a child marker is also data that contains information and can be rendered as a geometric shape in the design layout. A child marker specifically identifies a pair of edges—one edge from one of two violating shapes and the other edge from the other of the two violating shapes. The identified edges are apart from each other at a distance that is smaller than a distance at which two shapes with the same color should be apart from each other (e.g., a minimum same color spacing). The geometric shape representing a child marker would be placed in between the identified edges of two violating shapes. For each pair of violating shapes, the marker analyzer 715 generates a child marker. For instance, the marker analyzer 715 generates three child markers 751, 752, and 753 for the three pairs of violating shapes of the design layout 745 as shown. The child markers are depicted as rectangles with two diagonal lines inside the rectangles in this figure. In some embodiments, the marker analyzer 715 may retrieve child markers along with a DP loop violation marker that is a parent marker of the child markers. That is, in these embodiments, the marker analyzer 715 uses the child markers generated by software applications that generate DP loop violation markers.

The loop edge pair identifier 720 identifies all pairs of edges of the violating shapes that form a loop. The loop edge pair identifier 720 identifies the pairs of edges based on the DP loop violation marker and the child markers received from the marker analyzer 715. The loop edge pair identifier 720 sends the information about the identified pairs of edges to the design solutions generator 725. For instance, the loop edge pair identifier 720 identifies three pairs of edges (pairs 1-3). For pair 1, the loop edge pair identifier 720 identifies the right edge of the shape 747 and the left edge of the shape 748. For pair 2, the loop edge pair identifier 720 identifies the edge of the shape 746 that faces the child marker 751 as shown. For pair 3, the loop edge pair identifier 720 identifies the edge of the shape 746 that faces the child marker 752 and the left side of 748.

The solutions generator 725 generates a set of design solutions for each of the edge pairs 1-3 that the loop edge pair identifier has identified. A design solution that the solutions generator 725 generates for a pair of edges requires moving one or both edges of the pair in order to break the loop formed by the violating shapes. More specifically, a design solution requires that the distance between the two pairs of edges to be greater than or equal to the minimum same color spacing. For instance, the solutions generator 725 generates N solutions (with N being an integer) that include solutions 1-3 shown in FIG. 7. For simplicity, only solutions 1-3 of the N solutions are shown in this figure. Each of the N solutions specifies a set of edge movements to break a DP loop formed by the three shapes 746-748 of the design layout 745. For instance, each of solutions 1-3 involves changing a distance between the shapes that includes pair 1 (i.e., the shapes 747 and 748). The solution 1 requires moving the shape 748 to the right such that the distance between the shape 748 and the shape 747 is greater than a minimum same color spacing. The solution 2 requires moving the shape 747 to the left. The solution 3 requires moving both of the shapes 747 and 748 away from each other.

The solutions prioritizer 730 prioritizes the design solutions generated by the solutions generator 725 based on the costs of applying the design solutions. For instance, the solutions prioritizer 730 in some embodiments computes a cost of applying each generated design solution to the design layout and prioritizes the design solutions in the order of the lowest cost to the highest cost.

For each design solution generated for a DP loop violation, the solutions prioritizer 730 in some embodiments computes a cost of applying the solution to the IC design layout. The solutions prioritizer computes the cost for applying the solution based on a number of shapes that are found within a certain threshold distance from each moved shape. The solutions prioritizer accounts for the number of shapes that overlaps with the moved shape(s) in computing the cost. The solutions prioritizer also considers distances required for each shape to be moved. The solutions prioritizer of some embodiments adjusts the computed cost based on the type of a shape found, the distance at which the found shape is from the moved shape, the type of the moved shape, etc. More details of computing costs for applying a design solution to the design layout will be described further below in Section II.

To check whether applying a generated design solution causes a new violation, the solutions prioritizer 730 retrieves other design rules from the design rules repository 735. The solutions prioritizer 730 verifies the new locations of the shapes against each design rule. When applying a design solution results in a new design rule violation, the solutions prioritizer 730 assigns an additional cost to the design solution. For instance, the solution 2 shown in FIG. 7 resolves the DP loop violation by requiring to move the shape 747 to the left. However, the shape 747 is then too close to the shape 746. That is, the shapes 746 and 747 would be apart at a distance smaller than a distance that a design rule requires two shapes to be apart from each other regardless of the colors that these two shapes have. Thus, assuming that the cost of applying a design solution is otherwise the same for the three solutions 1-3, the solutions prioritizer 730 prioritizes solution 2 lower than the solutions 1 and 3, which do not cause a new design rule violation when applied. The solutions prioritizer 730 stores the prioritized design solutions along with priority information in the design solutions repository 740.

Figure 8:
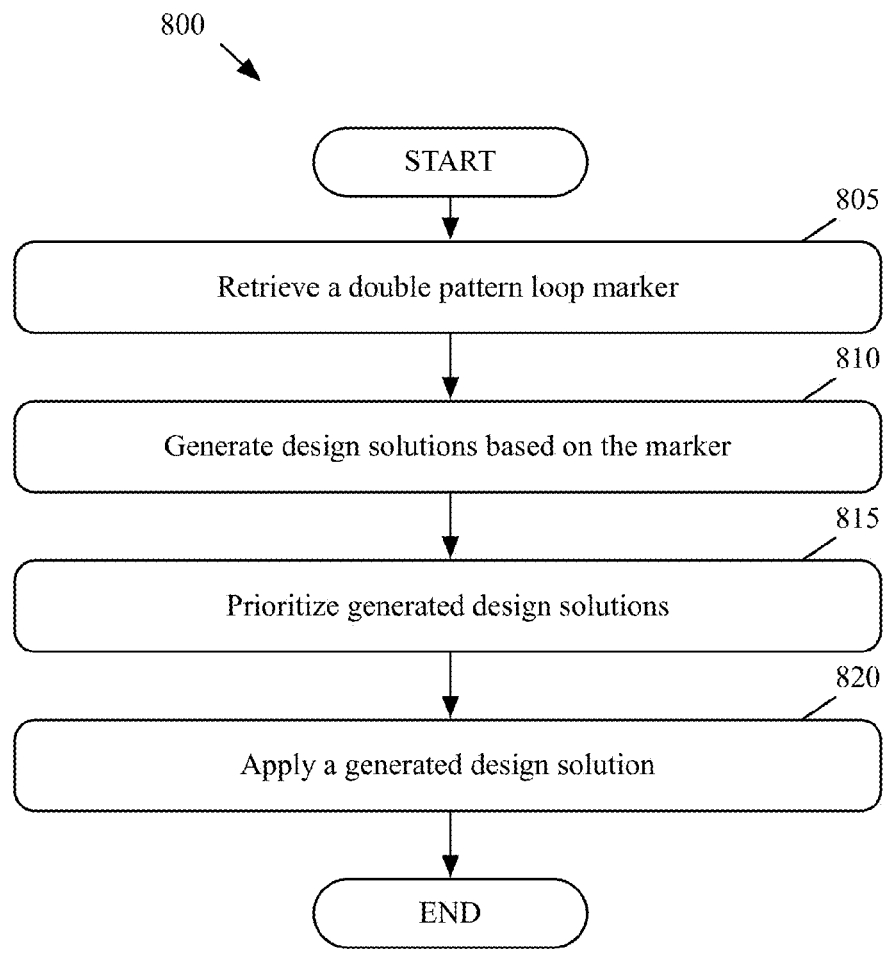
FIG. 8 conceptually illustrates a process performed by some embodiments to generate and prioritize design solutions.

An example operation of the design solutions generator 700 will now be described by reference to FIG. 8. FIG. 8 conceptually illustrates a process 800 performed by some embodiments to generate and prioritize design solutions and to apply one of the design solutions to resolve a DP loop violation. In some embodiments, the process is performed by the design solutions generator 700.

As shown in FIG. 8, process 800 begins by retrieving (at 805) a DP loop violation marker from a repository that stores DP loop violation markers. FIG. 7 illustrates that the marker analyzer 715 retrieves the DP loop violation marker 750 from the DP pattern loop markers repository 710. The marker analyzer 715 parses the retrieved marker 750 and identifies the design layout 745 using the information contained in the marker 750. The information in the marker 750 also indicates that the three shapes 746, 747, and 748 are forming a DP loop and thereby violating a design rule that requires the same colored shapes to be apart from each other at a distance greater than a minimum same color spacing.

Next, process 800 generates (at 810) design solutions based on the DP loop violation marker the process retrieved at 805. In the example of FIG. 7, the marker analyzer 715 generates the child markers 751, 752, and 753 depicted in this figure next to the lower encircled number 2 based on the information contained in the DP loop violation marker 750. The child marker 751 is placed between the shape 746 and 747 to indicate that these two shapes are apart at a distance smaller than a minimum same color spacing. The marker analyzer 715 places the child marker 752 between the shapes 746 and 748. The marker analyzer 715 places the child marker 753 between the shapes 747 and 748.

The loop edge pair identifier 720 then receives the DP loop marker 750 and the child markers 751-753 from the marker analyzer 715. Based on the received markers, the loop edge pair identifier 720 identifies three pairs of shapes that include three pairs of edges (pairs 1-3). A first identified shape pair includes the shapes 747 and 748 which includes edge pair 1. A second identified shape pair includes the shapes 746 and 747 which includes edge pair 2. A third identified shape pair includes the shapes 746 and 748 which includes edge pair 3 as shown in this figure by the lower encircled number 3.

The solutions generator 725 generates N design solutions for breaking the DP loop formed by the three shapes 746-748 where N is the total number of design solutions generated for the DP loop violation. The solutions generator 725 generates a set of design solutions for each of the identified pairs of shapes. In this example, the set of design solutions that the solutions generator 725 generated for the shapes 746 and 748 includes the solutions 1-3. The solution 1 requires moving the shape 748 to the right such that the distance between the edges of the shape 748 and the shape 746 facing the child marker 752 is greater than the minimum same color spacing. The solution 2 requires moving the shape 747 to the left such that the two edges facing the child marker 753 is greater than the minimum same color spacing. The solution 3 requires moving both of the shapes 747 and 748 away from each other. There may be more solutions that require one or both of these two shapes to move, which are not depicted in this figure. For each of the remaining two pairs of shapes, the solutions generator 725 generates design solutions. These additional solutions and the solutions 1-3 make up the N design solutions that the solutions generator 725 generates in this example.

Back to FIG. 8, process 800 then prioritizes (at 815) the design solutions that the process has generated at 810. FIG. 7 illustrates that the solutions prioritizer 730 computes the cost of applying each of the N design solutions. In the example of FIG. 7, applying any of the solutions 1-3 does not result in any other shapes falling within a threshold distance (e.g., a minimum same color spacing) nor a new DP loop violation other than the DP loop violation that the design solution resolves. However, applying the solution 3 results in a new design violation as described above. Accordingly, the solutions prioritizer 730 prioritizes the solution 2 lower than the solutions 1 and 3. The solutions prioritizer 730 prioritizes all N solutions, placing solution M at the bottom of the prioritized solutions because solution M has the highest cost of applying in this example.

Next, process 800 applies (at 820) a generated design solution to the design layout. That is, the process moves one or more of the violating shapes in the design layout in order to break the DP loop formed by the violating shapes. In some embodiments, a design modifier module (not shown) of the design solutions generator 700 applies the design solution. In other embodiments, a separate device or software application different than the design solutions generator 700 applies the design solution to the design layout. Moreover, different embodiments select the design solution to apply to the design layout differently. For instance, the design modifier module or the separate device/software application may automatically select a design solution with the highest priority (e.g., a design solution with the lowest applying cost) in some embodiments. In other embodiments, a designer using a design software application may select a design solution from the prioritized design solutions. Process 800 then ends.

One of ordinary skill in the art will recognize that process 800 is a conceptual representation of the operations used to generate design solutions based on a received DP loop violation marker and to apply a generated design solution in order to resolve the DP loop violation caused by the shapes in the design layout. The specific operations of process 800 may not be performed in the exact order shown and described. The specific operations may need not be performed in one continuous series of operations, and different specific operations may be performed in different embodiments. Furthermore, the process could be implemented using several sub-processes, or as part of a larger macro process.

For instance, in some embodiments, process 800 is performed by one or more design software applications that execute on one or more computers. Specifically, receiving a marker at 805 and generating design solutions at 810 may be performed by one design software application running on one computer and selecting and applying a generated design solution may be performed by another design software application running on the same or different computer.

It is to be noted that rendering of the markers (violation markers as well as child markers) is not required. The rendering of these markers visually aids the users of the design solutions to recognize the violations. The design solutions generator 700 can generate and prioritize design solutions without rendering the markers to display. Also, the markers do not have to be in the forms that they are depicted as in the figures. Any geometric shapes will suffice. Several more detailed embodiments of the design solutions generator are described in Section II below.

B. Resolving a DP Loop Violation by Introducing Splicing Graphs to Shapes

Some embodiments of the invention provide a method for automatically decomposing a shape of an IC design layout into two or more shapes in order to resolve a DP loop violation in which the shape is involved. In contrast to the method of some embodiments described in subsection I.A., this method does not involve moving an edge of a shape to resolve a DP loop violation. This method decomposes the shape by introducing one or more splicing graphs on the shape. These splicing graphs serve as the cuts to be made on the shape. That is, the shape is decomposed based on the splicing graphs. In some cases, a splicing graph is a straight line. In other cases, a splicing graph is a curved line. By decomposing the shape into several shapes, the method breaks the double patterning loop. That is, no pair of the shape and other shapes that were forming the loop will be assigned the same color for a mask after the shape is decomposed. In some embodiments, the method introduces splicing graphs to more than one shape of the loop-forming shapes when necessary. Some embodiments minimize the number of splicing graphs to introduce to the shape(s).

Figure 9:
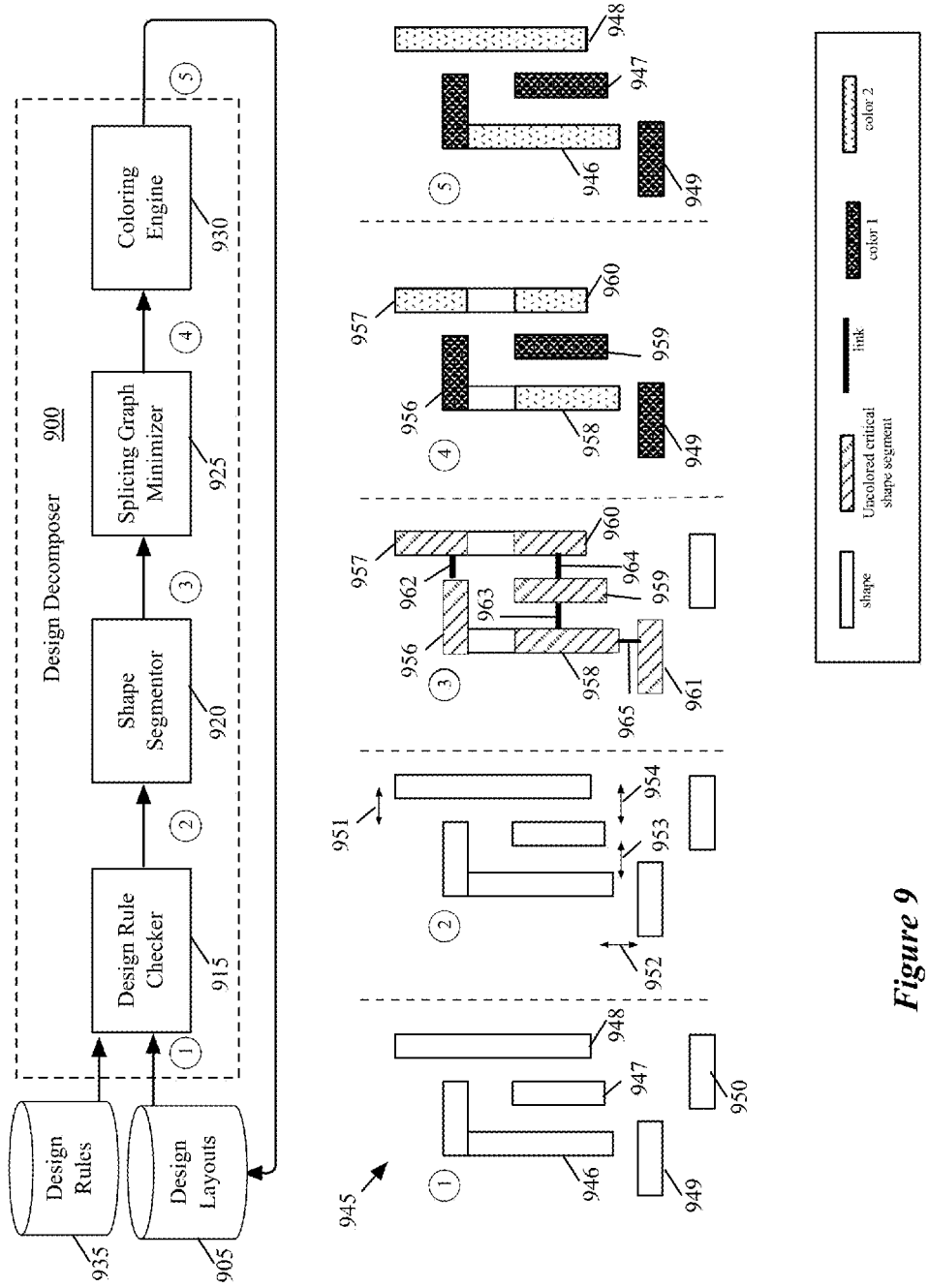
FIG. 9 conceptually illustrates a design decomposer of some embodiments that resolves a DP loop violation by decomposing one of the shapes that form a DP loop.

FIG. 9 conceptually illustrates a design decomposer 900 of some embodiments that resolves a DP loop violation by decomposing one of the shapes that form a DP loop. Specifically, the figure illustrates that the design decomposer 900 breaks a DP loop formed by shapes 946, 947, and 948 in a design layout 945 by decomposing the shape 946. By decomposing the shape 946, the design decomposer 900 can assign two different colors to the shape 946 so that the three shapes 946, 947, and 948 no longer forms a DP loop. In contrast to the design solutions generator 700 described above by reference to FIG. 7, the design decomposer 900 in some embodiments performs design rule-checking on a region of design layout to identify a DP loop violation in the region instead of or in conjunction with receiving a DP loop violation marker. This figure illustrates a design layouts repository 905 and a design rules repository 935. The design decomposer 900 includes a design rule checker 915, a shape segmentor 920, a splicing graph minimizer 925, and a coloring engine 930.

The design layouts repository 905 stores design layouts. The design layouts repository 905 in some embodiments receives the design layouts from design software applications, which design engineers use to generate the design layouts. In some embodiments, the design layouts stored in the design layouts repository 905 are in a database file format, e.g., GDS II stream format (GDSII).

The design rules repository 935 stores design rules. The design rules repository 935 in some embodiments receives design rules from design software applications, which generate design rules according to the design engineers' inputs. Design rules impose certain design constraints on the shapes in design layouts. For example, a minimum same color spacing rule (also referred to as minimum pitch requirement) requires that two shapes with the same assigned color be apart from each other at a certain minimum distance.

The design rule checker 915 receives or retrieves a design layout from the design layout repository 905 and verifies the design layout against the design rules to see if the shapes in the layout are in violation of the design rules. For instance, the design rule checker 915 receives the design layout 945. The design layout 945 includes the shapes 946, 947, 948, 949, and 950 among other shapes (not shown in FIG. 9 for simplicity of description). As the design rule checker 915 verifies the design layout 945, the design rule checker finds that three shapes 946, 947, and 948 are within the minimum pitch requirement among one another. Therefore, any two of these three shapes have to have different colors in order to meet the minimum pitch requirement. However, no combination of colors will allow these three shapes to meet the minimum pitch requirement and these three shapes form a DP loop. The design rule checker also finds that the shapes 946 and 949 are within the minimum pitch requirement. Each of bidirectional arrows 951-954 is depicted in the figure to indicate that a pair of shapes are within the minimum pitch requirement. For instance, the arrow 952 indicates that the shapes 946 and 949 are within the pitch requirement.

In some embodiments, the design rule checker 915 may create and utilize a shape graph (not shown) to find out the relationship between the shapes and any design violations formed by the shapes. Creating and utilizing shape graphs are described further below in Section III. When the design rule checker 915 finds a DP loop violation, the design rule checker 915 notifies the shape segmentor 920.

The shape segmentor 920 defines a group of shapes and identifies portions of the shapes in the group that are too close to each other to be printed in the same mask (e.g., too close to have the same assigned color). Such portions are referred to as "critical portions" or "critical shape segments" (CSSs) throughout this application. The group of shapes that the shape segmentor 920 defines include the shapes that form the DP loop and other shapes that are within the minimum pitch requirement from the loop-forming shapes. The shape segmentor 920 further includes in the group shapes that are within the minimum pitch requirement from the shapes in the group. For instance, the shape segmentor 920 puts the shapes 946, 947, and 948 in the group the shape segmentor 920 defines. The shape segmentor 920 also puts the shape 949 in the group because the shape 949 and the shape 946 are within the minimum pitch requirement. However, the shape segmentor 920 will not put the shape 950 in the group because the shape 950 is not within the pitch requirement from any of the four shapes 946-949.

Once the shape segmentor 920 defines the group of shapes, the shape segmentor 920 identifies critical portions. As shown, the shape segmentor identifies six critical portions 956-961. FIG. 9 also illustrates conceptual associations (or "links") 962-965 between a pair of critical portions to indicate that the two critical portions in the pair are too close to each other to have the same assigned color. The shape segmentor 920 also un-assigns any color that had been assigned to the shapes in the group previously. In some embodiments, the shape segmentor 920 may create and utilize a segment graph (not shown) to find out the relationship between the critical portions. Creating and utilizing segment graphs are described further below in Section III.

The splicing graph minimizer 925 introduces splicing graphs in the shapes in the defined group in such a way that minimizes the number of splicing graphs in the shapes in the group. For instance, the splicing graph minimizer selects an initial shape to assign a color first. The splicing graph minimizer of some embodiments selects a shape that has one critical portion. The shapes 949 and 947 are such shapes as shown in FIG. 9. When there is no such shape in the defined group, the splicing graph minimizer selects a shape in the group that has the least number of critical portions as the initial shape. When there are two or more shapes that have one critical portion, the splicing graph minimizer of some embodiments selects on of it based on a non-tying criteria (e.g., random selection). In this example, the splicing graph minimizer selects the shape 949.

The splicing graph minimizer assigns a color to the initial shape by assigning a color to each critical portion in the initial shape. In some embodiments, the splicing graph minimizer assigns the same color to all critical portions of the initial shape. The splicing graph minimizer 925 assigns color 1 (e.g., red) to the shape 961 as shown. When assigning a color to a critical portion, the splicing graph minimizer 925 of some embodiments also colors all other critical portions that are associated with the critical portions of the initial shape through the links The critical portions 958, 959, and 960 are such critical portions as shown. The critical portion 958 is associated with the critical portion 961 of the shape 949 through the link 965. The critical portion 959 is associated with the critical portion 961 through links 963 and 965. The critical portion 960 is associated with the critical portion 961 through the links 964, 963, and 965.

The splicing graph minimizer 925 alternates the colors to assign to the associated critical portions such that no two neighboring associated critical portions are assigned to the same color. As shown, the splicing graph minimizer 925 assigns color 2 (e.g., green) to the critical portions 958 and 960 and assigns color 1 to the shape 947. As such, no two neighboring critical portions of the associated critical portions 958, 959, 960, and 961 have the same assigned color.

When the splicing graph minimizer 925 finishes assigning colors to all critical portions of the initial shape and all critical portions that are associated with the critical portions of the initial shape, the splicing graph minimizer 925 selects a next shape in the group to assign colors. The splicing graph minimizer 925 selects the next shape based on certain criteria. In some embodiments, the criteria include (1) whether a shape includes a splicing graph (i.e., whether the shape has two or more critical portions assigned with different colors already), (2) whether the shape is partially colored (i.e., whether the shape has at least one colored critical portion), (3) a number of critical portions that the shape has, etc. For instance, the splicing graph minimizer 925 selects shapes that have no splicing graphs over shapes that have splicing graphs. The splicing graph minimizer 925 selects shapes that are partially colored over shapes that are not colored. The splicing graph minimizer 925 selects shapes with fewer critical portions over shapes with more critical portions. When two or more shapes are selected based on these criteria, the splicing graph minimizer 925 in some embodiments uses a non-tying criterion (e.g., random selection) to select the next shape to color.

As shown, the splicing graph minimizer 925 selects the shape 947 as the next shape to color. However, the shape 947, which itself is the critical portion 959, is already completely colored. Thus, the splicing graph minimizer 925 can then select one of the two remaining shapes 946 and 948. At this point, these two remaining shapes are tied based on the three criteria described above. That is, both of the two shapes are partially colored (at this point, only the critical portion 958 of the shape 946 has been colored and only the critical portion 960 of the shape 948 has been colored); both of the shapes do not include a splicing graph yet (the remaining critical portion of each of these two shapes do not have an assigned color yet); and both have the same number of critical portions (i.e., two). Therefore, the splicing graph minimizer 925 in this example selects the shape 948 randomly.

The splicing graph minimizer 925 then assigns colors to the next shape in a similar manner that the splicing graph minimizer 925 assigned colors to the initial shape. That is, the splicing graph minimizer 925 assigns the same color to all critical portions of the next shape and assigns alternate colors to all other critical portions that have links with the critical portions of the shape being colored. When some of the critical portions of the shape are already colored, the splicing graph minimizer 925 assigns the color that is assigned to the majority of the colored critical portions of the shape to all critical portions that have not had assigned colors. Accordingly, the splicing graph minimizer 925 in this example assigns color 2 to the critical portion 957 because color 2 is the color that is assigned to the other critical portion of the shape 948 (i.e., the critical portion 960). The splicing graph minimizer 925 then assigns color 1 to the critical portion 956 of the shape 946 because the critical portion 956 is associated with the critical portion 957, which has color 2 as an assigned color.

The splicing graph minimizer 925 repeats this selection and coloring operations until all critical portions of all shapes in the group have assigned colors. One or more splicing graphs will have been introduced to one or more of the shapes in the group. One of the shapes that will have a splicing graph is a loop-forming shape. In this manner, the splicing graph minimizer 925 resolves the DP loop violation by breaking the DP loop. In the example of FIG. 9, all critical portions of all shapes in the group have assigned colors. As shown, the shape 946 have a splicing graph between the critical portions 956 and 958 because these two portions have different colors and have to be sent to different masks.

In some embodiments, when the number of splicing graphs to introduce to the shapes in the group is not one, the splicing graph minimizer 925 goes back to the point when it made a random choice in selecting a shape to assign color(s) (e.g., by undoing color assignments made after that point) and selects another shape to assign color(s)).

As described above, the splicing graph minimizer 925 considers all shapes in the group of associated shapes to resolve a DP loop violation. That is, the splicing graph minimizer 925 considers the loop-forming shapes (e.g., the shapes 946-948) as well as other shapes (e.g., the shape 949) that are associated with the loop-forming shapes. However, the splicing graph minimizer 925 in other embodiments may consider only the loop-forming shapes to resolve the DP loop violation. That is, the splicing graph minimizer 925 of these embodiments performs the selecting and coloring operations that are described above only on the loop-forming shapes to resolve the violation that these loop-forming shapes are committing and then assigns colors to the rest of the shapes in the group or design layout region.

The coloring engine 930 colors the shapes according to the colors assigned to the shapes by the splicing graph minimizer 925. That is, the coloring engine 930 modifies the design layout 945 and deposits the modified design layout in the design layouts repository 905.

In some cases, some DP loop violations may not be resolved by introducing splicing graphs in the shape(s) in the group of associated shapes. In such cases, the design decomposer 900 of some embodiments attempts to resolve such DP loop violations by moving one or more edges of the shapes as described above in subsection I.A. In some embodiments, the design decomposer determines that a DP loop violation may not be resolved by introducing splicing graphs when two critical portions of one shape are within a pitch requirement from each other (e.g., the two critical portions of the shape are apart from each other at a distance smaller than a minimum same color spacing).

Figure 10:
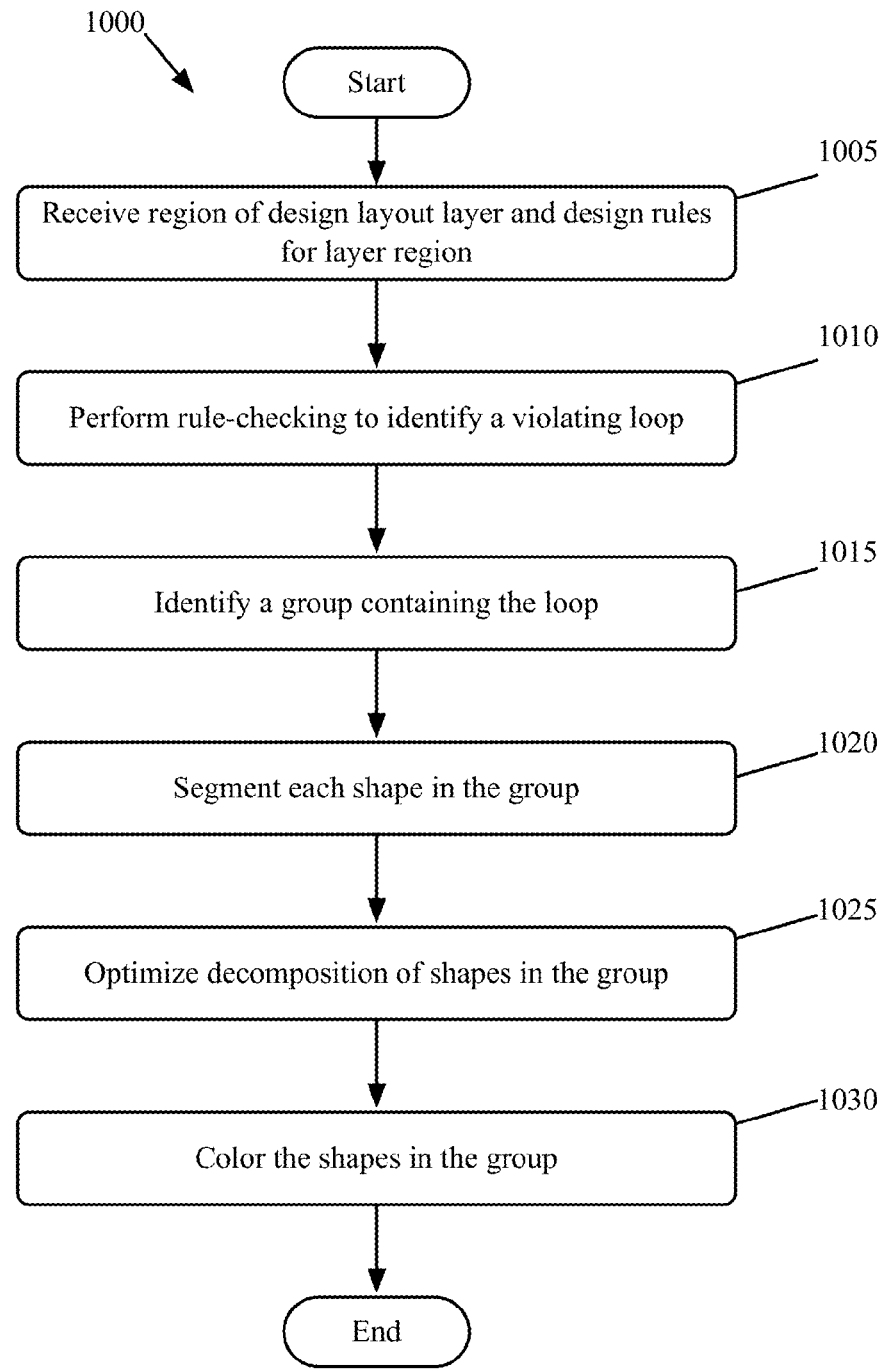
FIG. 10 conceptually illustrates a process performed by some embodiments to find and resolve a DP loop violation.

An example operation of the design decomposer 900 will now be described by reference to FIG. 10. FIG. 10 conceptually illustrates a process 1000 performed by some embodiments to find and resolve a DP loop violation by decomposing one or more shapes in a layer of a design layout that includes the DP loop. In some embodiments, the process is performed by the design decomposer 900.

The process begins by receiving (at 1005) (i) a region of a design layout layer that includes shapes at specified locations and (ii) design rules for the design layout region. In some embodiments, the design rules include a minimum pitch requirement (e.g., the minimum distance that two shapes can be from each other and still be printed in the same exposure) in some embodiments. As described above, FIG. 9 illustrates a simplified example design layout region 945 that the design decomposer 900 has received.

Next, process 1000 performs (at 1010) rule-checking to identify a DP loop violation. The process verifies the design layout against the design rules to see the shapes in the layout are in violation of the design rules. For instance, the design decomposer finds that the shapes 946-948 are within the minimum pitch requirement among one another. Therefore, any two of these three shapes have to have different colors in order to meet the minimum pitch requirement. However, no combination of colors will allow these three shapes to meet the minimum pitch requirement and these three shapes form a DP loop.

The process then defines (at 1015) a group of shapes. The group of shapes that the process defines includes the shapes that form the DP loop and other shapes that are within the minimum pitch requirement from the loop-forming shapes. The process further includes in the group those shapes that are within the minimum pitch requirement from the shapes in the group. For instance, the design decomposer 900 puts the shapes 946, 947, and 948 in the group that the shape decomposer 900 is defining. The design decomposer 900 also puts the shape 949 in the group because the shape 949 and the shape 946 are within the minimum pitch requirement. However, the shape decomposer 900 will not put the shape 950 in the group because the shape 950 is not within the pitch requirement from any of the four shapes 946-949.

The process then identifies (at 1020) critical portions in the shapes of the defined group. As the process identifies the critical portions, the process also un-assigns any color that had been previously assigned to the shapes in the group. For instance, the shape segmentor 920 identifies six critical portions 956-961.

Next, the process optimizes (at 1025) decomposition of shapes in the group in order to resolve the DP loop violation by minimizing the number of splicing graphs to introduce to the shapes in the group. The process in some embodiments assigns colors to the critical portions such that at least one of the loop forming shapes have two critical portions with different colors assigned. The design decomposer 900 assigns color 1 (e.g., red) to the shape 961 as shown in FIG. 9. The design decomposer 900 then assigns color 2 (e.g., green) to the critical portions 958 and 960 and assigns color 1 to the shape 947. As such, no two neighboring critical portions of the associated critical portions 958, 959, 960, and 961 have the same assigned color. The design decomposer 900 then assigns color 2 to the critical portion 957 because color 2 is the color that is assigned to the other critical portion of the shape 948 (i.e., the critical portion 960). The design decomposer 900 then assigns color 1 to the critical portion 956 of the shape 946 because the critical portion 956 is associated with the critical portion 957, which has color 2 as an assigned color. As a result, the shape 946 has a splicing graph between the critical portions 956 and 958 because these two portions have different colors and have to be sent to different masks.

Process colors (at 1030) the shapes in the group according to the colors assigned (at 1025) to the shapes. That is, the process modifies the design layout and deposits the modified design layout in a design layouts repository.

II. MOVING SHAPE EDGES

A. Generating Design Solutions

Figure 11:
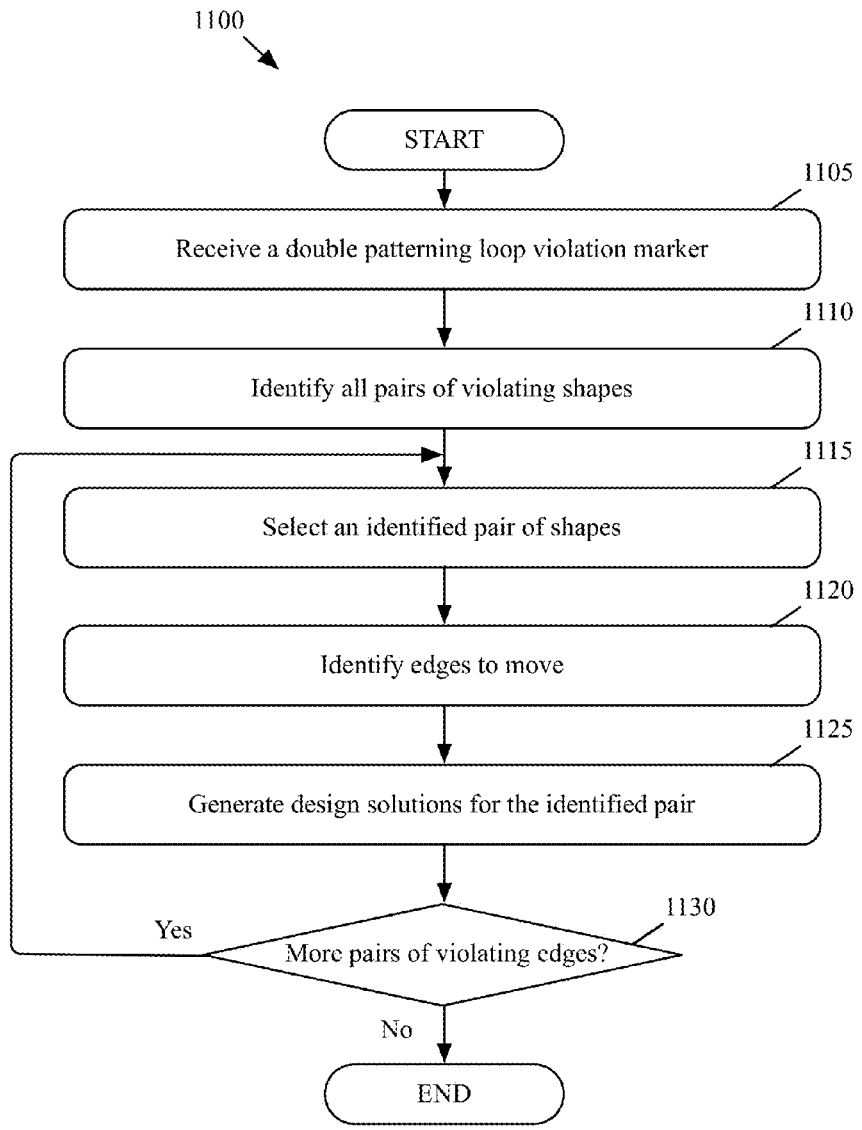
FIG. 11 conceptually illustrates a process that some embodiments perform to generate design solutions to a DP loop violation in a design layout.

FIG. 11 conceptually illustrates a process 1100 that some embodiments perform to generate design solutions to a DP loop violation in a design layout. The process 1100 in some embodiments is performed by the design solutions generator 700 described above by reference to FIG. 7. The process in some embodiments starts when a designer using the design solutions generator 700 initiates this process to generate design solutions to fix a DP loop violation in a design layout. The design layout is opened for examining and/or editing in a design software application that the designer is using. The process in some embodiments starts when it detects a new DP violation marker that indicates a DP loop violation is in the design layout. As described above, a DP loop violation marker indicates that some shapes in the design layout are forming a DP loop in which a pair of neighboring shapes in the loop cannot be assigned different colors. Such a loop is referred to as a "DP loop" throughout this application. That is, two shapes of a pair are apart from each other at a distance smaller than a required distance, which is a distance at which a design rule requires two shapes with the same color in the design layout to be apart from each other. Several of such pairs of shapes form a conceptual loop in which a pair of neighboring shapes cannot have different colors assigned. The process 1100 will be described by reference to FIGS. 12 and 13 which illustrate generating design solutions that resolve a DP loop violation.

Process 1100 begins by receiving (at 1105) a DP loop violation marker. In some embodiments, the process receives the DP loop violation marker directly from another design software application. In other embodiments, the process may retrieve the DP loop violation marker from a repository that stores DP loop violation markers.

Next, process 1100 identifies (at 1110) all pairs of shapes that are forming the DP loop. The process in some embodiments identifies these pairs of shapes based on the information contained in the DP loop violation marker. For each of the identified pairs, the process in some embodiments generates a child marker to place between the two shapes of the pair. The child marker indicates that the two shapes of the pair are apart from each other at a distance smaller than the minimum same color spacing required by the violated design rule. A design solution that resolves the DP loop violation will require moving one or both of the two shapes such that the distance between the two shapes is greater than or equal to the minimum same color spacing.

Figure 12:
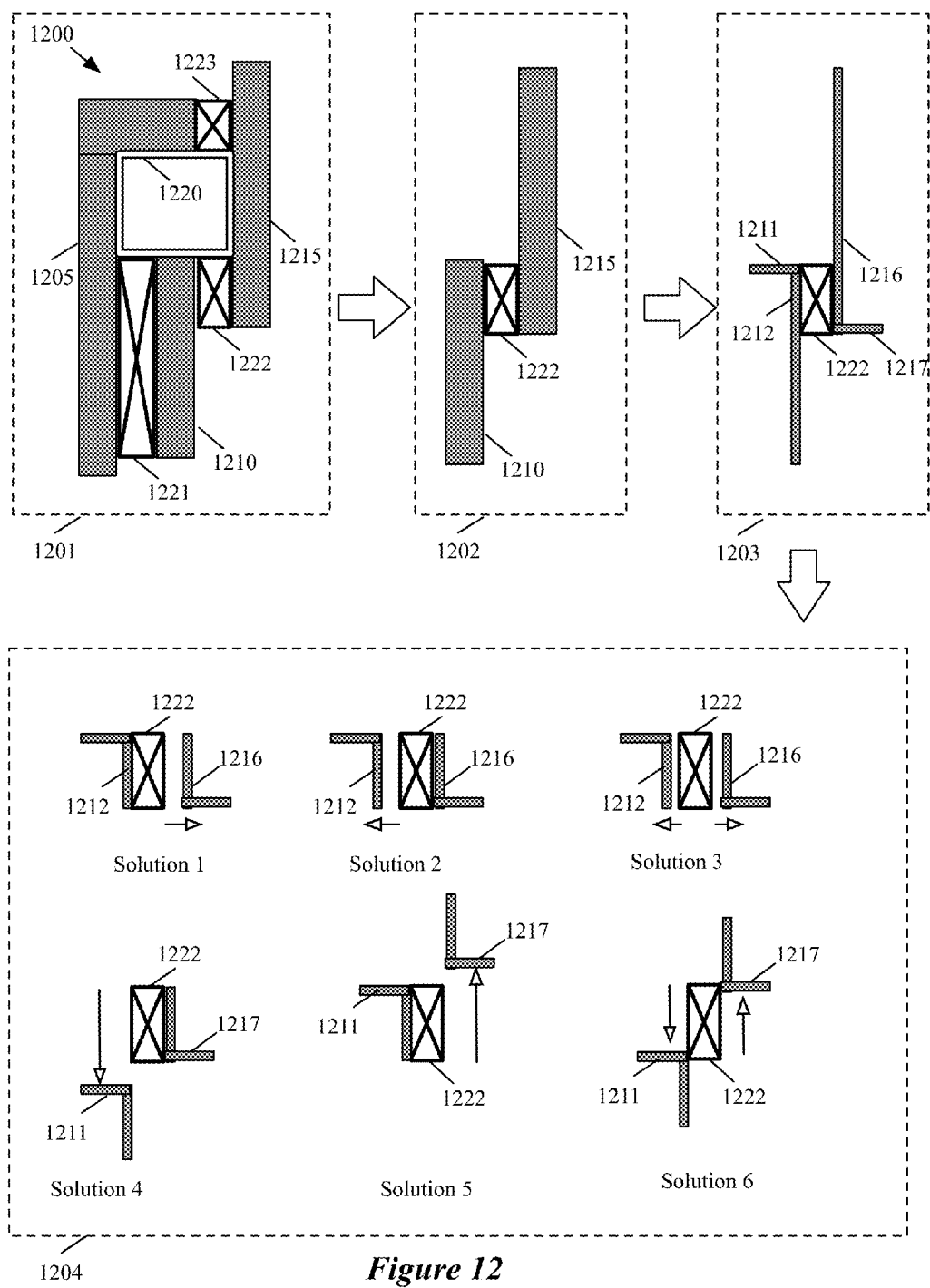
FIG. 12 illustrates an example of a DP loop violation committed by several shapes in a design layout.

FIG. 12 illustrates in four different stages 1201-1204 an example of a DP loop violation committed by several shapes in a design layout 1200 and several solutions generated by a design solutions generator (not shown) of some embodiments to resolve the DP loop violation. This figure illustrates the design layout 1200 that includes shapes 1205, 1210, and 1215 among other shapes which are not illustrated in this figure for simplicity. This figure also illustrates a DP loop marker 1220 and three child markers 1221-1223. The shape 1210 has edges 1211 and 1212. The edge 1211 is the top edge of the shape 1210. The edge 1212 is the right edge of the shape 1211. The shape 1215 has edges 1216 and 1217. The edge 1216 is the left edge of the shape 1215. The edge 1217 is the bottom edge of the shape 1215.

In the first stage 1201, the DP loop marker 1220 indicates that the shapes 1205-1215 form a DP loop. That is, the three shapes are apart from each other at a distance smaller than the minimum same color spacing. The DP loop marker 1220 is depicted as a rectangle with hollow line edges and is placed in the middle of the three violating shapes 1205-1215. The DP loop marker 1220 is a rectangle in this example of FIG. 12 in order to share edges with the violating shapes 1205, 1210, and 1215 (e.g., to have the rectangle's edges coincide with the edges of the violating shapes). The DP loop marker in some embodiments also includes information that can be used to generate design solutions, such as a minimum same color spacing, identities of the violating shapes, etc.

The first stage 1201 shows the child marker 1221 between the shapes 1205 and 1210; the child marker 1222 between the shapes 1210 and 1215; and the child marker 1223 between the shapes 1205 and 1215. Each of the child markers shares edges with the two shapes between which the child marker is located. The child marker also includes information that may be used to generate a design solution, such as a distance between the shared edges. The child markers 1221-1223 also identify three pairs of shapes—the shapes 1205 and 1210; the shapes 1210 and 1215; and the shapes 1205 and 1215—that form the DP loop in this example of FIG. 12.

After process 1100 identifies (at 1110) all pairs of shapes that form a DP loop, the process 1100 then selects (at 1115) one of the identified pairs of shapes. The process uses the selected pair of shapes to generate a set of design solutions. The second stage 1202 in FIG. 12 shows that the pair of shapes 1210 and 1215 is selected.

Next, process 1100 identifies (at 1120) edges to move. The design solutions that the process will generate require different combinations of these identified edges to move. In other words, the movements of these edges will be part of the design solutions to be generated. The process identifies edges of the two shapes of the selected pair based on a child marker that is placed between the two shapes. In some embodiments, the process identifies the edges that are shared with the child marker as the edges to move. For instance, as shown in the third stage 1203 in FIG. 12, the design solutions generator identifies the edge 1212 of the shape 1210 as an edge to move because the shape 1210 shares this edge with the child marker 1222. That is, the left edge of the child marker 1222 coincides with the right edge 1212 of the shape 1210. Similarly, the design solutions generator identifies the edge 1216 of the shape 1215 as an edge to move because the edge 1216 is shared by the shape 1215 and the child marker 1222.

In some embodiments, process 1100 identifies additional edges to move. When the edges of the child marker that are not shared with the two shapes are aligned with other edges of the shapes, the process additionally identifies those other edges of the shapes as edges to move. For instance, the design solutions generator additionally identifies the edge 1211 and the edge 1217 as the edges to move as shown in the third stage 1203 in FIG. 12. The design solutions generator identifies these edges because the edge 1211 of the shape 1210 aligns with the top edge of the child marker 1222 and the edge 1217 of the shape 1215 aligns with the bottom edge of the child marker 1222. The process also identifies the directions in which the shapes should be moved. For instance, when the process identifies a vertical edge of a shape as an edge to move, the solution using this edge will require moving the shape horizontally away from the other shape of the pair. When the process identifies a horizontal edge of a shape to move, the design solution using this edge will require moving the shape vertically away from the other shape of the pair.

Process 1100 then generates (at 1125) design solutions for the selected pair of shapes. The process in some embodiments generates design solutions based on the identified edges of the shapes. The process computes or retrieves from the child marker the distance between those two identified edges that are shared by the shapes and the child marker. The process also gets the minimum same color spacing from the DP loop marker. The process then computes the difference between the computed distance and the minimum same color spacing value.

Based on the computed difference, the process generates three design solutions. A first of the three solutions requires moving a first edge of the two edges away from a second edge of the two edges by a distance greater than or equal to the computed difference. Similarly, the second of the three solutions requires moving the second edge away from the first edge by a distance greater than or equal to the computed difference. A third of the three solutions requires moving both the first and the second edges away from each other such that the total distance moved by the two edges is greater than or equal to the computed difference. In other words, each of these three solutions requires moving one or both of the two shared edges such that the total distance between the two edges is greater than or equal to the minimum same color spacing that is required by a design rule.

The solutions 1-3 shown in the fourth stage 1204 in FIG. 12 are examples of three design solutions. The design solutions generator computes the difference between the minimum same color spacing and the distance between the edges 1212 and 1216. The solution 1 requires moving the edge 1216 of the shape 1215 to the right by a distance greater than or equal to the computed difference. The solution 2 requires moving the edge 1212 of the shape 1210 to the left by a distance greater than or equal to the computed difference. The solution 3 requires moving both of the edges 1212 and 1216 away from each other such that the distance between these two edges after movement is greater than or equal to the minimum same color spacing. For instance, the solution 3 may require moving the edge 1212 to the left by a half of the computed difference and the edge 1216 to the right by a half of the computed difference.

Figure 13:
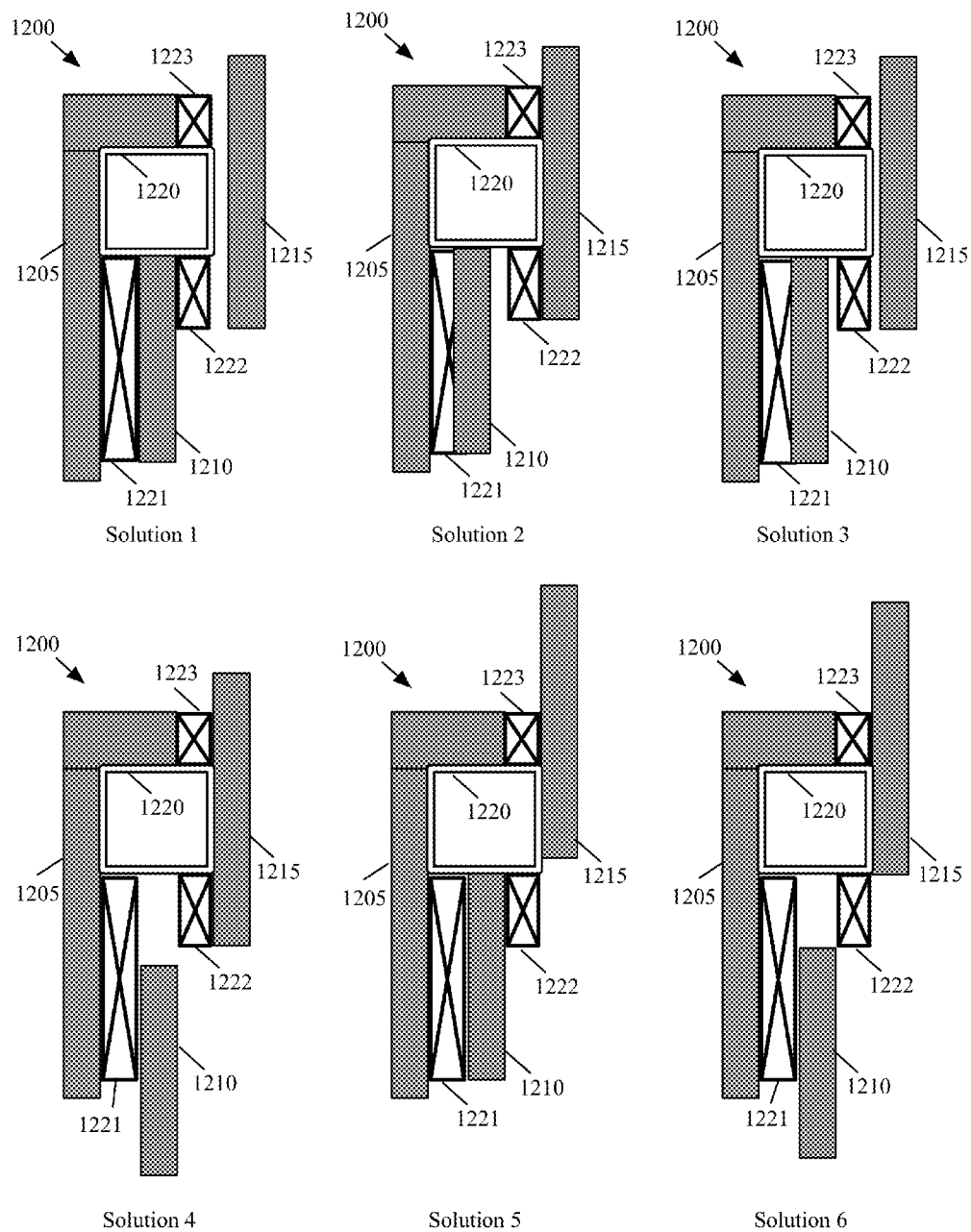
FIG. 13 illustrates examples of the design layout when several design solutions are applied to the layout.

FIG. 13 illustrates examples of the design layout 1200 when the three design solutions 1-3 illustrated in FIG. 12 are applied to the design layout 1200. In contrast to FIG. 12 in which the solutions are illustrated with the edges, FIG. 13 illustrates the design solutions with the shapes of the design layout 1200 when the solutions are applied to the design layout 1200.

As shown in FIG. 13, the solution 1 requires moving the shape 1215 to the right by a distance greater than or equal to the computed difference. The solution 2 requires moving the shape 1210 to the left by a distance greater than or equal to the computed difference. The solution 3 requires moving both of the shapes 1210 and 1215 away from each other such that the distance between these two shape (i.e., the distance between the right edge of the shape 1210 and the left edge of the shape 1215) after movements is greater than or equal to the minimum same color spacing.

Process 1100 also generates several additional design solutions based on the identified edges of the shapes that are not shared by the child marker and the two shapes. As described above, these edges of the shapes are aligned to an edge of the child marker. Each of these solutions requires moving one or more of such edges of the shapes such that no portion of a first shape of the two shapes is within the minimum same color spacing from any portion of a second shape of the two shapes. The design solutions generated based on the shared edges of the two shapes require moving the shapes either vertically or horizontally. The design solutions generated based on the non-shared edges of the two shapes require moving the shapes in a direction that is perpendicular to the direction of the movement of the shapes required by the design solutions generated based on the shared edges. For instance, as shown in the fourth stage 1204 in FIG. 12, the solutions 1-3 require horizontal movements of the edge 1212 of the shape 1210 and the edge 1216 of the shape 1215 while the solutions 4-6 requires vertical movements of the edge 1211 of the shape 1210 and the edge 1217 of the shape 1215. As described above, the solutions 1-3 are based on the shared edges (i.e., the edges 1212 and 1216). The solutions 4-6 are based on the non-shared edges (i.e., the edges 1211 and 1217).

The solution 4 shown in the fourth stage 1205 in FIG. 12 requires moving the edge 1211 of the shape 1210 downwards by a certain distance so that no portion of the shape 1210 is within the minimum same color spacing from any portion of the shape 1215. As shown, the solution 4 thus requires moving the edge 1211 below the bottom edge of the child marker 1222. A corner formed by the edges 1211 and 1212 of the shape 1210 is apart from a corner formed by the edges 1216 and 1217 of the shape 1215 at a distance greater than the minimum same color spacing. The result of moving the edge 1211 is more apparently shown in FIG. 13. The solution 4 illustrated in FIG. 13 shows that the top portion of the shape 1210 and the bottom portion of the shape 1215 are further from each other and the DP loop formed by the shapes 1205-1215 is broken. That is, the shape 1215 and the shape 1210 are no longer within the minimum same color spacing.

The solution 5 shown in the fourth stage 1204 in FIG. 12 requires moving the edge 1217 of the shape 1215 upwards by a certain distance so that no portion of the shape 1215 is within the minimum same color spacing from any portion of the shape 1210. As shown, the solution 5 thus requires moving the edge 1217 above the top edge of the child marker 1222. A corner formed by the edges 1216 and 1217 of the shape 1215 is apart from a corner formed by the edges 1211 and 1212 of the shape 1210 at a distance greater than the minimum same color spacing. The result of moving the edge 1217 is more apparently shown in FIG. 13. The solution 5 illustrated in FIG. 13 shows that the top portion of the shape 1210 and the bottom portion of the shape 1215 are further from each other and the DP loop formed by the shapes 1205-1215 is broken.

The solution 6 shown in the fourth stage 1204 in FIG. 12 requires moving both of the non-shared edges 1211 and 1217. Specifically, the solution 6 requires moving the edge 1211 of the shape 1210 downward by a certain distance and moving the edge 1217 of the shape 1215 upwards by a certain distance so that no portion of the shape 1210 is within the minimum same color spacing from any portion of the shape 1215. A corner formed by the edges 1216 and 1217 of the shape 1215 is apart from a corner formed by the edges 1211 and 1212 of the shape 1210 at a distance greater than the minimum same color spacing. The result of moving the edges 1211 and 1217 is more apparently shown in FIG. 13. The solution 6 illustrated in FIG. 13 shows that the top portion of the shape 1210 and the bottom portion of the shape 1215 are further from each other and the DP loop formed by the shapes 1205-1215 is broken.

Back to FIG. 11, process 1100 then determines (at 1130) whether there are more violating pairs of edges for which the process has not generated design solutions. When the process determines (at 1130) that there remains pairs of edges for which the process has not generated design solutions, the process loops back to 1115 to select one of the remaining pairs. Otherwise, the process ends. Such remaining pairs of edges in FIG. 12 are the two remaining pairs—one pair of shapes 1205 and 1210 and one pair of shapes 1205 and 1215.

In the example of FIGS. 12 and 13, only three shapes are forming a DP loop and the solutions for one of the three pairs of edges are generated. However, one of ordinary skill in the art will realize that the design solutions generating techniques of some embodiments described in this example will be applicable to any number of shapes that are forming a DP loop. In addition, the edges shared by the child markers and the violating shapes are vertical edges in this example. Again, one of ordinary skill in the art will recognize that there could be cases when the shared edges are horizontal and the solutions generating technique of some embodiments are applicable to these cases as well. Additionally, the design rules used in this example included rules for minimum width, spacing, and pitch of shapes on a layer. One of ordinary skill in the art will recognize that other design rules, such as those for minimum contact or via enclosure, metal fill density, minimum gate length, and others are applicable to the shapes forming a DP loop. Moreover, the shape of the DP loop violation marker shown in this example is rectangle but a shape that represents a DP loop violation marker does not have to be a rectangle. The shape of the DP loop violation marker depends on the number of shapes that are forming a DP loop and the arrangement of those shapes.

B. Prioritizing Design Solutions

Figure 14:
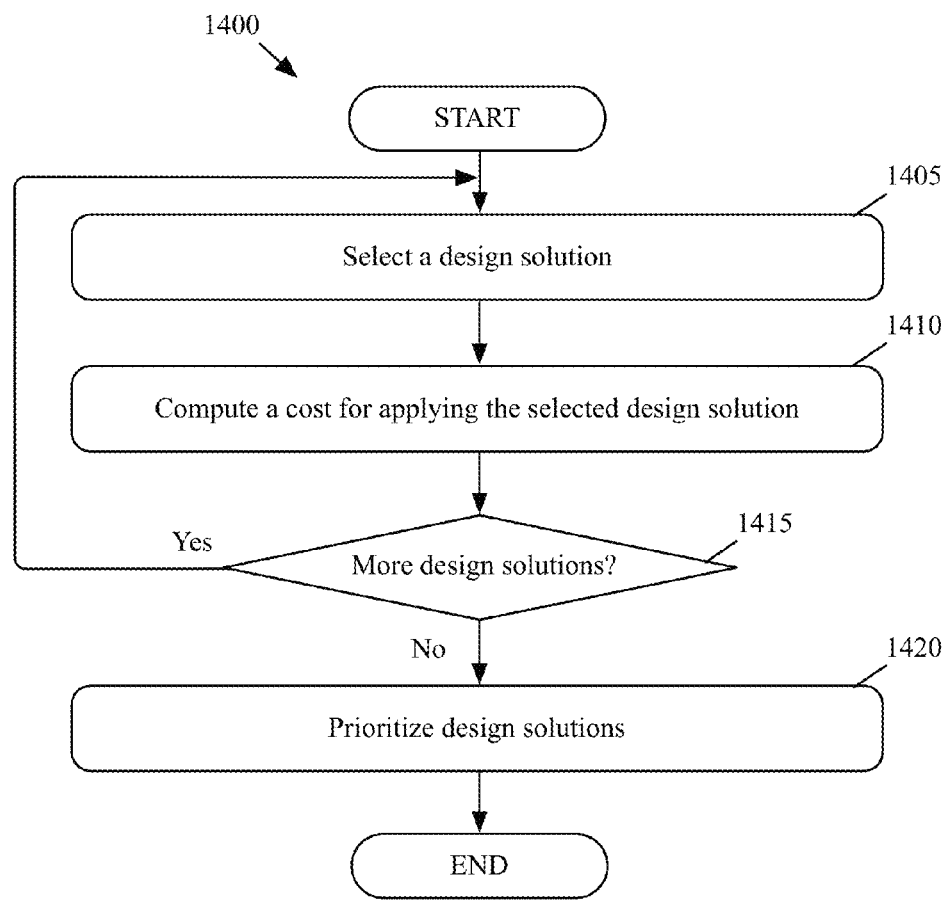
FIG. 14 conceptually illustrates a process that some embodiments perform to prioritize design solutions.

FIG. 14 conceptually illustrates a process 1400 that some embodiments perform to prioritize design solutions. The process 1400 in some embodiments is performed by the design solutions generator 700 described above by reference to FIG. 7. The process in some embodiments starts when the design solutions generator generates a set of design solutions for a DP loop violation in a design layout.

Process 1400 begins by selecting (at 1405) a design solution for a DP loop violation in a design layout. The process selects a design solution from a set of design solutions generated for the DP loop violation. Next, the process computes (at 1410) a cost for applying the selected design solution to the design layout. Computing a cost for applying a design layout is described in detail further below by reference to FIG. 15.

The process then determines (at 1415) whether there are more design solutions for which to compute costs. When the process determines (at 1415) that there are more design solutions generated for the DP loop violation of which the costs of applying to the design solution have not been computed, the process loops back to 1405 to select another design solution. Otherwise, the process prioritizes (at 1420) the design solutions based on the computed costs for the design solutions. In some embodiments, the process prioritizes the design solutions in the order of the lowest computed cost to the highest cost such that the design solution with the least cost to apply is prioritized the highest.

Figure 15:
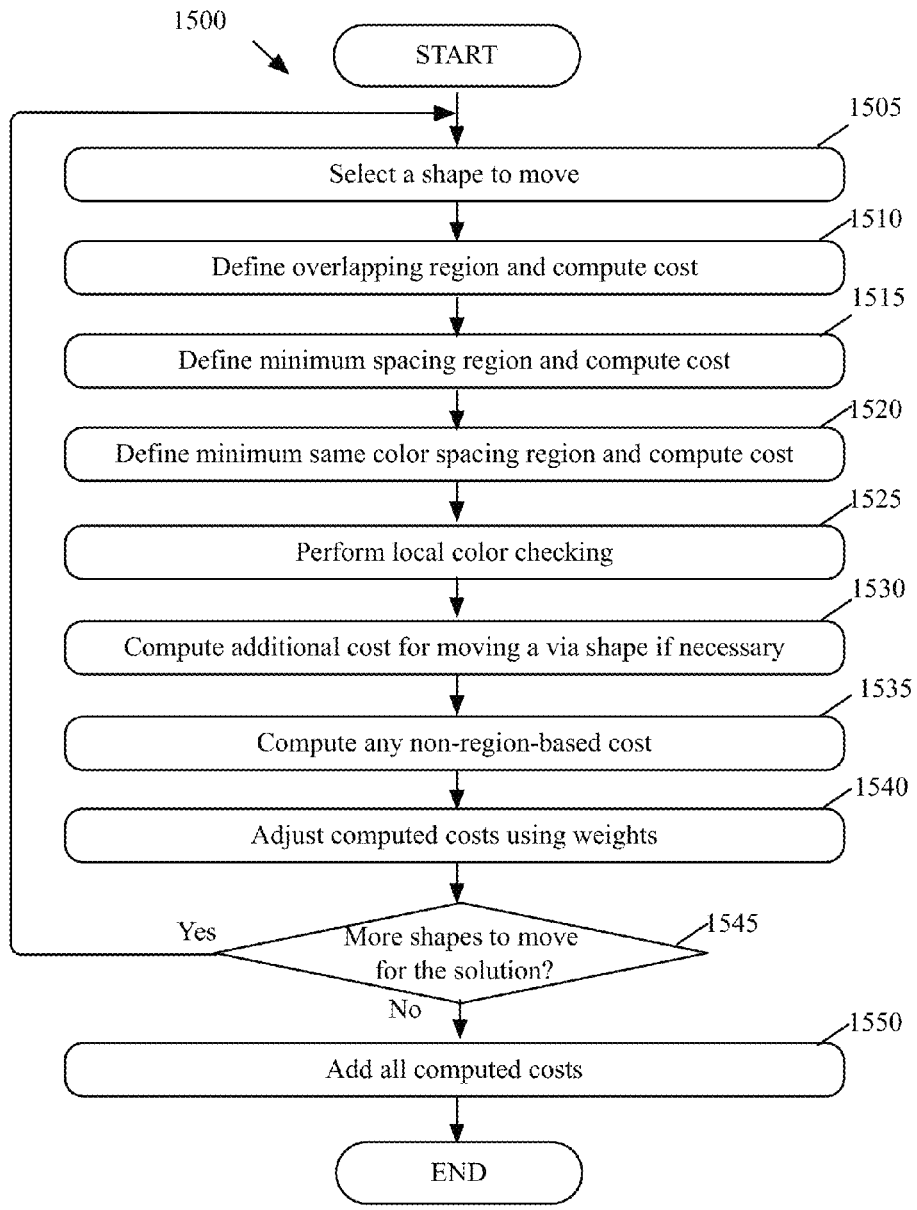
FIG. 15 conceptually illustrates a process that some embodiments perform to compute a cost of applying a design solution to a design layout.

FIG. 15 conceptually illustrates a process 1500 that some embodiments perform to compute a cost of applying a design solution to a design layout. The process 1500 in some embodiments is performed by the design solutions generator 700 described above by reference to FIG. 7. The process in some embodiments starts when the design solutions generator selects a design solution from a set of design solutions generated for a DP loop violation in a design layout.

Figure 16:
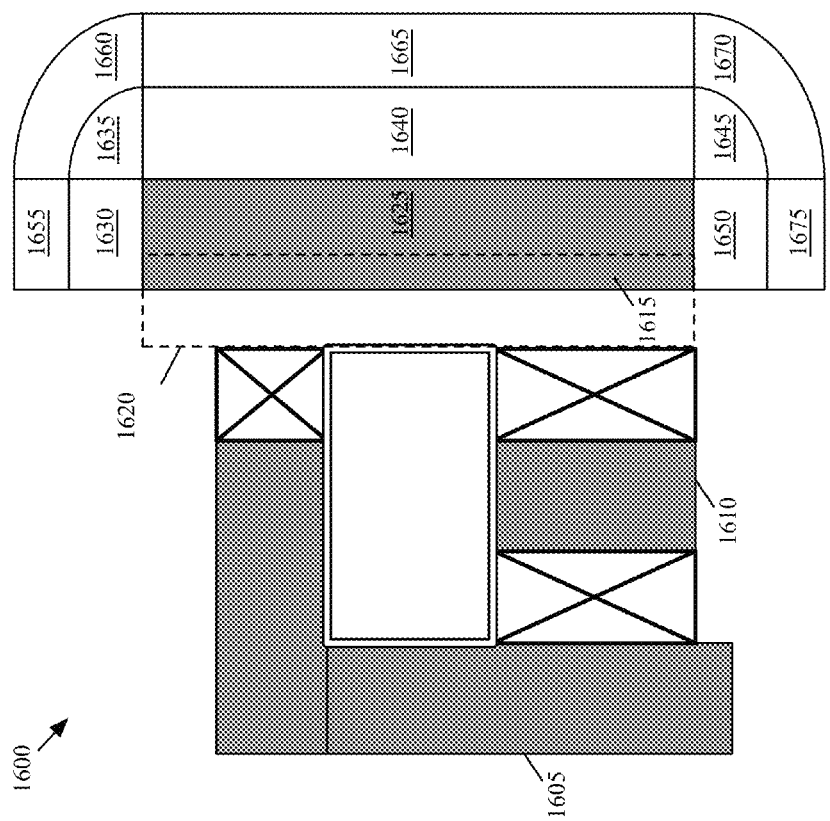
FIG. 16 illustrates an example of a selected design solution that breaks a DP loop.

The process 1500 will be described by reference to FIG. 16 which illustrates a design solution to resolve a DP loop violation in a design layout 1600. FIG. 16 illustrates an example of a selected design solution that breaks a DP loop formed by shapes 1605, 1610, and 1615 of the design layout 1600. A design solutions generator (not shown in FIG. 16) such as the design solutions generator 700 described above by reference to FIG. 7 has generated and selected the design solution in this example. The selected design solution requires moving the shape 1615 to the right from its original position so that the shape 1615 is apart from the shape 1610 at a distance greater than or equal to the minimum same color spacing. Other shapes of the design layout 1600 are not shown in FIG. 16 for simplicity.

Process 1500 begins by selecting (at 1505) a shape to move based on the selected design solution. As described, a design solution may require one or more shapes to be moved. The process selects one of the shapes that the solution requires to move. In the example of FIG. 16, the selected design solution requires moving only the shape 1215. Thus, the design solutions generator selects the shape 1215.

At 1510, the process then defines an overlapping region and computes a cost associated with the overlapping region. In some embodiments, the process defines as the overlapping region the new region that the shape would occupy when it is moved. FIG. 16 illustrates that the design solutions generator has defined a set of regions 1625-1675. The original location 1620 of the shape 1615 before the shape 1615 was moved is depicted as a dotted rectangle in FIG. 16. The shape 1215 occupies a new region 1225 after being moved as shown. The solution generator defines the new region 1625 as the overlapping region and computes the cost for this region.

The process in some embodiments computes the cost associated with the overlapping region based on the shapes that occupy at least a part of the overlapping region. In other words, the process finds all the shapes that will be in contact with the moved shape. For each shape found in the region, the process adds one unit cost (e.g., a value of 1) to the cost for the region.

Next at 1515, process 1500 defines a minimum spacing region and computes a cost for the minimum spacing region. As described above, the minimum spacing is a minimum distance at which a design rule requires two shapes in a design layout, regardless of the shapes' assigned colors, to be apart from each other. The design solutions generator defines the regions 1630-1650 based on a minimum spacing as shown in FIG. 16. The heights of the shapes 1630 and 1650 is the minimum spacing. The radii of the quarter circles that the regions 1635 and 1645 are depicted as are the minimum spacing. The width of the region 1640 is the minimum spacing. The regions 1630-1650 are thus within the minimum spacing from the shape 1615 after the movement. The design solutions generator defines the regions 1630-1650 collectively as a minimum spacing region.

The process in some embodiments computes the cost for the minimum spacing region in a similar manner that the process computes the cost for the overlapping region. That is, the process finds all shapes that occupy at least a portion of the minimum spacing region and adds unit costs for the shapes found in the region.

At 1520, the process defines a minimum same color spacing region and computes a cost for the minimum same color spacing region. As described above, a minimum same color spacing is greater than a minimum spacing because the double patterning lithography technology requires two shapes that will be on the same mask to be further apart in the design layout than two shapes that will be on different masks are allowed to be apart from each other at the minimum. A minimum same color spacing is a minimum distance at which a design rule requires two shapes with the same color in a design layout to be apart from each other. As shown in FIG. 16, the design solutions generator defines the regions 1655 to 1675 as regions that are within the minimum same color spacing from the shape 1615 but not within the minimum spacing from the shape 1615. As a result, the regions 1655-1675 form a band wrapping the regions 1630-1655. The width of this band is the difference between the minimum same color spacing and the minimum spacing. These regions that are defined outside the minimum spacing but inside the minimum same color spacing are collectively defined as the minimum same color spacing region.

In some embodiments, the process does not define any region on the side of the moved shape from which the shape has moved. For instance, the design solutions generator does not define any region on the left side of the shape 1615 because the shape 1615 has moved from left to right.

The process in some embodiments computes the cost for the minimum same color spacing region in a similar manner that the process computes the cost for the overlapping region and the minimum spacing region. That is, the process finds all shapes that occupy at least a portion of the minimum same color spacing region and adds unit costs for the shapes found in the region. Furthermore, the process does not double-count a shape that is already accounted for in computation of costs for other regions. For instance, when a shape that occupies at least a portion of all three types of regions (the overlapping region, the minimum spacing region, and the minimum same color spacing region) is counted for the cost for the overlapping region, the same shape will not be counted for computing the cost for the minimum spacing region or the minimum same color spacing region).

Process 1500 then performs (at 1525) local color checking if necessary. Local color checking is adjusting the cost computed for the minimum same color spacing region based on the color of the moved shape and the shapes found in the minimum same color spacing region. By performing local color checking, the process in some embodiments decreases the cost to zero units (e.g., no cost) when a color can be assigned to the moved shape without resulting in a minimum same color spacing violation. Local color checking will be described in detail below with reference to FIGS. 17 and 18.

Next, process 1500 computes (at 1530) additional costs for moving a vertical interconnect access (via) shape if necessary. The process in some embodiments computes costs associated with a via shape when the via shape is not completely inside the moved shape after the movement. In such cases, the process treats the via shape as a shape that the solution requires to move. That is, the process performs 1510 through 1525 for this via shape. Computing additional costs for moving such via shape will be described in detail further below with reference to FIGS. 19 and 20.

Process 1500 then computes (at 1535) any non-region-based cost for the design solution. A non-region-based cost is an additional cost to add to the overall cost of applying the design solution. The process computes this cost not based on the shapes found in the regions. For instance, the process computes a non-region-based cost based on the ratio of (1) the distance by which the selected design solution requires moving the selected shape and (2) a minimum spacing (e.g., the minimum distance by which two shapes of different colors should be apart).

Next, the process adjusts (at 1540) the computed costs for the regions based on weights. The process in some embodiments assigns different weights to different shapes found in different regions. A weight could be a factor by which to multiply the cost calculated for a shape in some embodiments. In other embodiments, weights mean different amounts of costs assigned to different shapes in different regions.

The process assigns the first most weight to an instance shape found in a region. As described above, an instance shape is a shape that belongs to a design instance, which is a group of shapes that are laid out in a pre-defined manner and can be reused for different locations of a design layout. That is, the shapes in a design instance are prearranged and immutable. The process in some embodiments assigns a cost of infinity to an instance shape found in the selected region. The process assigns the second highest weight to the shapes that connect to the moved shape. That is, a shape that falls in the overlapping region will be assigned to the second most weight. The process assigns the third highest weight to the shapes that are found in the minimum spacing region. The process assigns the fourth highest weight to via shapes that are found in a region. That is, an additional weight will be assigned to the via shape when a weight is already assigned to the via shape, for example, by falling in a minimum spacing region. The process assigns the fifth highest weight to any non-special shapes (e.g., shapes that are not via shapes or instance shapes, etc.) found in a region. The process assigns the sixth highest weight to the shapes found in the minimum same color spacing region. The process assigns the seventh highest weight to the non-region-based costs. The process assigns the eighth highest weight to the cost computed for moving a via shape.

The order (i.e., the first highest to the sixth highest weight) that defines the amount of weight that the process assigns to different shapes in different regions as described above does not have to be followed in some embodiments. For instance, the process may assign more weight to via shapes than the shapes that would overlap with the moved shape. Moreover, in some embodiments, the different weight given to different shapes found in different regions are configurable. That is, the designer using the design solutions generator performing process 1630 can arbitrarily assign different costs to different shapes in different regions. Moreover, the process in some embodiments does not add a cost of infinity when the process finds an instance shape in the minimum same color spacing region. The process in these embodiments assigns a weight that the process assigns to a non-special shape to the instance shape.

The process then determines (at 1545) whether there are more shapes to move for the design solution. When the process determines that there are more shapes to move, the process loops back to 1505 to select the next shape to compute costs for moving it. Otherwise, the process proceeds to 1550. At 1550, the process adds all computed costs. The resulting sum is the overall cost for the solution that includes costs computed for moving all the shapes the design solution requires to move. The process then ends.

One of ordinary skill in the art will recognize that process 1500 is a conceptual representation of the operations used to compute costs for moving all the shapes that a design solution requires to move. The specific operations of process 1500 need not be performed in the exact order shown and described. The specific operations need not be performed in one continuous series of operations, and different specific operations may be performed in different embodiments. Furthermore, the process could be implemented using several sub-processes, or as part of a larger macro process. For instance, in some embodiments, process 1500 may adjust costs based on the weights while computing costs for each region at 1510, 1515, and 1520 instead of adjusting the computed costs at 1540.

Figure 17:
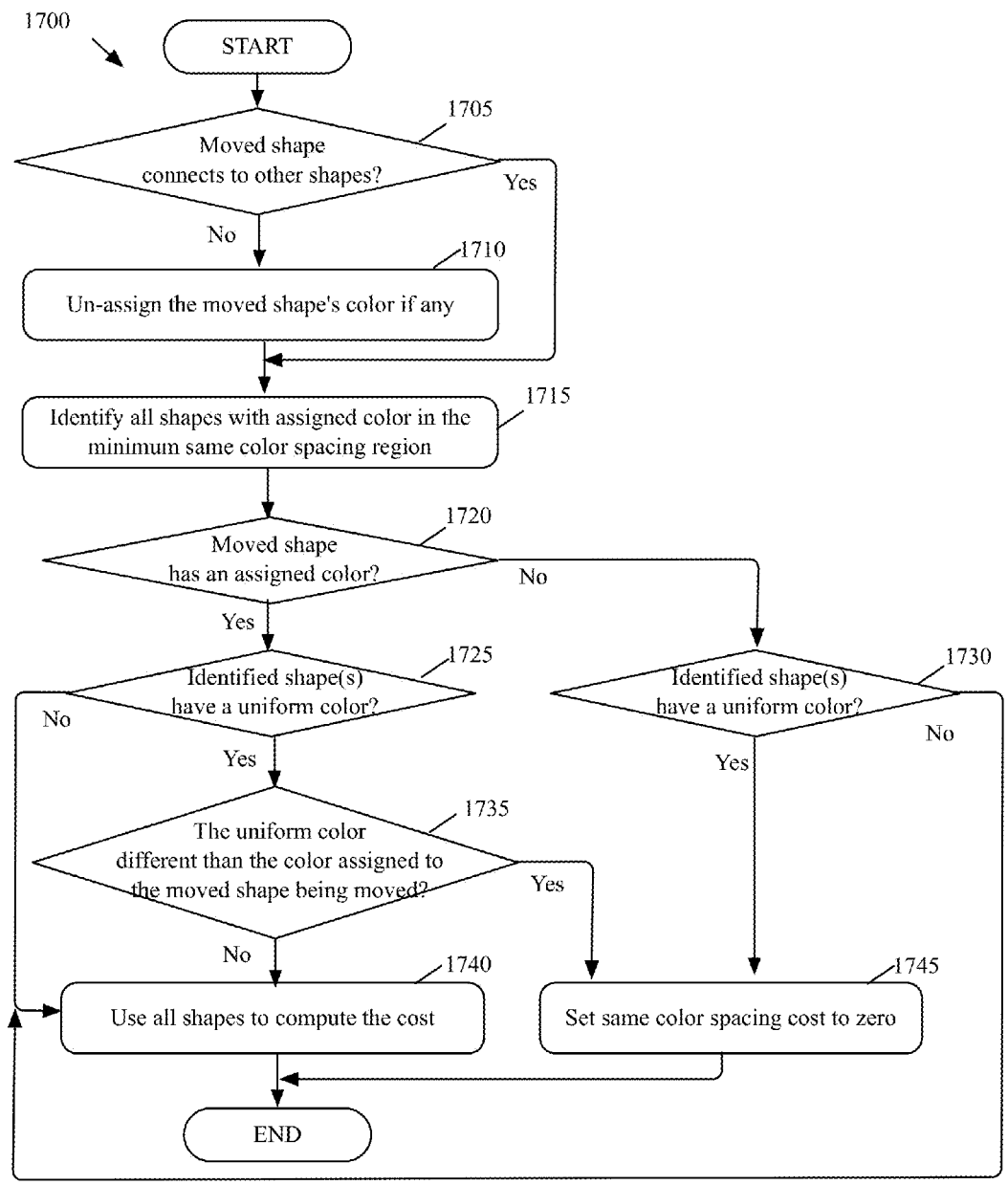
FIG. 17 conceptually illustrates a process that some embodiments perform to conduct local color checking.

FIG. 17 conceptually illustrates a process 1700 that some embodiments perform to do local color checking. As described above, local color checking is adjusting the cost computed for the minimum same color spacing region based on the colors of the moved shape and the shapes found in the region. Process 1700 in some embodiments is performed by the design solutions generator 700 described above by reference to FIG. 7. The process in some embodiments starts after the design solutions generator has computed costs for the minimum same color spacing region.

Figure 18:
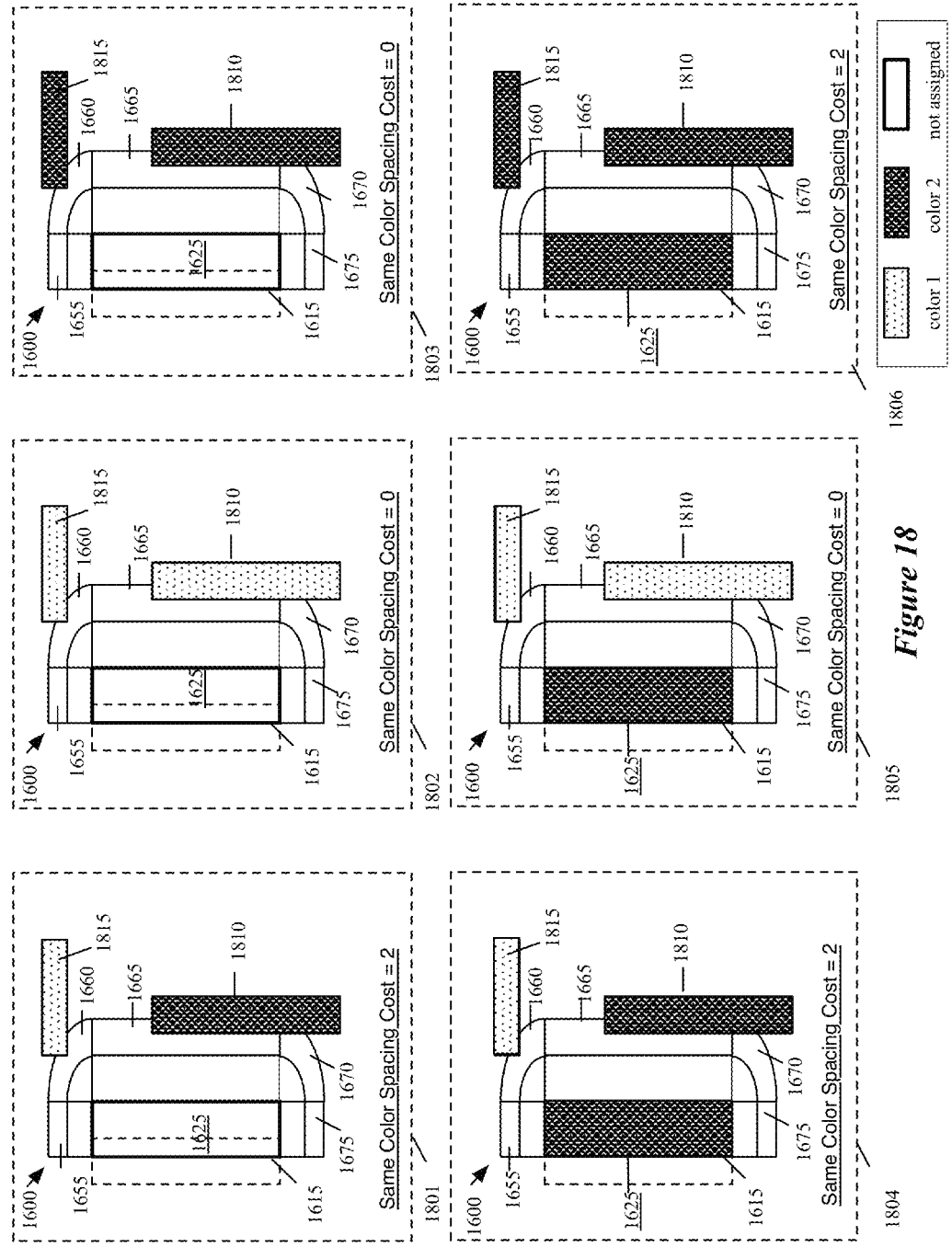
FIG. 18 illustrates an example of performing local color checking

Process 1700 will be described by reference to FIG. 18. FIG. 18 illustrates an example of performing local color checking. Specifically, FIG. 18 illustrates six different color combinations 1801-1806 of the moving shape 1615 and two existing shapes 1810 and 1815 that fall within the same color checking region 1660, 1665, and 1670 of the design layout 1600 described above by reference to FIG. 16. For simplicity, shapes 1605 and 1610 that were forming a DP loop with the shape 1615 before the movement of the shape 1615 are not illustrated in FIG. 18.

Process 1700 begins by determining (at 1705) whether the moved shape connects to any existing shape of the design layout after the movement. That is, the process determines whether there are existing shapes in the overlapping region As described above, the region 1625 is an overlapping region.

When process 1700 determines (at 1705) that the shape being moved does not connect to any existing shape of the design layout, the process un-assigns (at 1710) the color of the shape if the shape had an assigned color so that the shape has no assigned color. Otherwise, the process proceeds to 1715 and thereby the moved shape retains its assigned color if any. The moved shape 1615 that occupies the overlapping region 1625 does not connect to any existing shapes in any of the six combinations 1801-1806 as shown in FIG. 18. Thus, the design solutions generator does not un-assign the color for the moved shape 1615 in combinations 1804-1806 in which the moved shape 1615 has an assigned color.

The process then identifies (at 1715) all shapes with assigned colors that fall in the same color spacing region. As shown in FIG. 18, two shapes 1810 and 1815 occupy at least a portion of the minimum same color spacing region (e.g., the regions 1655-1675). These two shapes have assigned colors in all six combinations 1801-1806. The design solutions generator identifies these two shapes.

Next, process 1700 determines (at 1720) whether the moved shape has an assigned color. The moved shape 1615 does not have an assigned color in the combinations 1801-1803. In the combinations 1804-1806, the moved shape 1615 has an assigned color (e.g., red). When the process determines (at 1720) that the moved shape has an assigned color, the process determines (at 1725) whether the identified shapes have a uniform color. Otherwise, the process proceeds to 1730 which will be described further below. The design solutions generator determines that the shapes 1810 and 1815 have a uniform color in combinations 1805 and 1806 among the combinations 1804-1806 in which the moved shape has an assigned color.

When the process determines (at 1725) that the identified shapes do not have a uniform color, the process uses (at 1740) all the identified shapes to compute the cost. The identified shapes 1810 and 1815 have different assigned colors in the combination 1804 between the combinations 1804 and 1805. Thus, the design solutions generator adds two unit costs (e.g., a value of 2) for the minimum same spacing region.

When the process determines (at 1725) that the identified shapes have a uniform color, the process determines (at 1735) whether the uniform color that these shapes have is different than the color assigned to the moved shape. When the process determines (at 1735) that the uniform color is different than the color assigned to the moved shape, the process sets (at 1745) the costs computed for the same color spacing region to zero unit cost (e.g., a value of zero). The identified shapes 1810 and 1815 have a uniform color in the combination 1805 between the combinations 1804 and 1805. Also, the uniform color that these two shapes have in the combination 1804 is different than the color assigned to the moved shape 1615 as shown in FIG. 18. Thus, the design solutions generator sets the cost for the minimum same color spacing region to zero as shown in FIG. 18. When the process determines (at 1735) that the uniform color is not different than the color assigned to the moved shape, the process uses (at 1740) all the identified shapes to compute the cost for the minimum same spacing region.

When the process determines (at 1720) that the moved shape does not have an assigned color, the process determines (at 1730) whether the identified shapes have a uniform color. The identified shapes 1810 and 1815 have a uniform color in the combinations 1802 and 1803 among the combinations 1801-1803 in which the moved shape 1615 does not have an assigned color. In combination 1801, the two identified shapes does not have a uniform color as shown.

When the process determines (at 1730) that the identified shapes have a uniform color, the process sets (at 1745) the costs computed for the same color checking region to zero unit cost. The design solutions generator sets the cost for the same color spacing region for the combinations 1802 and 1803 because the identified shapes 1810 and 1815 have a uniform color. When the process determines (at 1730) that the identified shapes do not have a uniform color, the process uses (at 1740) all the shapes to compute the cost for the minimum same spacing region. The design solutions generator adds two unit costs (e.g., a value of 2) for the minimum same spacing region for the combination 1 as shown because the identified shapes 1810 and 1815 have different colors as shown. The process then ends.

By performing process 1700, the design solutions generator of some embodiments determines that the shapes found in the minimum same color spacing do not contribute to the overall cost of applying the design solution when the shapes found in the region and the moved shape do not violate the minimum same color spacing rule. For the combination 1802 and 1803 shown in FIG. 18, the design solutions generator can assign to the moved shape 1615 a color different than a uniform color that is assigned to the shapes 1810 and 1815 without violating the rule. This is because the two shapes 1810 and 1815, which are within the minimum same color spacing from the moved shape 1615, has a uniform color in combinations 1802 and 1803 and the moved piece and each of the two shapes 1810 and 1815 can have different colors. In contrast, the design solutions generator cannot assign a color to the moved shape 1615 without violating the rule in combination 1. This is because assigning to the moved shape 1615 a color that is different than the color assigned to the shape 1810 to avoid violating the rule will cause the moved shape 1615 and the shape 1815 to violate the rule.

Figure 19:
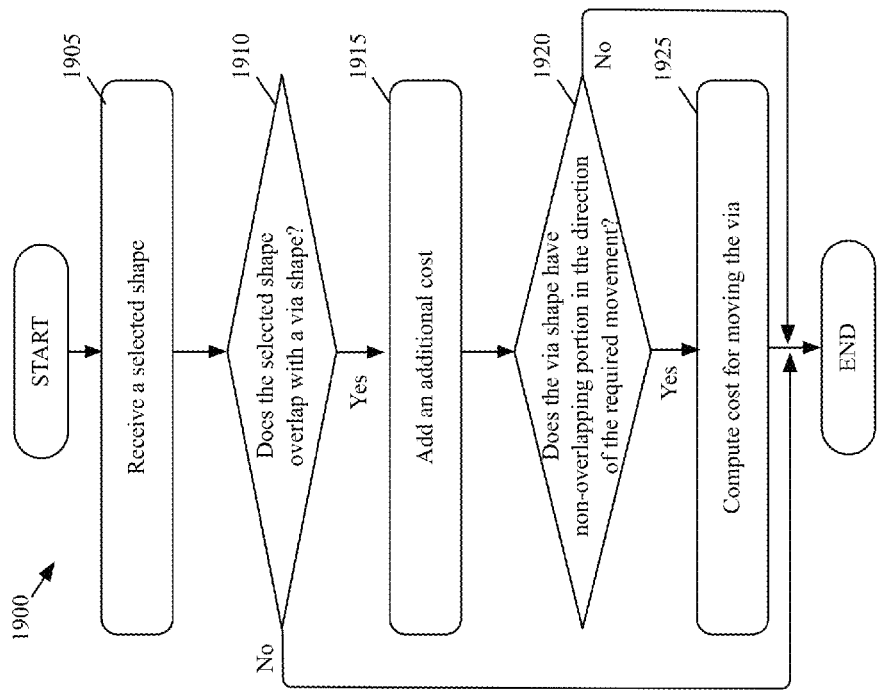
FIG. 19 conceptually illustrates a process that some embodiments perform to compute additional costs for moving a via shape.

FIG. 19 conceptually illustrates a process 1900 that some embodiments perform to compute additional costs for moving a vertical interconnect access (via) shape. Process 1700 in some embodiments is performed by the design solutions generator 700 described above by reference to FIG. 7. The process in some embodiments starts after a shape, that a design solution requires to move, is selected.

Figure 20:
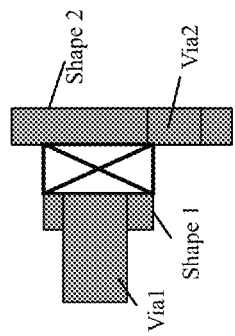
FIG. 20 illustrates a design layout that includes several shapes and several via shapes.

The process begins by receiving (at 1905) a selected shape. FIG. 20 illustrates a design layout that includes shapes 1 and 2 and via shapes 1 and 2. Other shapes that the design layout includes are not depicted in the figure for simplicity. The figure also illustrates two design solutions 1 and 2. The solution 1 requires moving shape 1 and the via shape 1 to the left. The solution 2 requires moving the shape 2 and the via shape 2 to the right. As shown, the via shape 2 is completely within the shape 2, while the via shape 1 only partially overlaps with shape 1. The design solutions generator (not shown in FIG. 20) has selected the shape 1 for the solution 1 and the shape 2 for the solution 2.

Process 1900 then determines (at 1910) whether the selected shape overlaps with a via shape. When the process determines (at 1910) that the selected shape does not overlap with a via shape, the process ends. Otherwise, the process adds (at 1915) an additional unit cost (e.g., a value of 1) to the overall cost for the solution. Since the shapes 1 and 2 both overlap with via shapes as shown in FIG. 20, the design solutions generator adds a unit cost for each of the solutions 1 and 2.

Next, the process determines (at 1920) whether the via shape has a non-overlapping portion in the direction of the movement required by the design solution. When the process determines (at 1910) that the via shape does not have a non-overlapping portion in the direction of the movement required by the design solution, the process ends. Otherwise, the process computes (at 1925) the cost for moving the via shape. That is, when the via shape has a non-overlapping portion in the direction of the required movement, the process defines an overlapping region, a minimum spacing region, and a minimum same color spacing region based on the position of the non-overlapping portion of the via shape to which the via shape is moved. This is because when the via shape is not completely inside the selected shape, the cost for moving the non-overlapping portion of the via shape will not be accounted for in the cost computed for moving the selected shape. In other words, because this non-overlapping portion of the via shape is moving together with the selected shape, some design violations may result from moving this portion in addition to the potential design violations that would result from moving the selected shape.

The via shape 2 shown in FIG. 18 does not have a non-overlapping portion because the via shape 2 is completely inside the shape 2. Thus, the design solutions generator will not perform an additional cost computation for the via shape 2. Assuming that via shape 2 is not completely inside the shape 2 and has some non-overlapping portion on the left side of the shape 2, this non-overlapping portion would not have triggered the design solutions generator to compute the additional cost because that portion would not be in the direction of the movement that the solution 2 requires (i.e., to the right). On the other hand, the via shape 2 has a non-overlapping portion on the left side of the shape 1. This portion is in the direction of the movement that the solution 1 requires. Thus, the design solutions generator will compute the additional cost for the via shape 1.

C. Architecture

Figure 21:
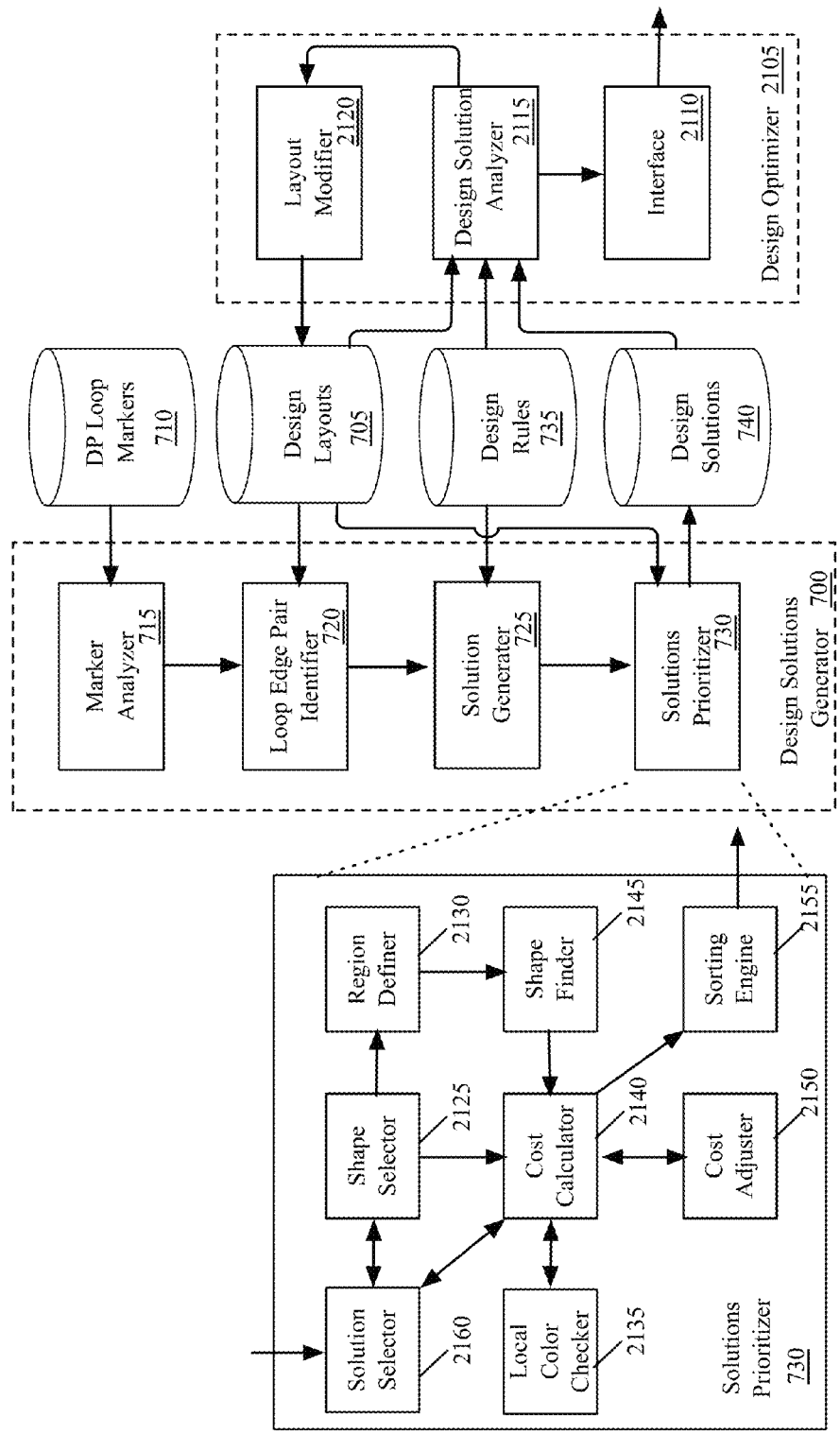
FIG. 21 conceptually illustrates example architecture for the design solutions generator and a design optimizer of some embodiments.

FIG. 21 conceptually illustrates an example architecture for the design solutions generator 700 and a design optimizer 2105 of some embodiments. Specifically, FIG. 21 illustrates that the design solutions generator 700 generates and prioritizes design solutions for resolving DP loop violations in a design layout and the design optimizer selects and applies a generated solution to the design layout. This figure illustrates the design layouts 705, the DP loop violation markers 710, the design solutions generator 700, the design rules 735, and the design solutions 740 which are described above by reference to FIG. 7. The design solutions generator 700 includes the marker analyzer 715, the loop edge pair identifier 720, the solutions generator 725, and the solutions prioritizer 730 which are also described above by reference to FIG. 7.

FIG. 21 illustrates that the solutions prioritizer 730 includes a solution selector 2160, a shape selector 2125, a region definer 2130, a shape finder 2145, a cost calculator 2140, a local color checker 2135, a sorting engine 2155, and a cost adjuster 2150. The solution selector 2160 retrieves or receives generated design solutions from the solution generator 725 or the design solutions repository 740. The solution selector 2160 selects a design solution to process and sends the selected design solution to the shape selector 2125. The shape selector 2125 selects a shape that the selected design solution requires to move. The region definer 2130 then defines the regions in the design layout based on the design rules and the position of the selected shape after the movement. These regions include an overlapping region, a minimum spacing region, a minimum same color spacing region, etc. The shape finder 2145 finds the shapes that fall in these defined regions. The shape finder 2145 also identifies the region to which a shape belongs and ensures that one shape does not get counted for more than one region.

The cost calculator 2140 computes the cost for each defined region first based on the number of shapes found in each region. The cost calculator 2140 also performs local color checking using the local color checker 2135. Local color checking is described above by reference to FIGS. 17 and 18. The cost calculator 2140 also counts special shapes like via shapes and instance shapes found in computation of the cost for the defined regions. The cost calculator in some embodiments then adjusts the calculated cost using the cost adjuster 2150. The cost adjuster 2150 adjusts the cost so far calculated by, for example, assigning different weights to different shapes found in different defined regions. The cost adjustment operations are described above in detail by reference to FIG. 15. Once the cost calculator computes the cost of moving a selected shape, the cost calculator computes a cost for moving another shape that the selected design solution requires to move. When the cost calculator is done computing the cost for all shapes for the selected design solution, the cost calculator 2140 computes the cost for another design solution. Once the cost calculator 2140 computes all costs for all design solutions, the sorting engine 2155 prioritizes the design solutions based on the computed costs. For instance, the sorting engine 2155 sorts the design solutions for the DP loop violation in the order of the lowest to the highest cost. In some embodiments, the solutions prioritizer 730 deposits the prioritized design solutions in the design solutions repository 740.

As shown in FIG. 21, the design optimizer 2105 includes a design solution analyzer 2115, a layout modifier 2120, and an interface 2110. The design optimizer 2105 in some embodiments receives or retrieves the prioritized design solutions for addressing the DP loop violation, selects a design solution to use, and changes the design layout based on the selected design solution.

The design solution analyzer 2115 selects a design solution from the prioritized design solutions. In some embodiments, the design solution analyzer 2115 selects the design solution with the highest priority without analyzing the design solution to see whether applying the solution creates new design rule violations under the assumption that the solution with highest priority has the least chance of causing new design violations. In other embodiments, the design solution analyzer 2115 analyzes each design solution from the highest priority solution to the lowest priority solution until it finds a design solution that does not cause new design rule violations. The design solution analyzer 2115 selects the first such solution. The design solution analyzer 2115 then sends the selected design layout to the layout modifier 2120, which will change the design layout by applying the selected design solution.

In some cases, all design solutions generated and prioritized for a DP loop violation cause new design rule violations. In such cases, the design solution analyzer 2115 in some embodiments selects the design solution that causes the least number of design rule violations. In some such embodiments, the design solution analyzer 2115 uses the priorities assigned to the design solutions when there are two or more design solutions that cause the least number of design rule violations. In some embodiments, the design analyzer 2115 also uses the type of design violation when selecting a design solution. One of the ordinary skill in the art will recognize that there are many other ways of selecting a design solution from a group of prioritized design solutions. For instance, the design analyzer 2115 may select a design solution that causes a minimum same spacing rule violation over a design solution that causes a new DP loop violation.

When all design solutions generated and prioritized for a DP loop violation cause a new design rule violation, the design solution analyzer 2115 may use the interface 2110 to take further action instead of applying a design solution that will cause one or more design rule violations. For instance, the design solution analyzer 2115 in some embodiments notifies the designer that all of the generated design solutions cause new design rule violations. In other embodiments, the design solution analyzer 2115 notifies through the interface 2110 another module (not shown) which resolves a DP loop violation by introducing splicing graphs in the shapes of the design layout. Resolving a DP loop violation using splicing graphs is described in detail below in Section III.

In some embodiments, the design solutions generator 700 and the design optimizer 2105 are stand-alone software applications. In other embodiments, the design solutions generator 700 and the design optimizer 2105 are parts of a single software application that generates and uses design solutions.

Figure 22:
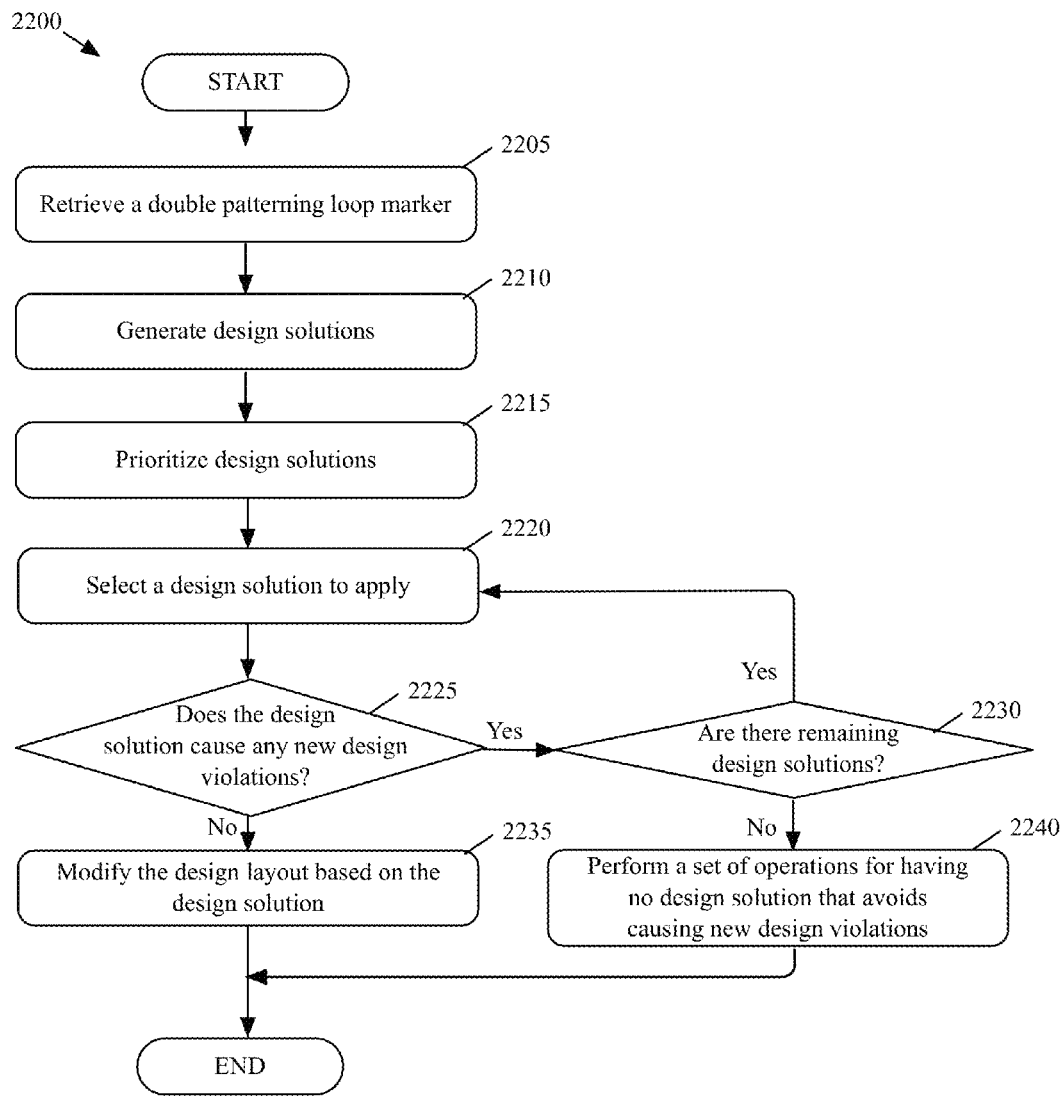
FIG. 22 conceptually illustrates a process that some embodiments perform to generate and prioritize design solutions to a DP loop violation.

FIG. 22 conceptually illustrates a process 2200 that some embodiments perform to generate and prioritize design solutions for a DP loop violation in a design layout and to use the design solutions to remedy the DP loop violation in the design layout. The process in some embodiments is performed by a software application that includes the design solutions generator 700 and the design optimizer 2105 or by a system on which the design solutions generator 700 and the design optimizer 2105 are executed. The process 2200 is performed when a user executes the software application or runs the system in order to modify a design layout that contains a DP loop violation.

As shown, process 2200 retrieves or receives (at 2205) a DP loop violation marker that indicates that a set of shapes in the design layout forms a DP loop. A DP loop violation marker is described above in detail in subsection II.A. The process retrieves or receives the marker from a repository such as the markers repository 705 described above by reference to FIG. 7.

Next, the process generates (at 2210) several design solutions based on the received marker. An example set of operations that the process 2200 performs to generate design solutions is described above by reference to FIG. 11. The process in some embodiments stores the generated design solutions in a repository such as the design solutions repository 740 described above by reference to FIGS. 7 and 21.

Process 2200 then prioritizes (at 2215) the generated design solutions based on the costs of applying the design solutions. An example set of operations that the process 2200 performs to prioritize the generated design solutions for resolving a DP loop violation is described above by reference to FIG. 14.

The process in some embodiments then selects (at 2220) the next highest priority design solution among the prioritized design solutions. The process retrieves the design solution and the design layout that contains the DP loop. The process changes the design layout according to the design solution without committing the changes to the design layout in some embodiments (e.g., without saving the design layout as changed or without depositing the changed layout into a repository such as the design layouts repository 740 described above by reference to FIGS. 7 and 21).

Based on the changed design layout, the process determines (at 2225) whether the selected design solution causes any new design violations in the design layout. In order to determine design rule compliance, the process retrieves the design rules and verifies the changed design layout against each of the retrieved design rules. When the process determines (at 2225) that the design solution causes one or more new design violations in the design layout, the process proceeds to 2230 which will be described further below.

After process 2200 determines (at 2225) that the design solution does not cause any new design violations in the design layout, the process modifies (at 2235) the design layout based on the selected design solution. The process in some embodiments modifies the design layout by committing the changes made to the design layout. The process then ends.

When the process 2200 determines (at 2225) that the selected design solution causes one or more new design violations in the design layout, the process determines (at 2230) whether there are any generated design solutions that the process has not verified yet. When there are more design solutions left, the process loops through operations 2220 and 2225 in order to continue examining the remaining design solutions.

When there are no more design solutions left, the process performs (at 2240) a set of operations for having no design solution that resolves the DP loop violation without resulting in new design rule violations. The set of operations includes operations that the process performs to select the highest priority design solution and applying the selected design solution to the design layout that contains the DP loop. The set of operations may also include operations that the process performs to resolve the DP loop violation by introducing splicing graphs in the shapes of the design layout. Resolving a DP loop violation using splicing graphs is described in detail below in Section III. The set of operations may also include operations that the process performs to report to the user so that the user can make a decision on whether to use any of the generated design solutions. In some such embodiments, the process notifies the user (e.g., via a pop up message or a message log) that all of the generated design solutions for the design violation cause new design rule violations and ends.

One of ordinary skill in the art will recognize that process 2200 is a conceptual representation of the operations used to receive a marker, generate design solutions based on the marker, select a design solution, and apply the selected design solution to remedy a design violation. The specific operations of process 2200 need not be performed in the exact order shown and described. The specific operations need not be performed in one continuous series of operations, and different specific operations may be performed in different embodiments. Furthermore, the process could be implemented using several sub-processes, or as part of a larger macro process.

For instance, in some embodiments, process 2200 is performed by one or more design software applications that are executing on one or more computers. Specifically, resolving the DP loop violation by introducing (at 2240) splicing graphs to the shapes of the design layout may be performed by one software and generating and prioritizing design solutions as well as selecting and applying a design solution may be performed by another software.

D. Data Structures

Figure 23:
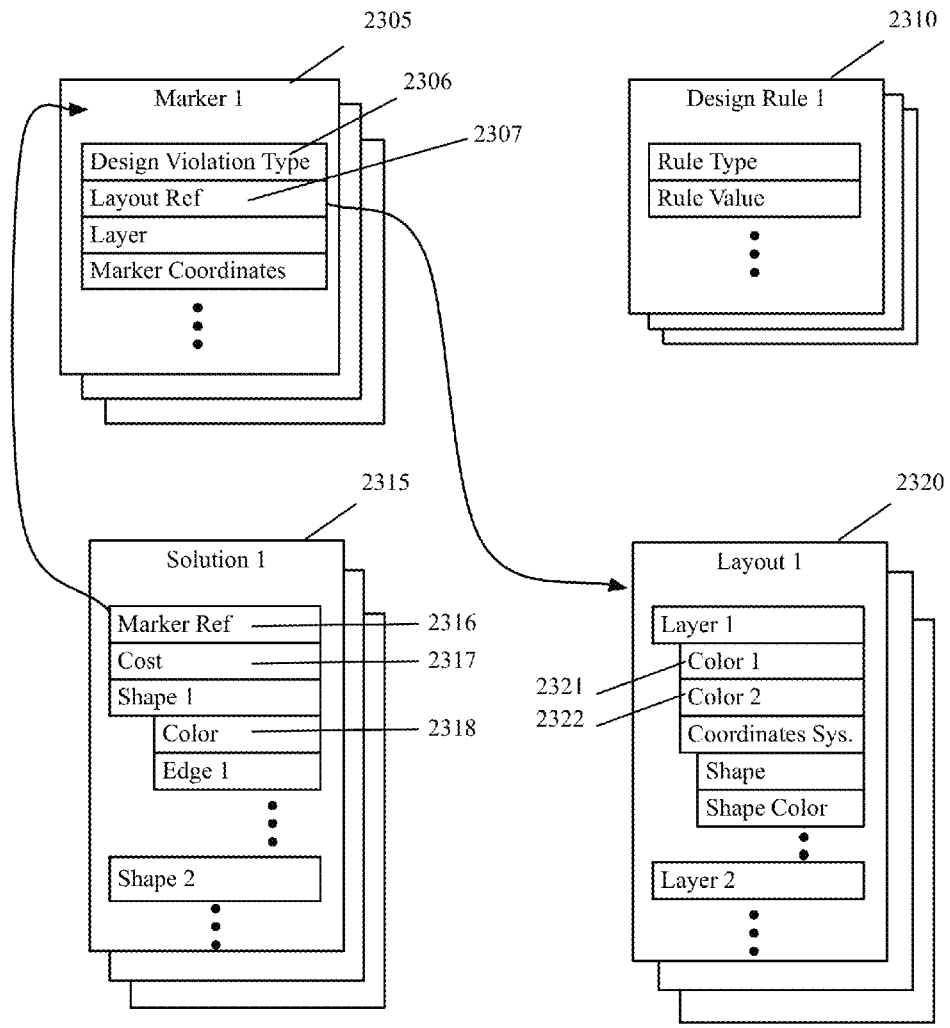
FIG. 23 illustrates example data structures for DP loop violation markers, design solutions, design rules, and design layouts used by some embodiments.

FIG. 23 illustrates example data structures for DP loop violation markers, design solutions, design rules, and design layouts used by some embodiments of the invention. As shown, a data structure 2305 for a DP loop marker in some embodiments includes a violation type 2306 to indicate that the marker is for a DP loop violation, a reference 2307 to the design layout in which the DP loop is formed, an identification of the layer of the design layout in which the DP loop is formed, and coordinates of the marker.

The data structure 2310 for a design rule in some embodiments includes a rule type (e.g., a minimum spacing rule, a minimum same color spacing rule, etc.) and a rule value that corresponds to the rule type (e.g., a minimum distance between two shapes having the same assigned color, a minimum distance between two shapes of any color, a minimum width of a shape, a minimum size of a shape, etc.).

A data structure 2315 for a design solution in some embodiments includes a reference 2316 to the marker in which information regarding the DP loop violation that the solution can remedy is included. The data structure 2315 also includes a list of shapes that need to be moved and their target coordinates for each corner of the shape. For each shape in the list, the data structure include a cost 2317 and a color 2318. The cost 2317 will store the value of the cost associated with moving this particular shape. The color 2318 stores a value that represents a color assigned to the shape. In some embodiments, the data structure 2315 for a design solution includes the marker, instead of having a reference to the data structure 2305.

A data structure 2320 for a design layout in some embodiments includes a list of layers that are in the design layout. Each of the layers in the list includes information about the layer's coordinates system and a list of sets of coordinates. Each set of coordinates is a set of coordinates of vertexes of a segment or shape on the layer in some embodiments. Also, the data structure 2320 includes colors 2321 and 2322 for storing two values that represent the two colors to be assigned to the shapes in each layer.

III. INTRODUCING SPLICING GRAPHS TO SHAPES

Figure 24:
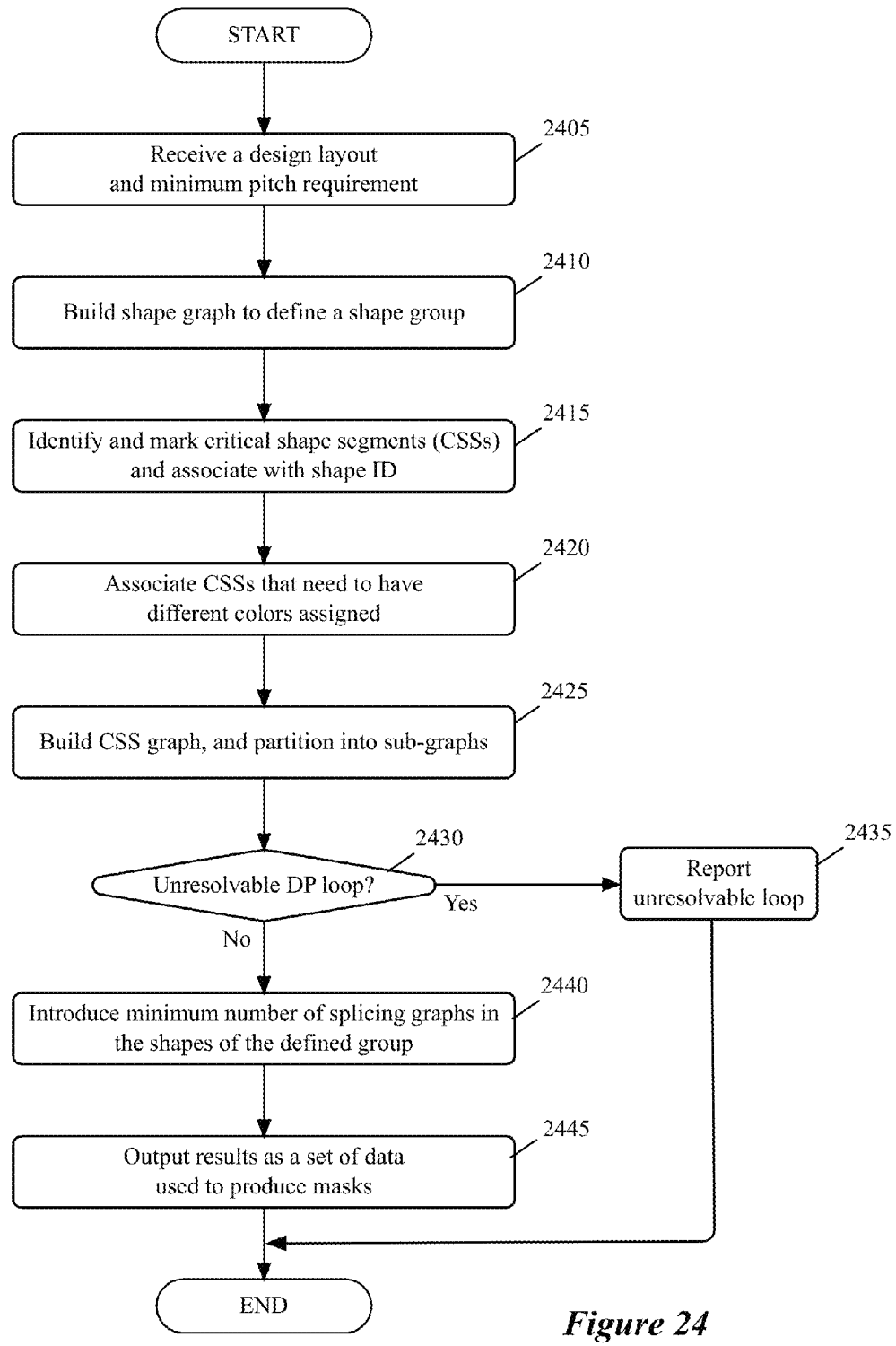
FIG. 24 conceptually illustrates a process of some embodiments for introducing splicing graphs in order to resolve a DP loop violation in a design layout region of an IC.
Figure 25:
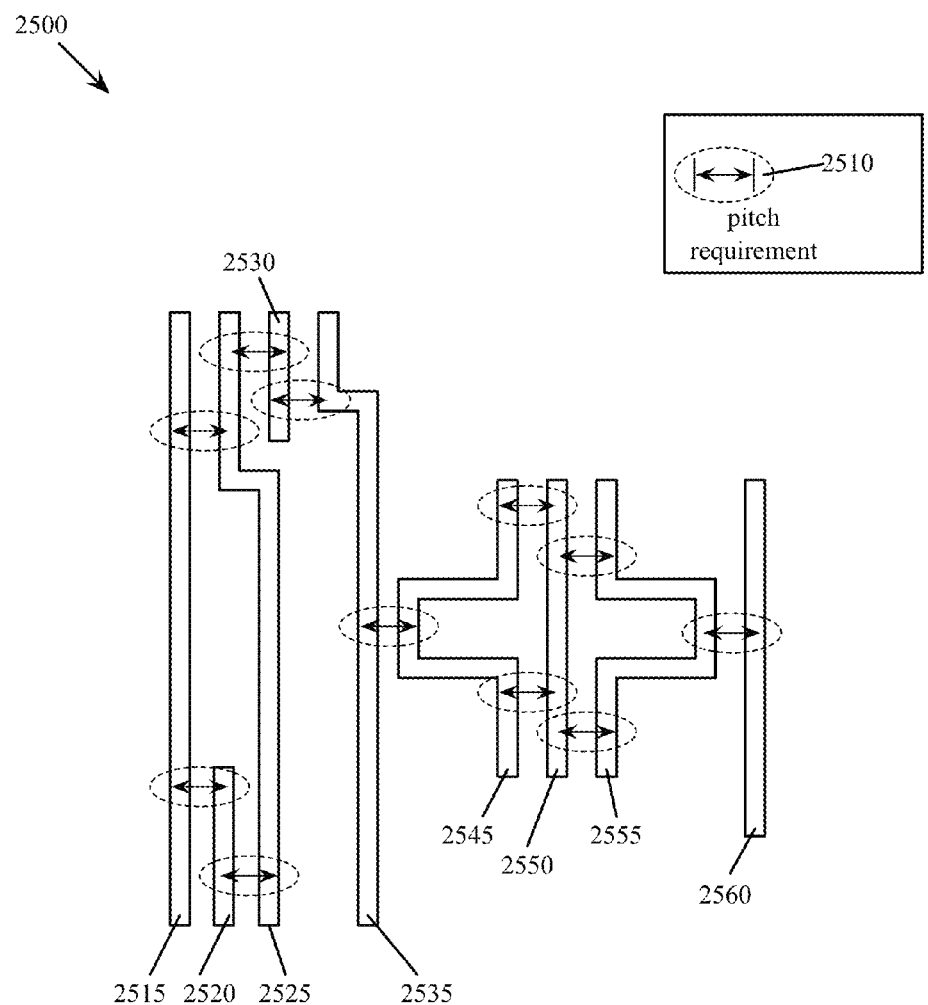
FIG. 25 illustrates a design layout and pitch requirement.

FIG. 24 conceptually illustrates a process 2400 of some embodiments for introducing splicing graphs in order to resolve a DP loop violation in a design layout region of an IC. The process 2400 begins at 2405 when it receives the design layout that includes a DP loop along with a pitch requirement for the exposures. In some embodiments, the pitch requirement is the minimum width of a shape plus the distance that two shapes can be from each other and still be printed in the same exposure, while in other embodiments, the pitch requirement is the minimum distance that two shapes can be from each other and still be printed in the same exposure. FIG. 25 illustrates a design layout 2500 and pitch requirement 2510. The design layout 2500 includes nine shapes 2515-2560. The design layout 2500 includes a DP loop formed by shapes 2515, 2520, and 2525

A. Generating a Shape Graph and Defining a Group of Shapes

In order to resolve a DP loop violation, some embodiments use shape graphs in addition to the other graphs described above. Returning to process 2400, the process 2400 builds (at 2410) a shape graph to represent the associations between shapes. In some embodiments, the shape graphs are used for the assignment of colors to the shapes.

Figure 26:
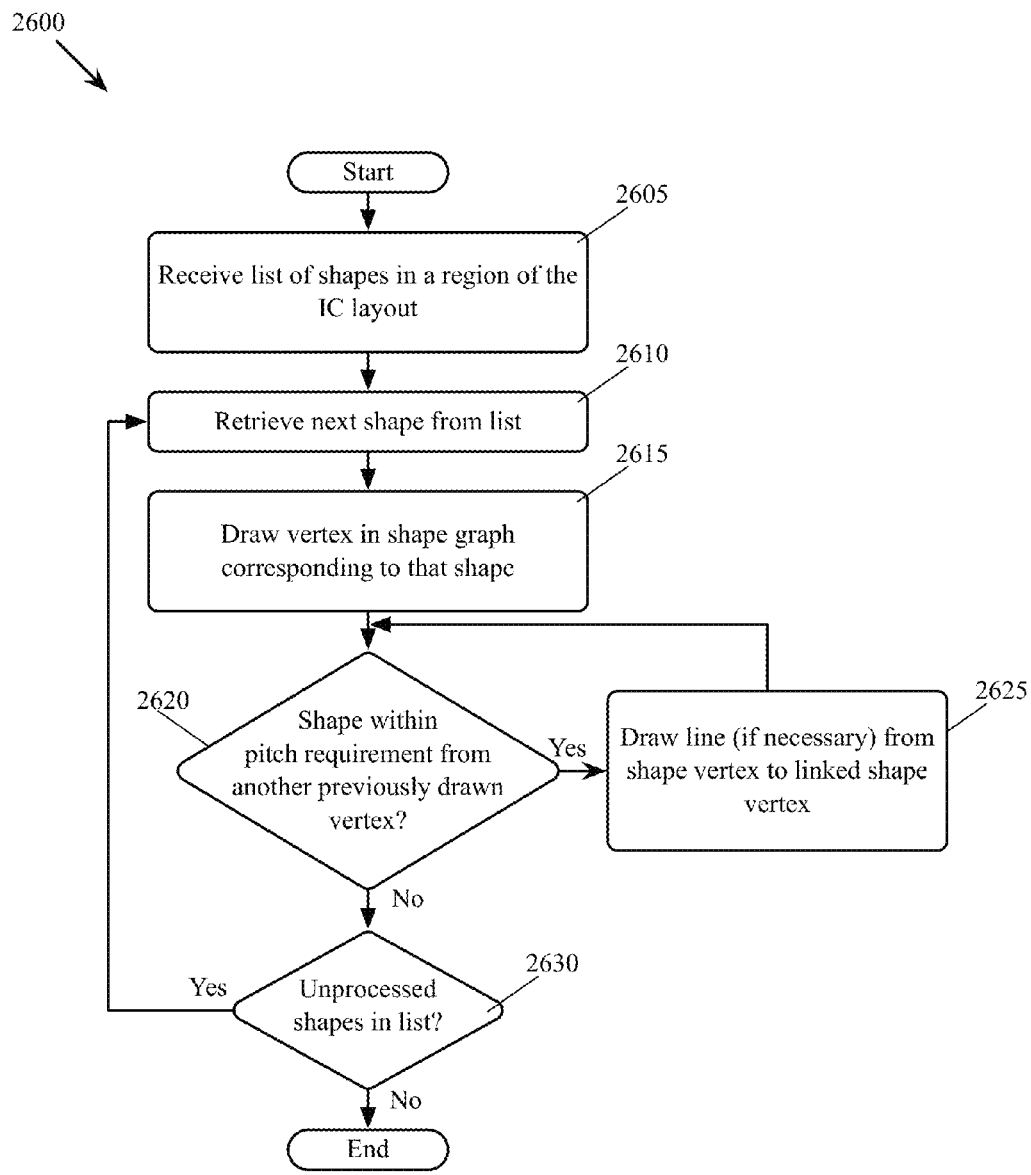
FIG. 26 conceptually illustrates a process 2600 of some embodiments for drawing a shape graph.
Figure 27:
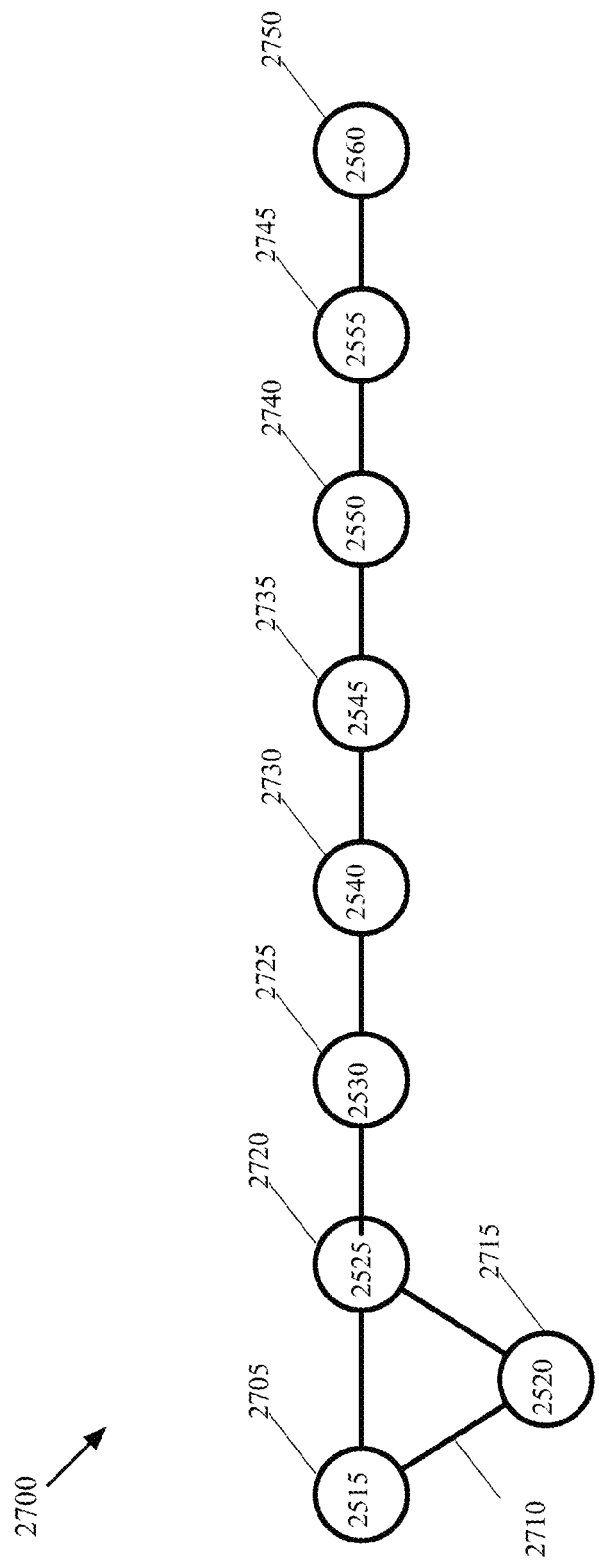
FIG. 27 illustrates a shape graph for a design layout region.

FIG. 26 conceptually illustrates a process 2600 of some embodiments for drawing a shape graph. The process begins at 2605 by receiving a list of shapes for a particular design layout region. Design layout region 2500 of FIG. 25 is an example of a design layout region that would be received by process 2600. FIG. 27 illustrates the completed shape graph for design layout region 2500.

The received list is ordered such that linked shapes are near each other in some embodiments, whereas in other embodiments the list is more random. Some embodiments provide the list as pairs of shapes that are within the pitch requirement, whereas other embodiments provide the list as each shape with all of other shapes that are within the pitch requirement from the shape.

The process 2600 then retrieves (at 2610) the first shape in the list. The process draws (at 2615) a node in the shape graph corresponding to the shape retrieved (at 2610) above. FIG. 27 illustrates a shape graph 2700 for the region 2500. Taking the first shape retrieved as shape 2515 (this would not necessarily be the case, as shape 2515 might not be the first shape in the list), node 2705 (node "1") would be drawn corresponding to shape 2515.

Next, the process 2600 determines (at 2620) if the retrieved shape is within the pitch requirement from another previously-drawn shape. For example, referring to FIG. 25, shapes 2515 and 2520 are within the pitch requirement 2510. Of course, there is not a previously-drawn shape when the first shape is just drawn. The process 2600 proceeds to 2630 to determine whether there are any unprocessed shapes in the list (e.g., whether there are any more shapes to add to the shape graph). Otherwise, the process 2600 ends. If there are remaining unprocessed shapes, the process 2600 returns to 2610 to retrieve the next shape from the list.

However, if the retrieved shape is not the first shape and there is a previously-drawn shape that is within the pitch requirement from the retrieved shape, the process 2600 draws (at 2625) a line between the nodes corresponding to the retrieved shape and the previously-drawn shape. In reference to the example, if after drawing node 2705, the next retrieved shape is shape 2520 (drawn as node 2715 in FIG. 27), then line 2710 between the two nodes 2705 and 2715 representing the shape 2515 and 2520, respectively, is drawn in the shape graph.

The process 2600 continues in this manner until it has drawn all the nodes and links representing the shapes and their associations. Once the process 2600 determines (at 2630) that all of the shapes have been processed, the process ends. FIG. 27 illustrates the completed shape graph for design layout region 2500, illustrating the connections between the nine shapes 2515-2560 in the design layout region.

One of the ordinary skill in the art will recognize that the process can use a shape graph to determine whether the shapes represented by the shape graph forms a DP loop. That is, the process determines that the design layout includes a DP loop violation when there is a loop formed by an odd number of nodes in a shape graph. As shown in FIG. 27, three nodes 2705, 2715, and 2720 (representing the shapes 2515, 2520, and 2525, respectively) form a loop in the shape graph 2700 and this verifies that the design layout 2500 includes a DP loop.

Returning to process 2400, the process defines a group of shapes based on the shape graphs the process has built at 2410. In some embodiments, the process defines as a group of all DP loop-forming shapes and the shapes that are represented as nodes that are directly or indirectly linked (by lines drawn) to the nodes that represent the DP loop-forming shapes in a shape graph. As shown in FIG. 27, the nodes 2725-2750 are directly or indirectly linked to the nodes 2705, 2715, and 2720 which represent shapes 2515, 2520, and 2525, respectively, that form the DP loop. Nodes 2725-2750 represent shapes 2530-2560. The process 2400 thus defines a group of shapes that includes nine shapes 2515-2560.

B. Segmenting the Shapes

The process 2400 next identifies (at 2415) the critical shape segments ("CSSs") and associates each CSS with a shape ID that represents the geometry which includes the particular CSS. As described above, critical shape segments in some embodiments are portions of a shape that are within the pitch requirement of another shape. As such, the CSS cannot be printed in the same exposure as the shape to which it is too close.

Figure 28:
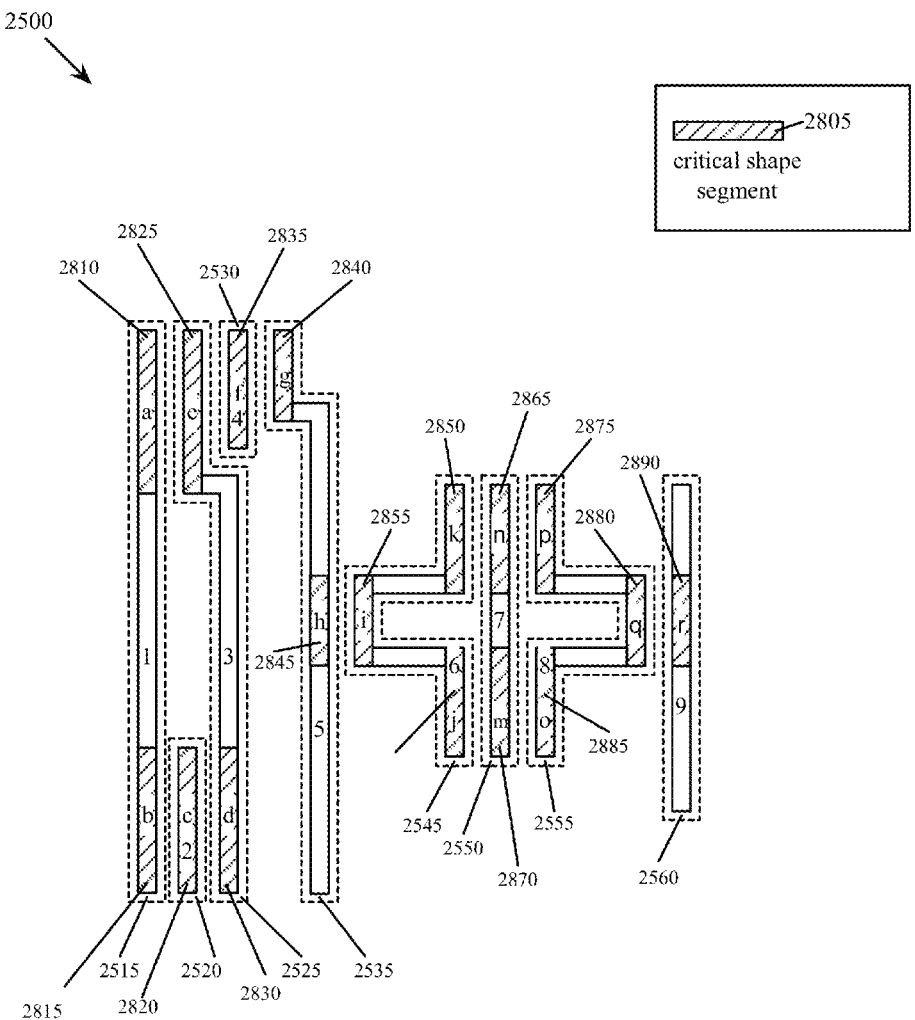
FIG. 28 illustrates several shapes after each critical shape segments (CSS) has been identified and marked as a CSS.

FIG. 28 illustrates the shapes 2515-2560 of FIG. 25 after each CSS has been identified and marked (at 2415) as a CSS 2805. For instance, shape 2560 includes a single CSS 2890 that is within the minimum pitch requirement 2510 from shape 2555 (specifically, the section of shape 2555 indicated by CSS 2880), while the remainder of shape 2560 is not within the minimum pitch requirement of any other shapes, and thus is not marked as a CSS. Likewise, the rest of the CSSs 2810-2890 are identified on the remaining shapes 2515-2555.

As shown in FIG. 28, in some cases a single shape (e.g., 2515) may have multiple CSSs (e.g. 2810 and 2815). In other cases (not shown), a shape may have no CSSs (e.g., no portion of the shape on the target layer is within the minimum pitch requirement of any portion of another shape on the target layer).

In addition to identifying each CSS, the process 2400 associates (at 2415) the shape ID with each CSS, so that the CSS is linked to the shape that includes it. As shown in FIG. 28, for instance, shape 2515 may be designated as shape "1" while CSS 2810 may be designated as CSS "a." The process transfers the shape ID to the CSS ID, such that CSS "a" becomes CSS a[1]. As another example, shape 2520 may be designated as shape "2" while CSSs 2815 and 2820 are designated as CSSs "b" and "c," respectively. Consequently, the process will transfer the shape ID to the CSS IDs, so that CSSs "b" and "c" become b[1] and c[2]. The other CSSs are likewise associated with their respective shape IDs. Some embodiments utilize the CSS for shape mapping in later stages of the decomposition process (e.g., for finding optimal decomposition solutions).

Figure 29:
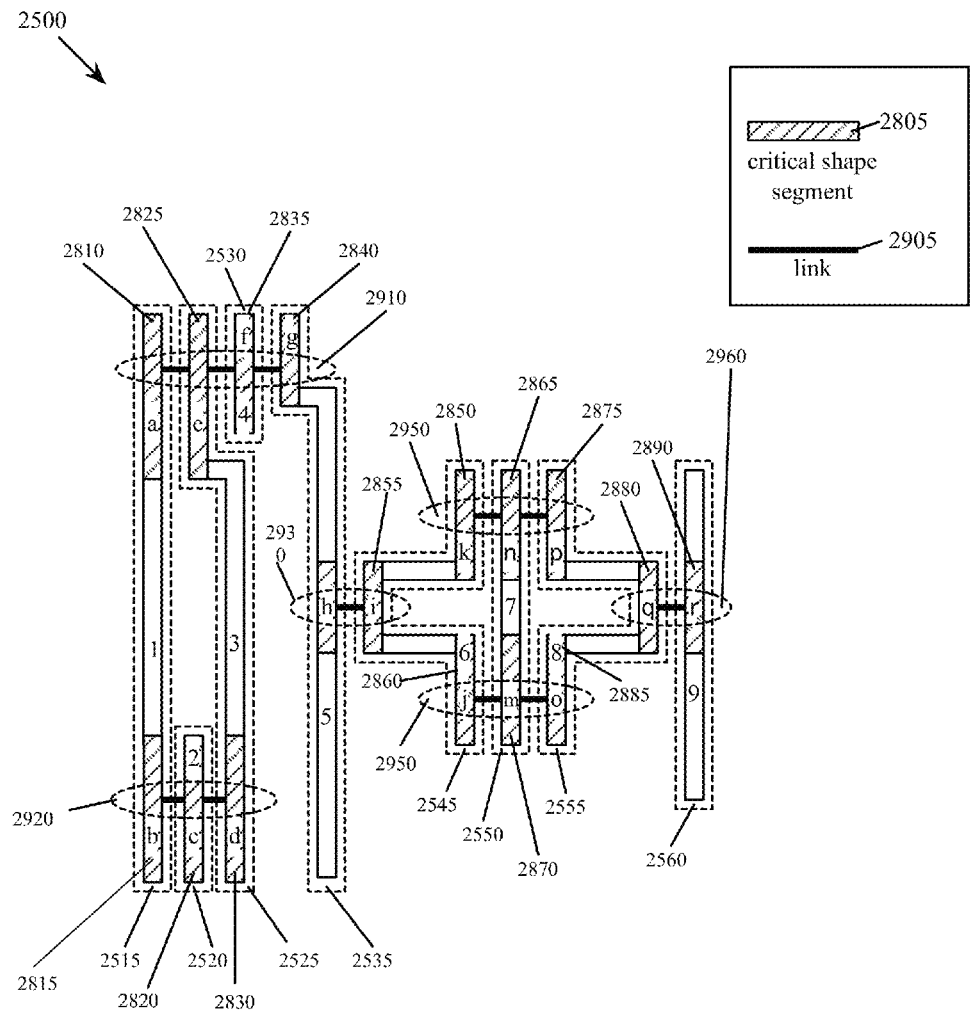
FIG. 29 illustrates several shapes and CSSs after they being associated through a link.

The process next associates (at 2420) CSSs to other CSSs to indicate the associated CSSs will need to have alternate assigned colors (i.e., to be printed during separate exposures). FIG. 29 illustrates the shapes and CSSs from FIGS. 25 and 28 after they have been associated through a link 2905. The link is a virtual or conceptual layer that is not printed on any exposures or placed on any masks. Some embodiments do not use a link, and instead just use pairs of associated CSSs. As shown, links associate CSS 2810 to CSS 2825, CSS 2825 to CSS 2835, and CSS 2835 to CSS 2840. Some embodiments also treat CSSs that are indirectly linked through a combination of the links and other CSSs as linked (e.g. CSS 2810 is associated with CSS 2835 through two links and CSS 2825). Likewise, other links associate the other CSSs 2815, 2820, 2830, and 2845-2890. The dashed ovals 1610-1660 indicate six different sets of associated CSSs.

C. Generating a Segment Graph

Figure 30:
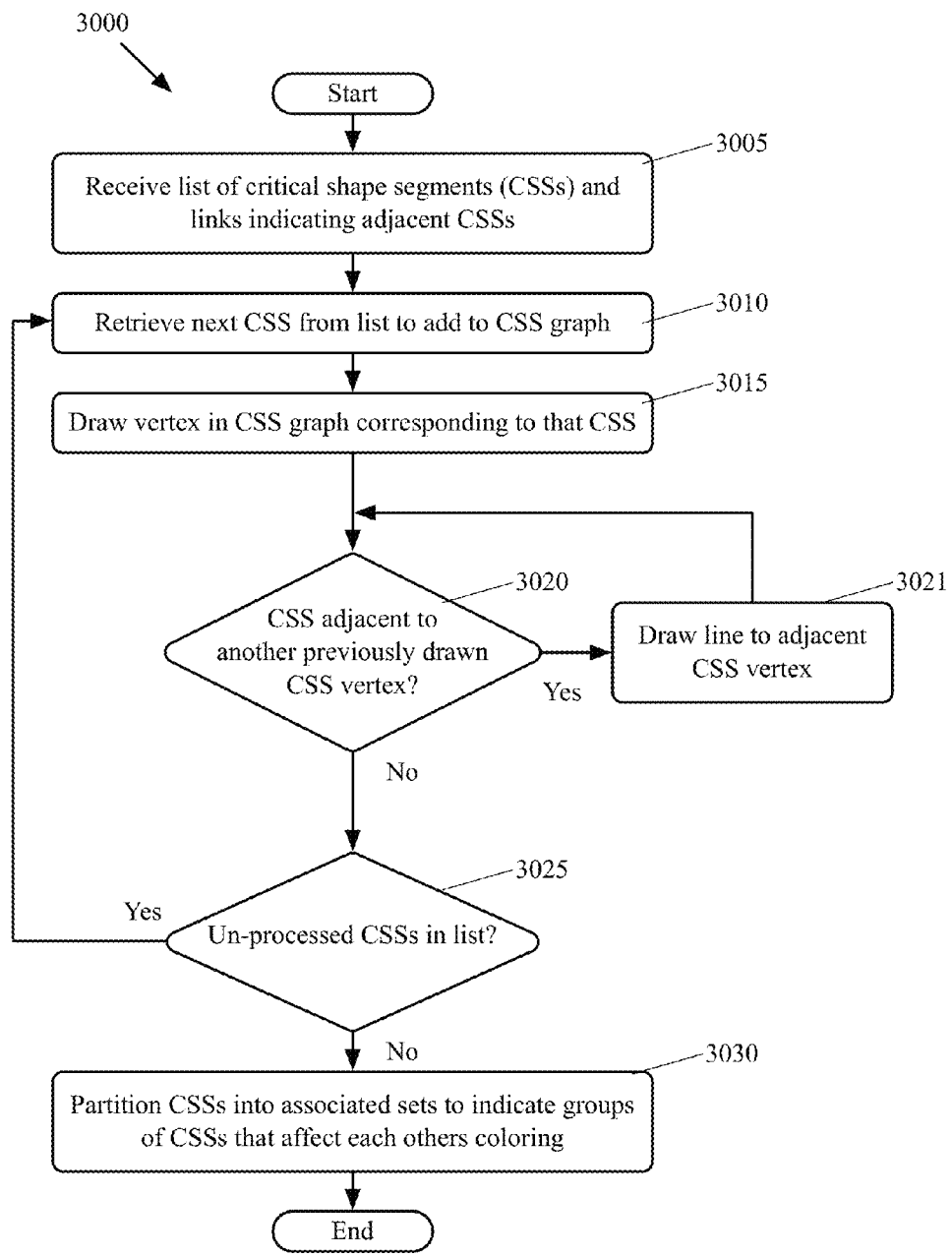
FIG. 30 conceptually illustrates a process of some embodiments for generating and partitioning a CSS graph.

Process 2400 continues (at 2425) by building a CSS graph and partitioning the CSS graph into sub-graphs. Some embodiments use the sub-graphs to verify whether CSSs can have different colors assigned (e.g., sent to two different masks). FIG. 30 conceptually illustrates a process 3000 of some embodiments for generating and partitioning a CSS graph.

Figure 31:
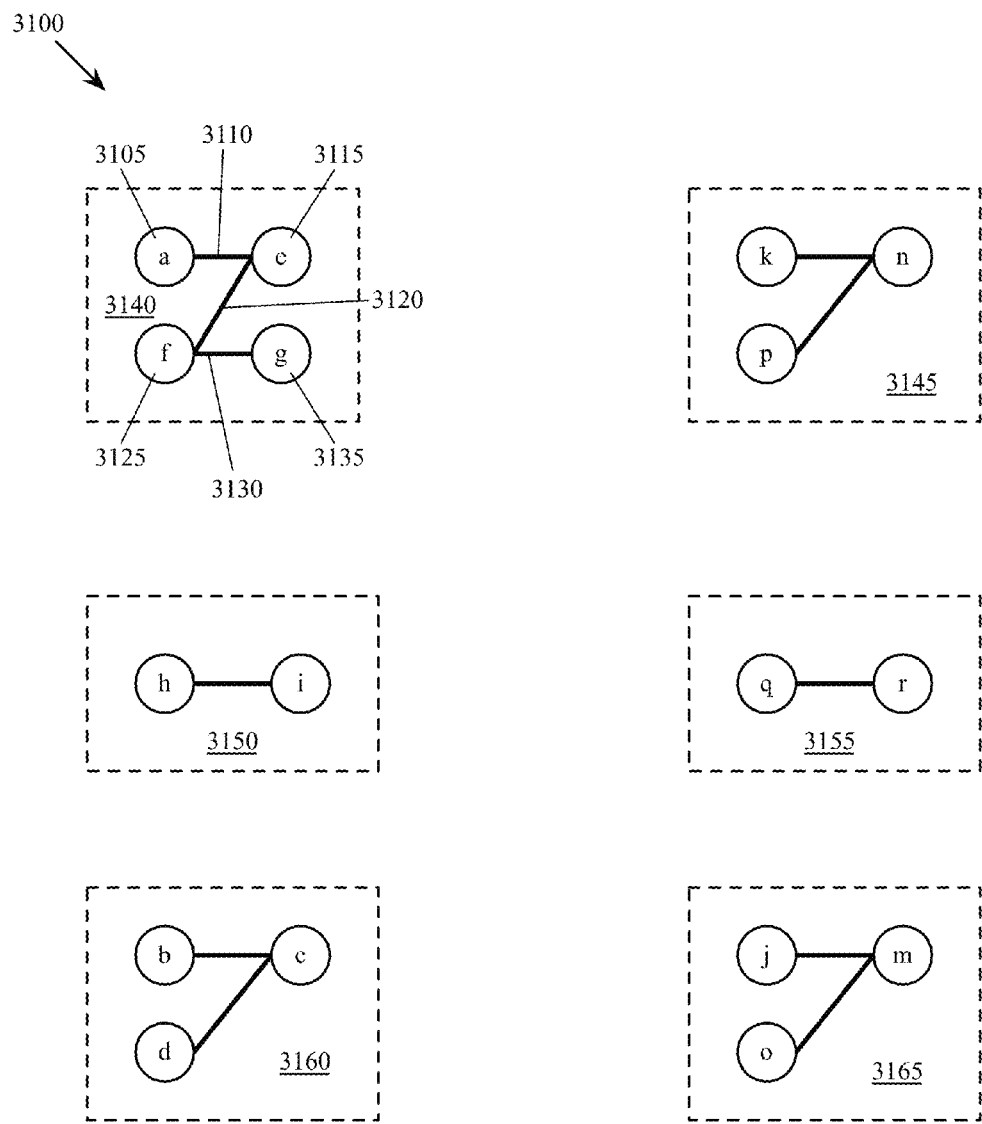
FIG. 31 illustrates a CSS graph drawn based on a design layout region.

FIG. 31 illustrates the CSS graph 3100 drawn based on the example design layout region given above in reference to FIGS. 25-29. Each CSS from the design layout region is a vertex in the CSS graph. Two vertices are "adjacent" if there is a link that touches both of the corresponding CSSs (e.g., if there is a line between the two nodes in the resulting CSS graph). The node names in CSS graph 3100 correspond to the CSSs from design layout region 2500: in this example, the nodes are named "a" to "r" (omitting the letter "1"), with each node name corresponding to one of the CSSs 2810-2890.

As shown, the process 3000 receives (at 3005) a list of CSSs and the links between them. Some embodiments receive this information as a list of CSSs, and for each CSS, all CSSs that are adjacent to that CSS. Other embodiments receive a list of pairs of adjacent CSSs. Still other embodiments receive the information in other forms. The process retrieves (at 3010) a next CSS from the list and draws (at 3015) a node corresponding to that CSS. The first CSS in the example list is CSS 2810, which is designated as node "a" and placed in the CSS graph as node 3105. Some embodiments will not necessarily start at the end of a series of linked CSSs (e.g., CSS 2815 might be the first CSS retrieved from the list).

The process 3000 then determines (at 3020) whether the current CSS is adjacent (e.g., directly connected through a link) to any previously drawn CSS. Some embodiments traverse the list of CSSs to determine whether the current CSS is part of any pairs, whereas other embodiments have a list of all nodes adjacent to the current node. If there are other adjacent previously drawn CSS nodes, the process draws (at 3021) a line (or link) connecting the current CSS node to the previously drawn CSS node. Since the current CSS node is the first drawn node, there are no previously-drawn adjacent CSS nodes. Although CSS 2810 is adjacent to CSS 2825, no line will be drawn the first time because CSS 2825 is not yet drawn into the sub-graph. This line will be drawn later, once a node for CSS 2825 is drawn.

If the current CSS node is adjacent to a previously drawn CSS node, then the process draws (at 3021) a line between the adjacent nodes, and returns to 3020 to determine whether there are any more previously drawn nodes adjacent to the current node.

Once there are no more previously-drawn adjacent CSS nodes, the process 3000 determines (at 3025) whether there are any unprocessed CSSs in the list. If all CSSs have been processed, then the process 3000 proceeds to 3030. When the process 3000 determines (at 3025) that there are more remaining CSSs, the process returns to 3010 to retrieve the next CSS from the list, and adds a node to the graph for the CSS. This CSS is now the current CSS. The process 3000 then repeats operations 3015-3025 for the new current CSS.

In the example, after drawing node 3105, the process would return to select the next CSS (e.g., CSS 2825) as the current CSS, draw the node 3115, and determine whether node 3115 is adjacent to any previously drawn nodes. Node 3115 is adjacent to nodes 3105 and 3125. If only node 3105 is already drawn, then only the line between nodes 3105 and 3115 would be drawn at that time. Some embodiments do not necessarily take a continuous path through the CSSs, so after drawing node 3105, the next CSS selected might not be adjacent to CSS 2810 (e.g., CSS 2870). Eventually, after processing all of the CSSs, all the nodes of the CSS graph would be drawn, as would all edges indicating the adjacent CSSs.

When all CSSs have been added to the CSS graph 3100, the process 3000 partitions (at 3030) the associated CSSs into sub-graphs by identifying sets of linked CSS nodes as sub-graphs. In other words, each sub-graph includes a set of CSS nodes that are directly or indirectly linked to each other. The CSS nodes in a first sub-graph may not be linked to any CSS nodes in another sub-graph. Thus, in the example shown in FIG. 31, the CSS graph 3100 is partitioned into six sub-graphs 3140-3165.

While the process 3000 illustrates one example of a process to generate a CSS graph, one of ordinary skill in the art will recognize that other processes may be used to generate a CSS graph. For example, some embodiments may initially order the CSSs, making the generation of the CSS graph less computationally intensive. Furthermore, one of ordinary skill in the art will recognize that the CSS graph generation (and partitioning of the CSS graph into sub-graphs) may occur at different times within the overall process of resolving a DP loop.

D. Determining Unresolvable DP Loop Violations

Figure 32:
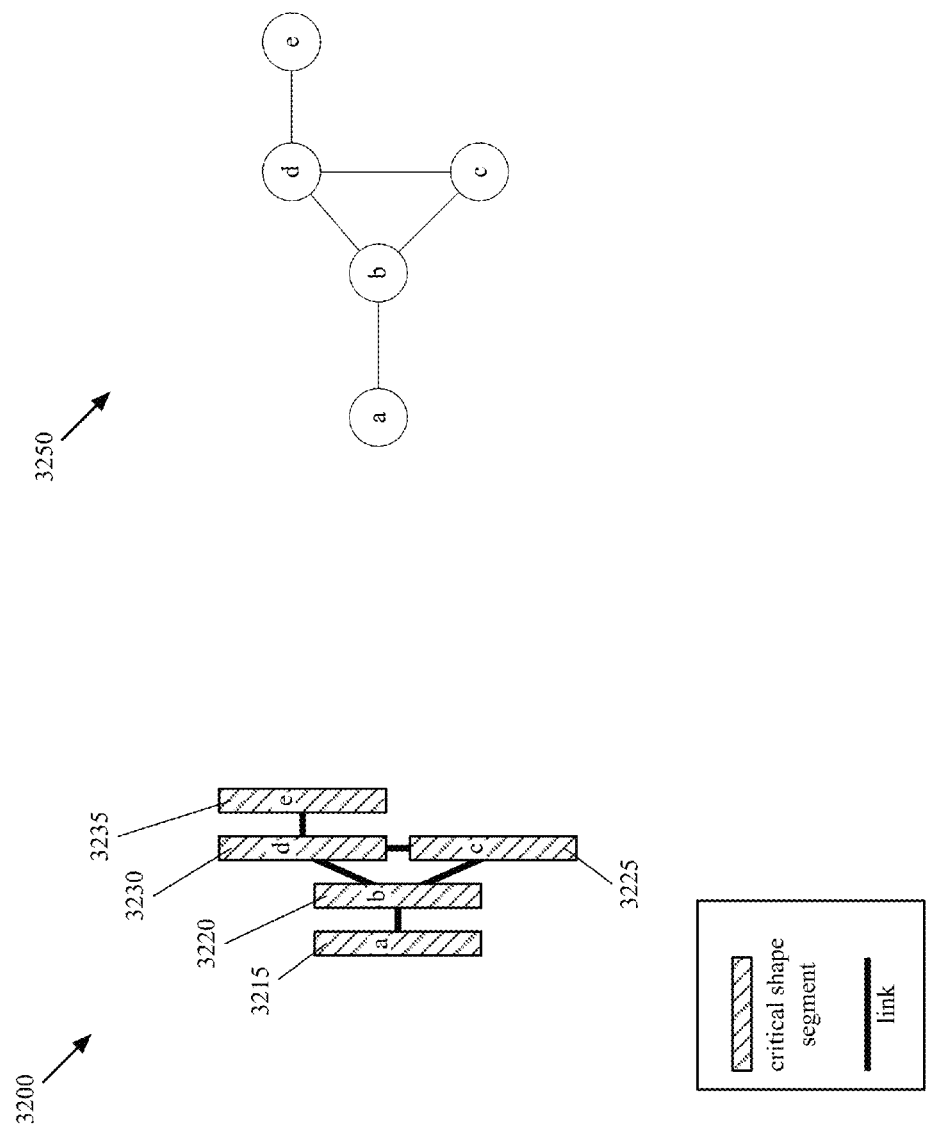
FIG. 32 illustrates an example of a design layout region that includes a DP loop violation that is not resolvable by introducing splicing graphs.

The process 2400 next determines (at 2430) whether the DP loop violation is unresolvable by way of introducing splicing graphs. In some embodiments, the process uses CSS graphs to determine whether the DP loop violation is resolvable. FIG. 32 illustrates an example of a design layout region 3200 that includes a DP loop violation that is not resolvable by introducing splicing graphs. As shown, the design layout region 3200 is composed completely of the CSSs and the links. The example design layout region 3200 includes five shapes 3215-3235. Each of the shapes 3215-3235 is also a single CSS, corresponding to a single node in a CSS graph. FIG. 32 illustrates a sub-graph 3250 corresponding to the design layout region 3200. The sub-graph (which is also a complete CSS graph for the design layout region 3200) includes five nodes "a" to "e," which correspond to the five shapes 3215-3235 in some embodiments.

In some embodiments, the process determines that the DP loop violation is not resolvable by way of introducing splicing graphs when the CSS graph includes a loop formed by an odd number of nodes. As described above, a CSS is a portion of a shape that must be sent to a different mask than its neighboring CSS. A shape is segmented into one or more CSSs in order to introduce splicing graphs between them. Thus, a CSS may not be further split or segmented (i.e., a single CSS may not have two assigned colors). A loop formed by an odd number of CSSs, therefore, indicates that the DP loop formed by the shapes that include these loop-forming CSSs cannot be resolved by introducing splicing graphs. As shown in FIG. 32, there is a loop formed by three nodes "b", "c", and "d" which correspond to the CSSs 3220, 3225, and 3230. The process accordingly determines that the DP loop formed by the three shapes is not resolvable. In contrast, the DP loop formed by the shapes 2515, 2520, and 2525 shown in FIG. 29 is resolvable because the sub-graph representing the CSS of these three shapes includes a loop as shown in FIG. 31.

When the process 2400 determines (at 2430) that the DP loop violation is resolvable, the process proceeds to 2440, which will be described below. Otherwise, the process reports (at 2435) that the DP loop violation is not resolvable by introducing splicing graphs. In some embodiments, the process 2400 attempts to resolve the DP loop violation by moving the shapes in the design layout as described in Section II above.

Figure 33:
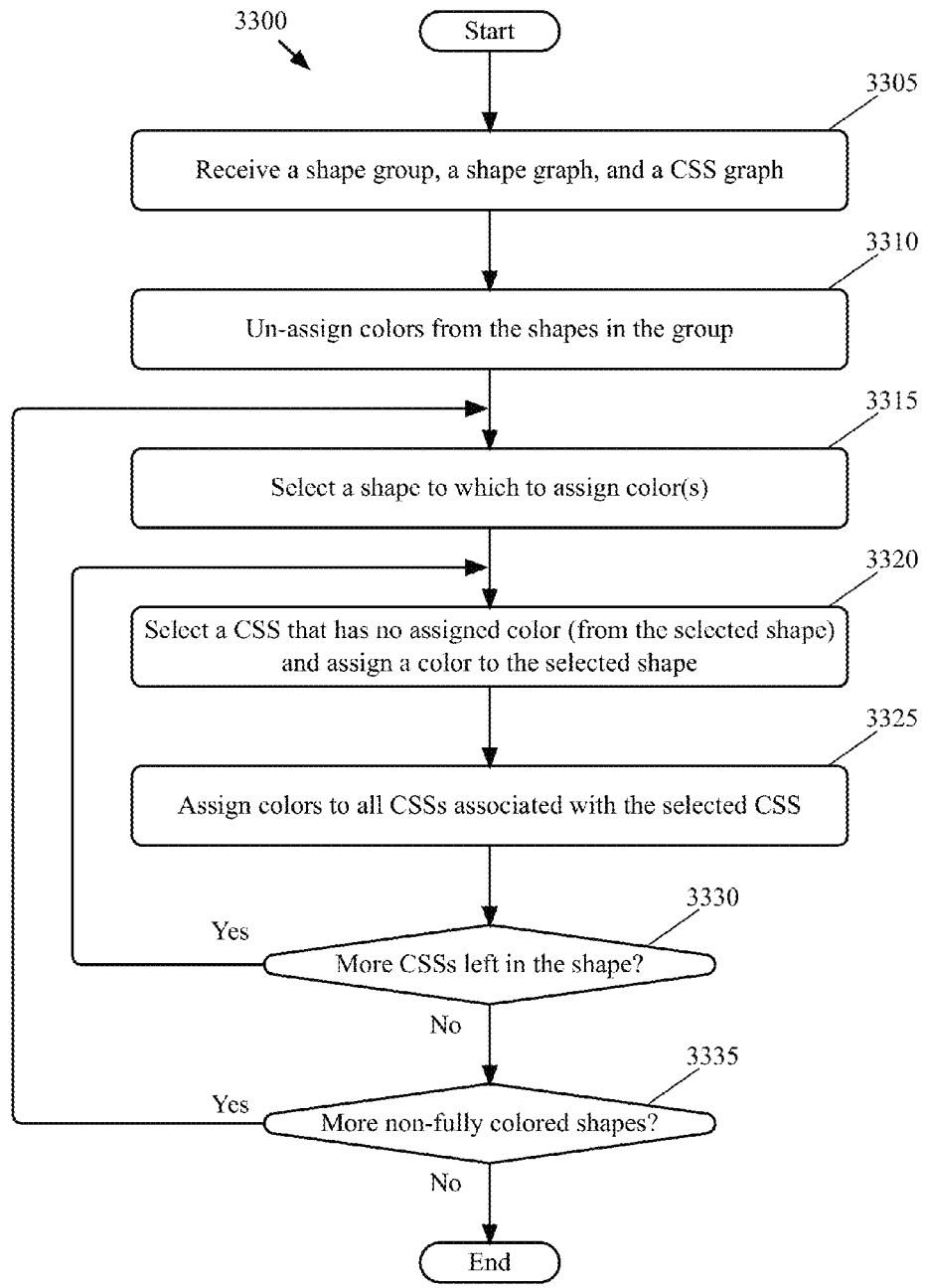
FIG. 33 conceptually illustrates a process performed by some embodiments to color shapes in a design layout.

E. Minimizing the Number of Splicing Graphs while Assigning Colors to Shapes The process 2400 next introduces (at 2440) a minimum number of splicing graphs in the shapes of the defined group. The process 2400 in some embodiments performs a coloring process to minimize the number of splicing graphs to introduce while assigning colors to shapes. FIG. 33 conceptually illustrates a coloring process 3300 for some embodiments.

The process 3300 begins by receiving (at 3305) a group of shapes, CSSs, and links for a design layout that includes the DP loop. In some embodiments, the group of shapes, CSSs, and links is an unordered roster of the shapes that are in the defined group with a list of the CSSs and links for each shape. As described above, this group of shapes includes DP loop forming shapes and the shapes associated with the DP loop-forming shapes. For instance, the process might receive the shapes, CSSs, and links for the defined group that includes nine shapes 2515-2560, in design layout 2500, along with CSS sub-graphs 3140-3165 and the shape graph 2700 that includes nodes that represent the nine shapes. The process 3300 then un-assigns (at 3310) colors from the shapes in the defined group if any of the shapes has assigned colors already.

Next, the process 3300 selects (at 3315) a shape in the group based on certain criteria and selects the shape on top of the order. The criteria in some embodiments include (1) a number of CSSs included in a shape (2) a number of splicing graphs that a shape has so far (3) whether a shape is partially colored, etc. This selection operation is described in detail by reference to FIG. 34 below. When the process 3300 has not selected and colored any shape yet, the process initially selects a shape that is represented by a node in the shape graph that has the least number of links. For instance, the process would select node 5 of the shape graph 2700.

At 3320, the process 3300 selects a CSS that does not have an assigned color and assigns a color to the selected shape. When the selected shape is the first shape of the group that the process has selected, the process can select any CSS of the selected shape and assigns one of the two available colors. When the selected shape is not the first shape of the group that the process has selected, the process selects a CSS that is next to a CSS that has an assigned color. The process assigns the same color to the selected CSS to avoid introducing an unnecessary splicing graph.

The process 3300 then assigns (at 3330) colors to all CSSs that are associated with the selected CSS. As described above by reference to FIG. 29, CSSs are associated when they are directly or indirectly linked. Thus, in some embodiments, the process identifies the CSSs that are associated with the selected CSS using a CSS sub-graph that includes a node representing the selected CSS. For instance, if the process had selected CSS 2845 shown in FIG. 29 to color, the process would identify CSSs 2810, 2825, and 2835 as the CSSs associated to CSS 2845 using CSS sub-graph 3140 shown in FIG. 31. The process then assigns colors to these associated CSSs by alternating colors so that a neighboring pair of CSSs does not have the same color. For instance, if the process had assigned a first color to CSS 2845, the process would assign a second color to CSSs 2810 and 2835 and assign the first color to CSS 2825.

Next, the process 3300 determines (at 3330) whether there are more CSSs of the selected shape that do not have an assigned color yet. When there are such CSSs left, the process goes back to 3320 to select a next CSS to assign a color.

When the process 3300 determines (at 3330) that there are no more CSSs of the selected shape that do not have an assigned color yet, the process 3300 determines (at 3335) whether there are more shapes of the group that have not been fully colored (e.g., whether there are more shapes of the group that have CSSs that do not have an assigned color). When there are such shapes left, the process goes back to 3315 to select a next shape from the remaining shapes of the group that have not been fully colored.

A more detailed example of performing this coloring process will be described further below by reference to FIGS. 35A-B. Also, it is to be noted that the coloring process 3300 in some embodiments does not have to use CSS sub-graphs or shape graphs. That is, the process in these embodiments finds the associations among CSSs and shapes and utilizes the associations to minimize the number of splicing graphs to introduce while assigning colors to the shapes and CSSs of the shapes. Moreover, one of the ordinary skill in the art would recognize that the coloring process 3300 is capable of resolving a situation when two or more DP loops are formed by in a single group of associated shapes.

Figure 34:
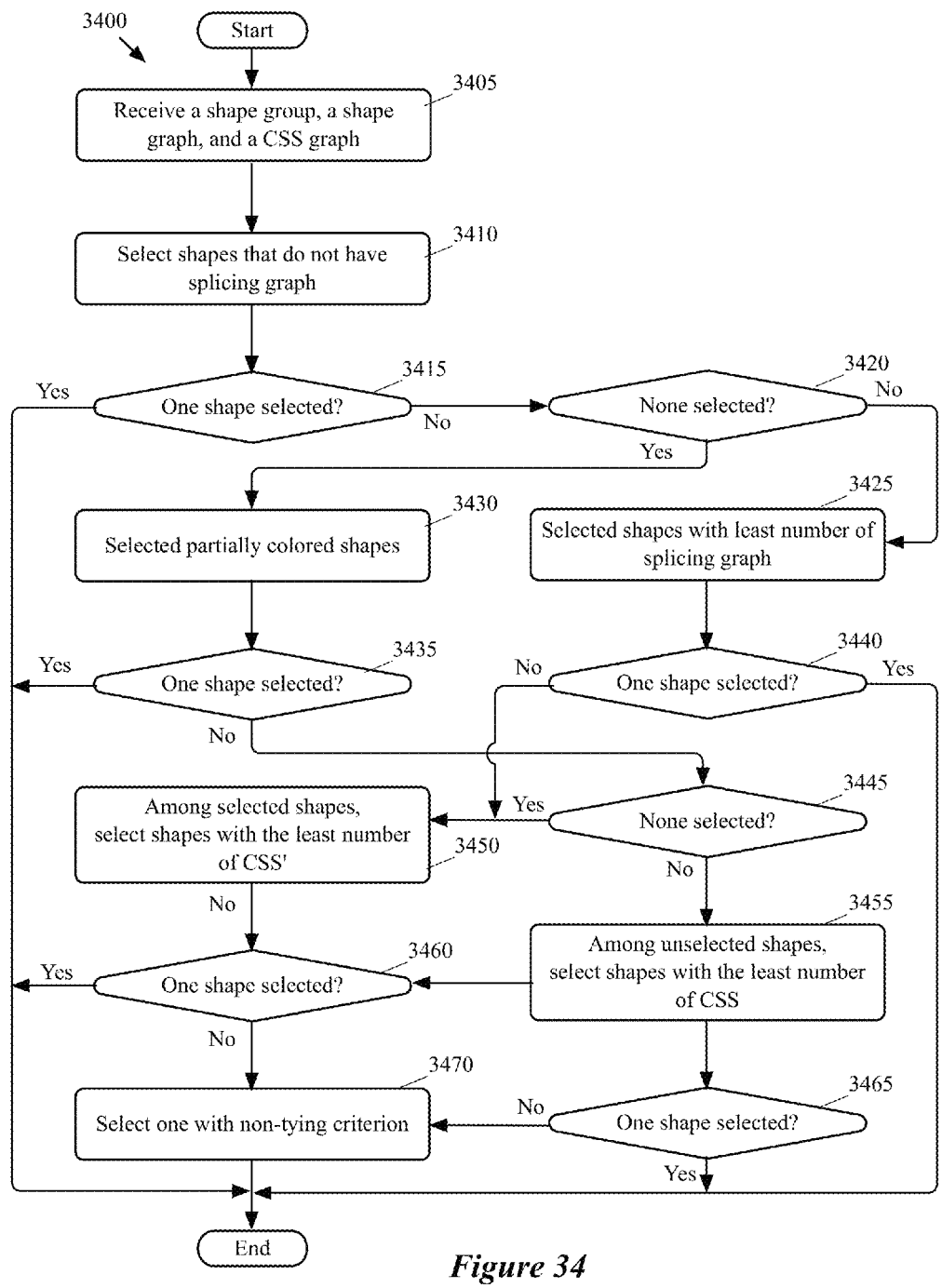
FIG. 34 conceptually illustrates a process performed by some embodiments to select a shape of a defined group to assign color(s).

FIG. 34 conceptually illustrates a process 3400 performed by some embodiments to select a shape of a defined group to assign color(s). The process 3400 begins by receiving (at 3405) a group of shapes, CSSs, and links for a design layout that includes a DP loop. The group of shapes includes shapes that form the DP loop and shapes that are associated with the DP loop-forming shapes as described above. These shapes are being colored by the coloring process 3300 described above. The process 3400 receives shapes that are not colored or partially colored. That is, some or all of CSSs of each received shape do not have an assigned color yet.

Next, the process 3400 selects (at 3410) shapes that do not have a splicing graph (e.g., shapes that do not have assigned colors or have a uniform assigned color). The process then determines (at 3415) whether only one shape is selected. That is, the process determines whether there is only one shape that does not have a splicing graph. If so, the process is done with selection of a shape and the process ends. Otherwise, the process proceeds to 3420 to determine whether none of the received shapes is selected (e.g., whether there is no received shape that has a splicing graph or there are two or more received shapes that have a splicing graph).

When the process determines (at 3420) that there are two more received shapes that have a splicing graph, the process proceeds to 3425, which will be described further below. When the process determines (at 3420) that there is no received shape that has a splicing graph, the process selects received shapes that are partially colored (e.g., the process selects received shapes that have CSSs that do not have an assigned color).

Next, the process 3400 determines (at 3435) whether only one such shape is selected (e.g., whether there is only one received shape with no splicing graphs that is partially colored). When only one such shape is selected (i.e., when the number of partially colored shapes among the shapes with no splicing graphs is one), the process is done with shape selection and the process ends. Otherwise, the process determines (at 3445) whether none of such shapes are selected (e.g., whether none of the received shapes with no splicing graphs is partially colored or two or more received shapes with no splicing graphs are partially colored).

When the process 3400 determines (at 3445) that none of the received shapes with no splicing graphs is partially colored (i.e., all received shapes with no splicing graphs are not colored), the process 3400 proceeds to 3455, which will be described further below. When the process 3400 determines (at 3445) that two or more received shapes with no splicing graphs are partially colored, the process selects (at 3450) shapes with the least number of CSSs.

The process 3400 then determines (at 3460) whether only one such shape is selected (i.e., whether there is only one received shape with no splicing graphs that has the least number of CSSs). When only one such shape is selected, the process is done with selection of a shape and the process ends. Otherwise, the process proceeds to 3470 to select a shape based on a non-tying criterion. For instance, the process randomly selects one of the selected shapes. The shape that the process selects thus has the least number of CSSs and no splicing graphs. The process ends then.

When the process determines (at 3445) that all received shapes with no splicing graphs are not colored, the process selects (at 3455) shapes that have the least number of CSSs. That is, the process selects the shapes with the least number of CSSs among the received shapes that have no splicing graphs and have no CSSs that have an assigned color. The process then determines (at 3465) whether one such shape is selected. If so, the process is done with selection of a shape and the process ends. Otherwise, the process proceeds to 3470 to select a shape based on a non-tying criterion. That is, the process selects (at 3470) a shape among the received shapes that has (1) no splicing graphs, (2) no CSSs that have an assigned color, and (3) the least number of CSSs.

When the process determines (at 3420) that there are two more received shapes that have a splicing graph, the process selects shapes with least number of splicing graphs. That is, the process selects shapes that have assigned colors that alternate the least number of times. The process then determines (at 3440) whether one such shape is selected. If so, the process is done with selection of a shape and the process ends. Otherwise, the process proceeds to 3450 to select shapes with the least number of CSSs among the received shapes that has least number of splicing graphs.

The process 3400 then determines (at 3460) whether only one such shape is selected (i.e., whether there is only one received shape with the least number of splicing graphs that has the least number of CSSs). When only one such shape is selected, the process is done with selection of a shape and the process ends. Otherwise, the process proceeds to 3470 to select a shape based on a non-tying criterion. That is, the process selects (at 3470) a shape among the received shapes with the least number of splicing graphs that have the least number of CSSs). The process 3400 then ends.

Finally, the process 2400 outputs (at 2445) the results (i.e., the design layout with one or more splicing graphs that resolve the DP loop violation) as a set of data that is used to produce multiple masks for fabricating the design layout region.

F. Detailed Example

Figures 35, 35A, 35B:
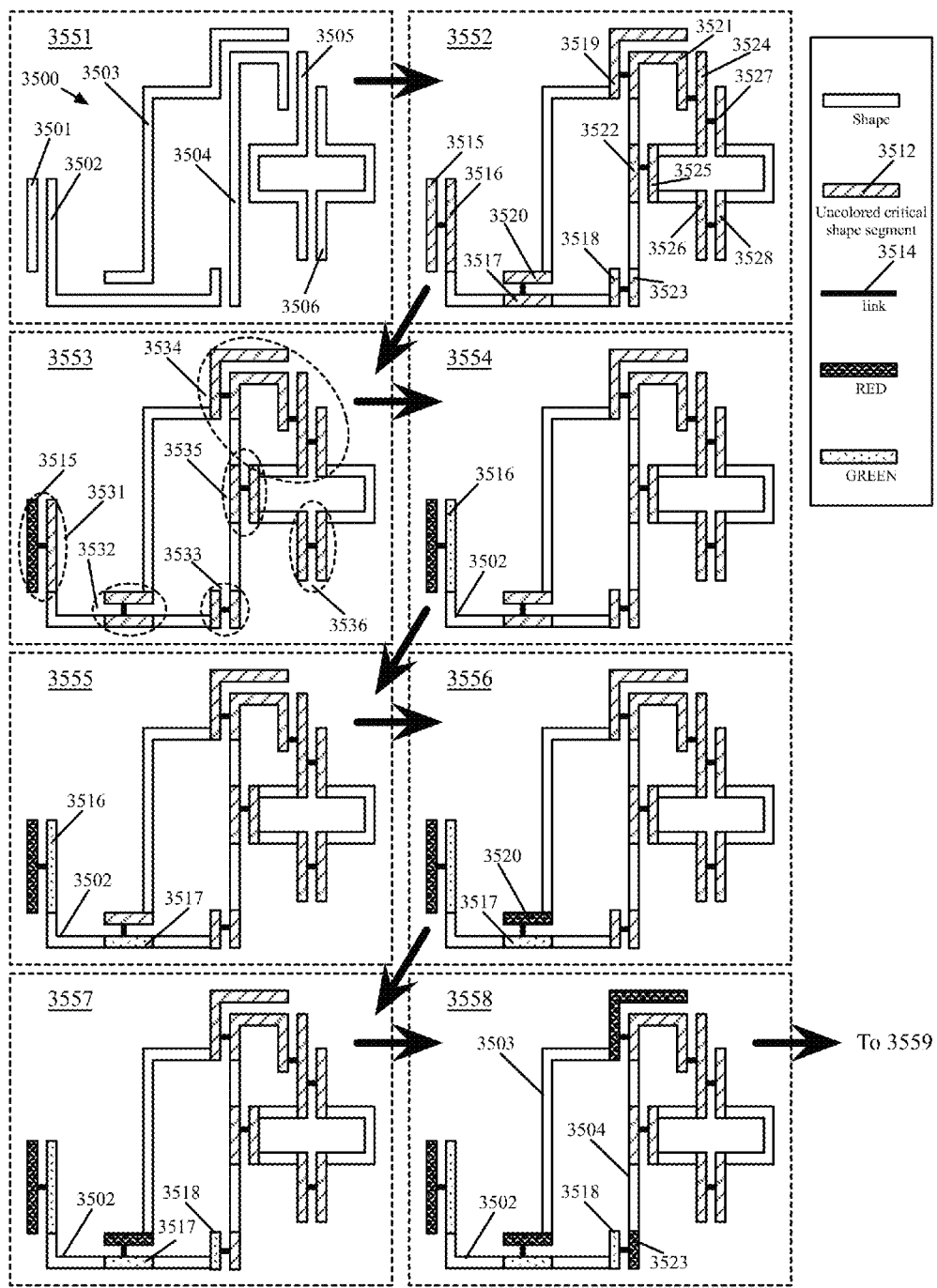
FIGS. 35A and 35B illustrate an example of introducing splicing graphs to shapes in a layer of a design layout in order to resolve a DP loop violation.
Figure 35B:
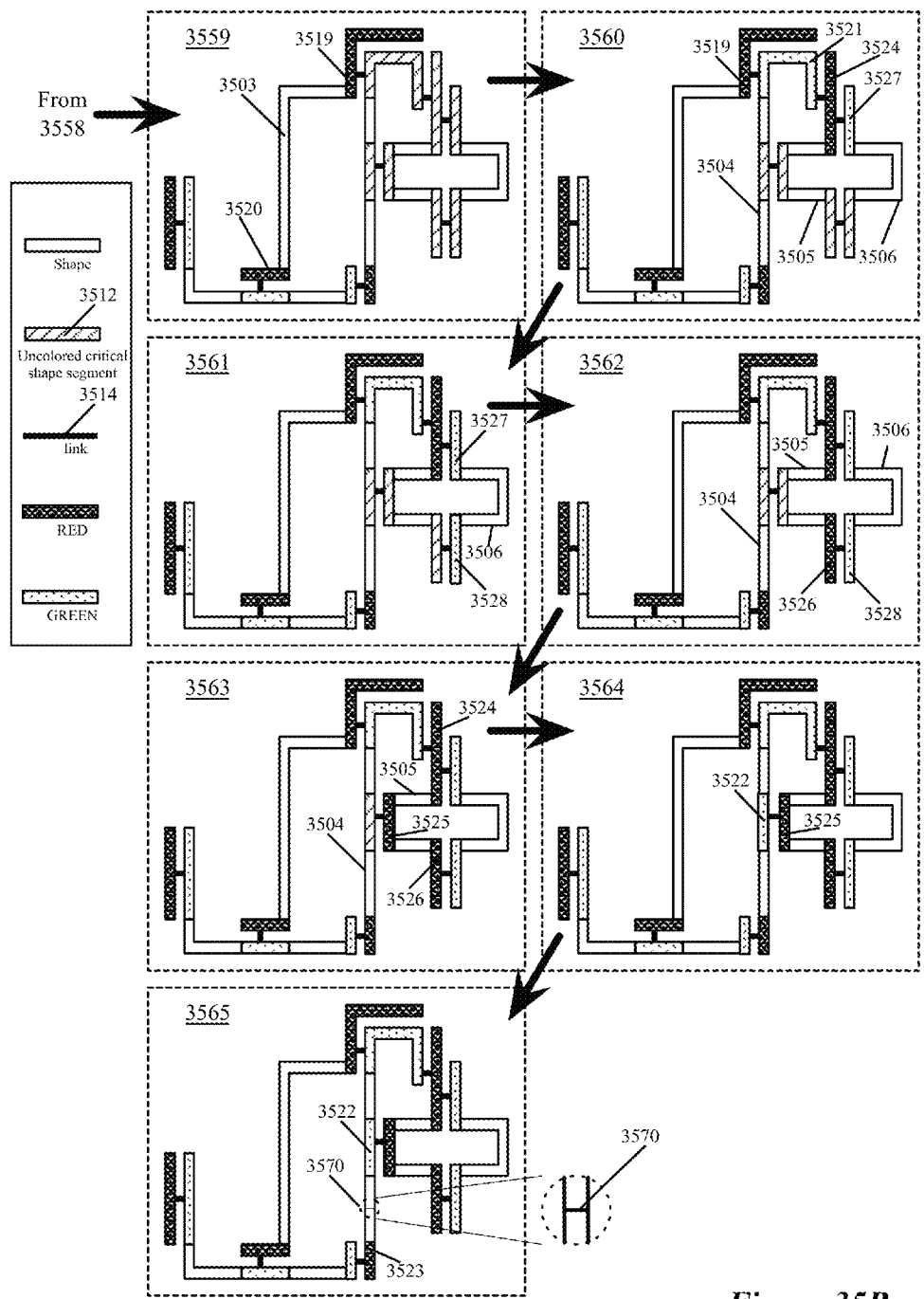

FIGS. 35A and 35B illustrate a detailed example of introducing splicing graphs to shapes in a layer of a design layout 3500 in order to resolve a DP loop violation. Specifically, this figure illustrates in fifteen different stages 3551-3565 that a DP loop violation committed by three shapes 3502, 3503, and 3504 is resolved by introducing a splicing graph in shape 3504. The design layout 3500 includes shapes 3501-3506.

Stage 3551 shows that the shapes 3501-3506 do not have assigned colors. In some cases, no colors have been assigned to these six shapes. In other cases, the colors are unassigned from these six shapes. These six shapes belong to a defined group because these shapes include three DP loop-forming shapes 3502-3504 and the shapes 3501, 3505, and 3506 that are associated with the DP loop-forming shapes.

Stage 3552 shows that CSSs are determined and marked. These CSSs are also associated and linked based on their relationships. These associations between these CSSs are shown through the use of the links 3514. As shown, the shapes 3501-3506 include fourteen identified CSSs 3515-3528, and six associated sets of CSSs. Stage 3553 shows the six associated sets 3531-3536.

Also shown in stage 3553, the first shape 3501 (i.e. the shape with the fewest CSSs) has its single CSS 3515 colored red (i.e., it is assigned to the red exposure). For the purpose of description, it is assumed that red and green are the two colors available to assign to shapes in the design layout. In some embodiments this assignment is a random choice, and in some embodiments there is a default color. The shape 3501 is the first shape selected to have an assigned color because this shape has the least number of links (e.g., 1) among the six shapes 3501-3506 in the group.

Stage 3554 shows that CSS 3516 is colored next. This is because CSS 3516 is associated with CSS 3515 (i.e., CSS 3516 is in the same CSS sub-graph (not shown) as CSS 3515). At Stage 3554, coloring the shape 3501 is done because all CSSs of the shape as well as all CSSs associated with the CSSs of the shape 3501 have an assigned color. The next shape to be colored is the shape 3502 because it is the only partially colored shape among the remaining shapes to be colored.

Stage 3555 shows that CSS 3517 is next colored. This is because CSS 3517 is next to CSS 3516 that has already been colored within the shape being colored (i.e., the shape 3502). As shown, CSS 3517 is colored green because it is the color that is assigned to CSS 3516. As described above, some embodiments assign the same color to CSSs in one shape to avoid introducing splicing graphs whenever possible. Next, stage 3556 shows that CSS 3520 is colored next because CSS 3520 is associated with CSS 3517. CSS 3520 is colored red because the neighboring CSS 317 has been colored green.

Stage 3557 shows that CSS 3518 is colored next because it is the remaining CSS of the shape 3502 that is being colored. CSS 3518 is colored green, which is the same color that is assigned to the other CSSs (i.e., CSSs 3516 and 3517). Stage 3558 shows that CSS 3523 is colored next because CSS 3523 is associated with CSS 3518 of the shape 3502 that is being colored. At stage 3558, coloring the shape 3502 is done because all CSSs of the shape as well as all CSSs associated with the CSSs of the shape 3502 have an assigned color. The next shape to be colored is the shape 3503 because the shape 3503 is one of two partially colored shapes (i.e., the shapes 3503 and 3504) among the remaining shapes to be colored and the shape 3503 has less number (i.e., 2) of CSSs than the shape 3504 does (i.e., 3).

Stage 3559 shows that CSS 3519 is colored next because it is the remaining CSS of the shape 3503 that is being colored. CSS 3519 is colored red which is the same color assigned to the CSS 3520 of the same shape 3503. Stage 3560 shows that CSSs 3521, 3524, and 3527 are colored next because these three CSSs are associated with CSS 3519 of the shape 3503 that is being colored. CSSs 3521, 3524, and 3527 are colored green, red, and green, respectively, because these three CSSs and CSS 3519 are neighboring CSSs that have to alternate colors. At stage 3560, coloring the shape 3503 is done because all CSSs of the shape as well as all CSSs associated with the CSSs of the shape 3503 have an assigned color. There remain three shapes to be colored. They are the shapes 3504, 3505, and 3506. The shape 3504 has a splicing graph already because it has two different colors assigned to two of the CSSs it includes. The shape 3505 has three CSSs while the shape 3506 has two CSSs. Therefore, the next shape to be colored is the shape 3506.

Stage 3561 shows that CSS 3528 is colored next because CSS 3528 is the remaining CSS of the shape 3506 that is being colored. CSS 3528 is colored green which is the same color assigned to the CSS 3527 of the same shape 3506. Stage 3562 shows that CSS 3526 is colored next because CSS 3526 is associated with CSS 3528 of the shape 3506 that is being colored. CSS 3526 is colored red because the neighboring CSS 3528 has been colored green. At stage 35062, coloring the shape 3506 is done because all CSSs of the shape as well as all CSSs associated with the CSSs of the shape 3506 have an assigned color. The remaining two shapes to be colored are the shapes 3504 and 3505. The next shape to be colored is the shape 3505 because the shape 3504 already has a splicing graph and the shape 3505 does not.

Stage 3563 shows that CSS 3525 is colored next because CSS 3525 is the remaining CSS of the shape 3505 that is being colored. CSS 3525 is colored red because the other CSSs (i.e., CSSs 3524 and 3526) of the same shape 3505 are colored red. Stage 3564 shows that CSS 3522 is colored next because CSS 3522 is associated with CSS 3525 of the shape 3505 that is being colored. CSS 3522 is colored green because the neighboring CSS 3525 is colored red.

At stage 3563, coloring the shape 3505 is done because all CSSs of the shape as well as all CSSs associated with the CSSs of the shape 3505 have an assigned color. Moreover, since all CSSs of all shapes including shape 3504 are colored, the coloring process for this group of six shapes is completed. As a result, one splicing graph 3570 is introduced in the shape 3504 between CSSs at stage 3565. As shown, the splicing graph 3570 is a straight line. However, the splicing graph may also be non-straight line based on which the shape 3504 is divided.

Figure 36:
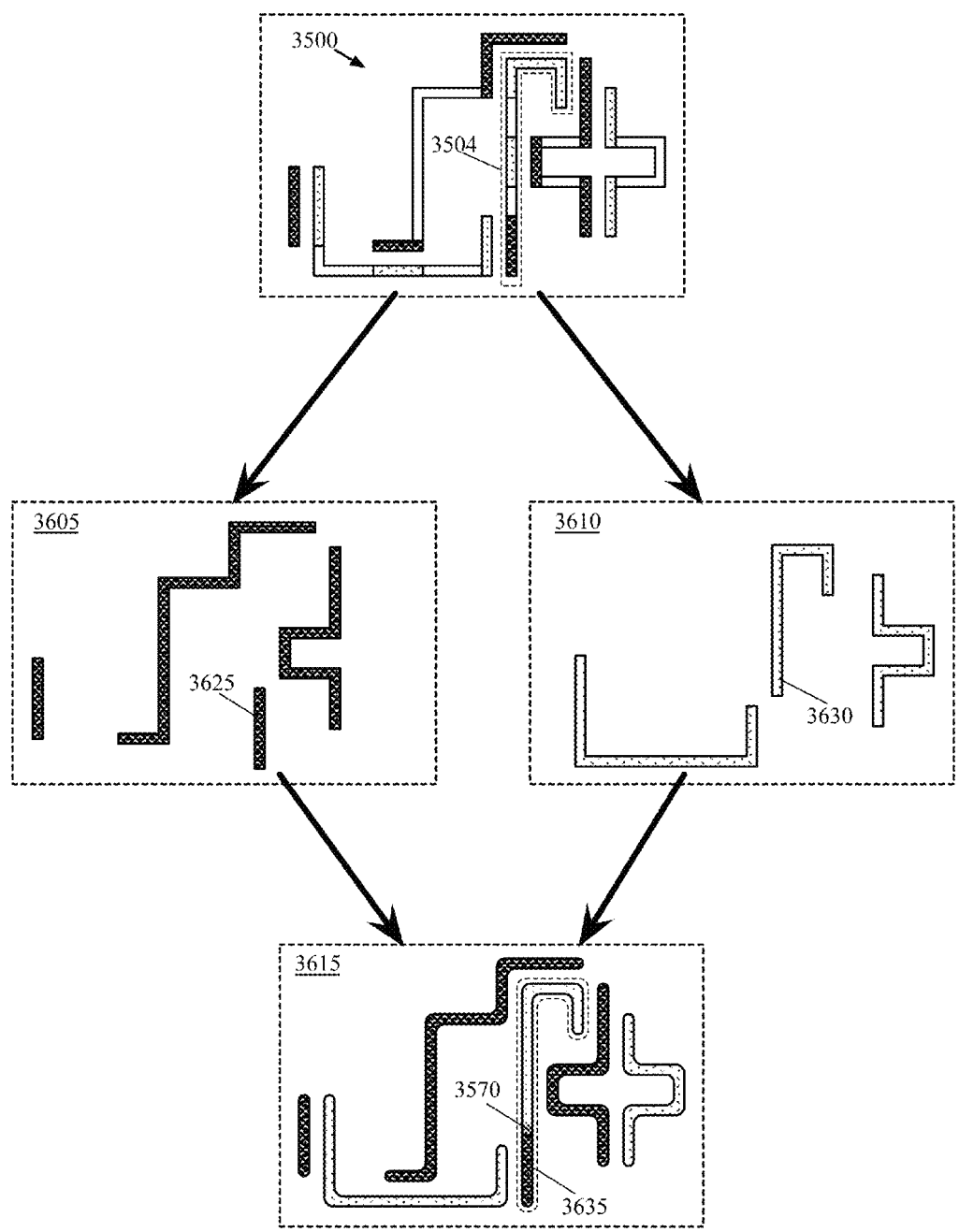
FIG. 36 illustrates result of coloring a design layout for resolving the DP loop violation.

FIG. 36 illustrates the result of coloring the design layout 3500 from FIGS. 35A-B for resolving the DP loop violation the design layout has. As described above, the shape 3504 is to be split between two exposures. FIG. 36 also illustrates resulted data defining two mask layouts 3605 and 3610 for fabricating the design layout 3500. Mask layout 3605 defines the first (red) exposure, and includes a shape 3625 that makes up part of the shape 3504. Mask layout 3610 defines the second (green) exposure, and includes a shape 3630 that makes up the remaining part of the shape 3504. In other words, mask layout shapes 3625 and 3630 collectively define the design layout shape 3504.

Lastly, FIG. 36 illustrates a region of a fabricated IC corresponding to design layout region 3504. Mask layout shapes 3625 and 3630 are printed in different exposures so as to form shape 3635 on the fabricated IC. Shape 3635 includes the splicing graph 3570 around which the two portions of shape 3635 that are printed in different exposures overlap.

G. Architecture

Figure 37:
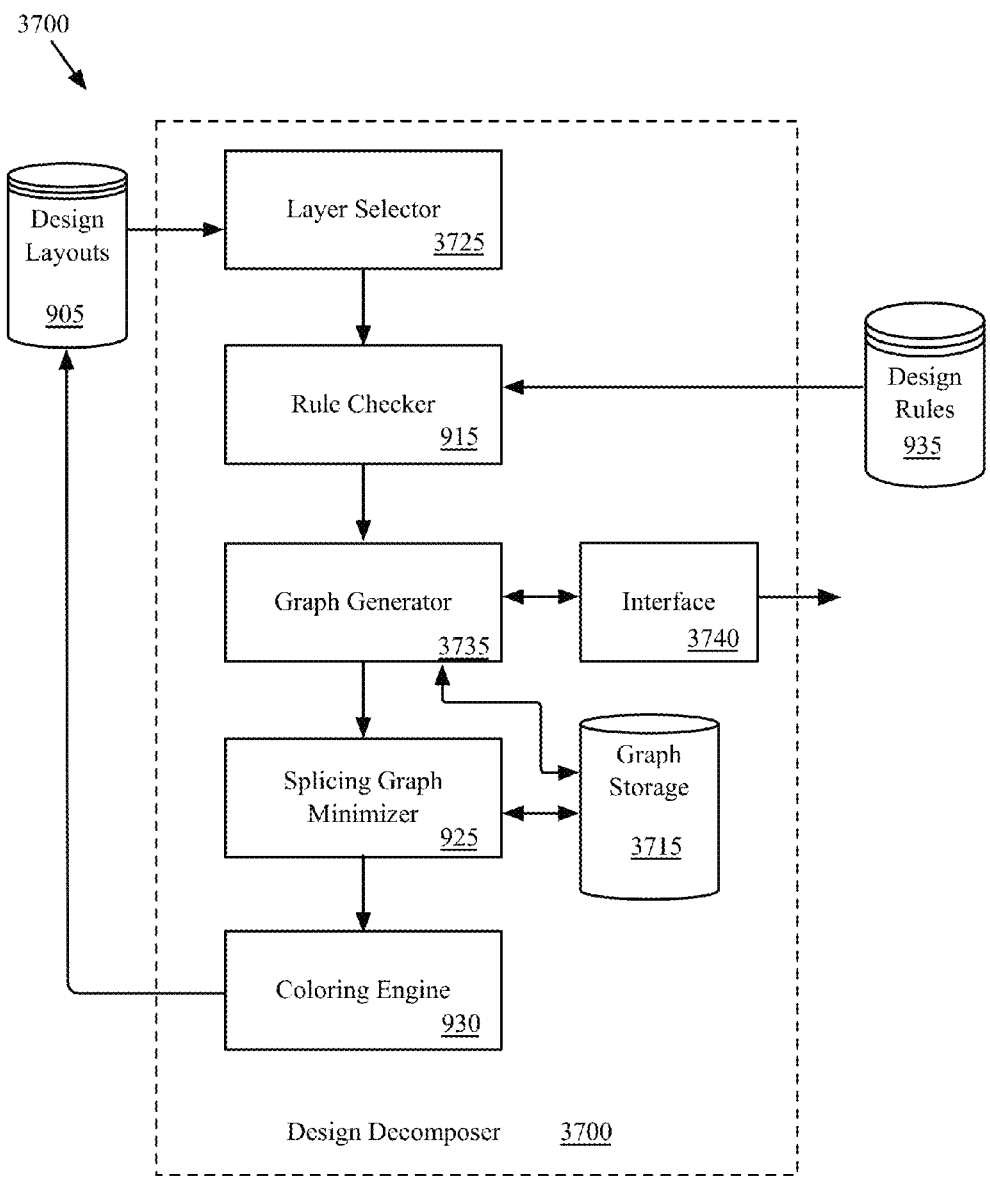
FIG. 37 conceptually illustrates architecture of a design decomposer of some embodiments that resolves DP loop violation by introducing a minimal number of splicing graphs to the shapes.

FIG. 37 conceptually illustrates an example architecture of a design decomposer 3700 of some embodiments that resolves DP loop violation by introducing a minimal number of splicing graphs to the shapes. In some embodiments, the design decomposer 3700 is a stand-alone application, while in other embodiments the design decomposer might be integrated into another application, and in yet other embodiments the design decomposer might be implemented within an operating system.

The design decomposer 3700 is similar to the design decomposer 900 described above by reference to FIG. 9 except the design decomposer 3700 has several additional components and features of some common components that are different. FIG. 37 also illustrates the design layouts repository 905 and the design rules repository 935 described above by reference to FIG. 9. The design decomposer 3700 includes the design rule checker 915, the splicing graph minimizer 925, and the coloring engine 930. In addition, the design decomposer 3700 includes a layer selector 3725, a graph generator 3735, a graph storage 3715, and an interface 3740.

As described above, the design layout repository 905 stores one or more sets of IC layout data (e.g., a set of data which defines a number of shapes which will be fabricated on a number of layers of an IC). In some embodiments, the design decomposer 3700 receives an IC layout from the design layout repository 905. In other embodiments, the layout may be received from a different database or a different type of storage element. The IC layout data is received by a layer selector 3725, which in some embodiments selects a single layer of the IC layout to process. The layer selector 3725 provides the selected layer data to the design rule checker 935 in some embodiments.

The design rule checker 935 receives the selected layer data from the layer selector 3725 and a set of manufacturing constraints (e.g., design rules) from the design rules repository 935. In some embodiments, the set of manufacturing constraints may include a pitch requirement (e.g., minimum same color spacing rule), grid placement constraints, edge placement constraints, etc. The design rule checker 915 of some embodiments determines the CSSs of the received layer of the IC. In some embodiments, the design rule checker also associates the identified CSSs with a shape (e.g., the shape that includes the particular CSS).

The design rule checker 915 passes the identified and associated CSS data to the graph generator 3735 and/or to the splicing graph minimizer 925. In some embodiments, the graph generator is used to draw a line graph (e.g., a CSS graph or a shape graph). In addition, the graph generator may be used to partition the CSS graph into sub-graphs. The graph generator 3735, in addition to receiving data from the design rule checker 915, may also receive data from a graph storage element 3715. The graph generator of some embodiments passes its output to the graph storage element for use during later stages of the coloring process. The graph generator 3735 of some embodiments also passes its output to the interface 3740 and/or the splicing graph minimizer 925. In some embodiments, the graph generator 3735 identifies that a DP loop violation contained in the design layout is not resolvable by introducing splicing graphs.

The interface 3740 identifies and reports unresolvable DP loop violations to a user. In some embodiments, the interface identifies unresolvable DP loop violations based on shape graphs received from the graph generator 3735, while in other embodiments the interface simply reports the information about the unresolvable DP loop violation received from the graph generator. In some embodiments, the interface 3740 sends the design layout (or reference thereto) containing the unresolvable DP loop violation to another module (not shown) which resolves the DP loop violation by moving shapes in the design layout as described in Section II above.

The splicing graph minimizer 925 introduces splicing graphs in the shapes in the layer of the design layout that contains the DP loop violation. The splicing graph minimizer 925 receives or retrieves shapes, shape graphs, CSSs, CSS graphs, sub-graphs, etc. from the design rule checker 915, the graph generator 3735, and/or the graph storage 3715. The splicing minimizer 925 of some embodiments minimizes the number of splicing graphs it introduces by performing the process 33 described above by reference to FIG. 33.

The coloring engine 930 colors the shapes according to the colors assigned to the shapes by the splicing graph minimizer 925. That is, the coloring engine 930 modifies the layer of the design layout and deposits in the design layouts repository 905.

While many of the features have been described as being performed by one module (e.g., the graph generator 3735), one of ordinary skill would recognize that a particular operation might be split up into multiple modules, and the performance of one feature might even require multiple modules in some embodiments.

IV. ELECTRONIC SYSTEM

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 38:
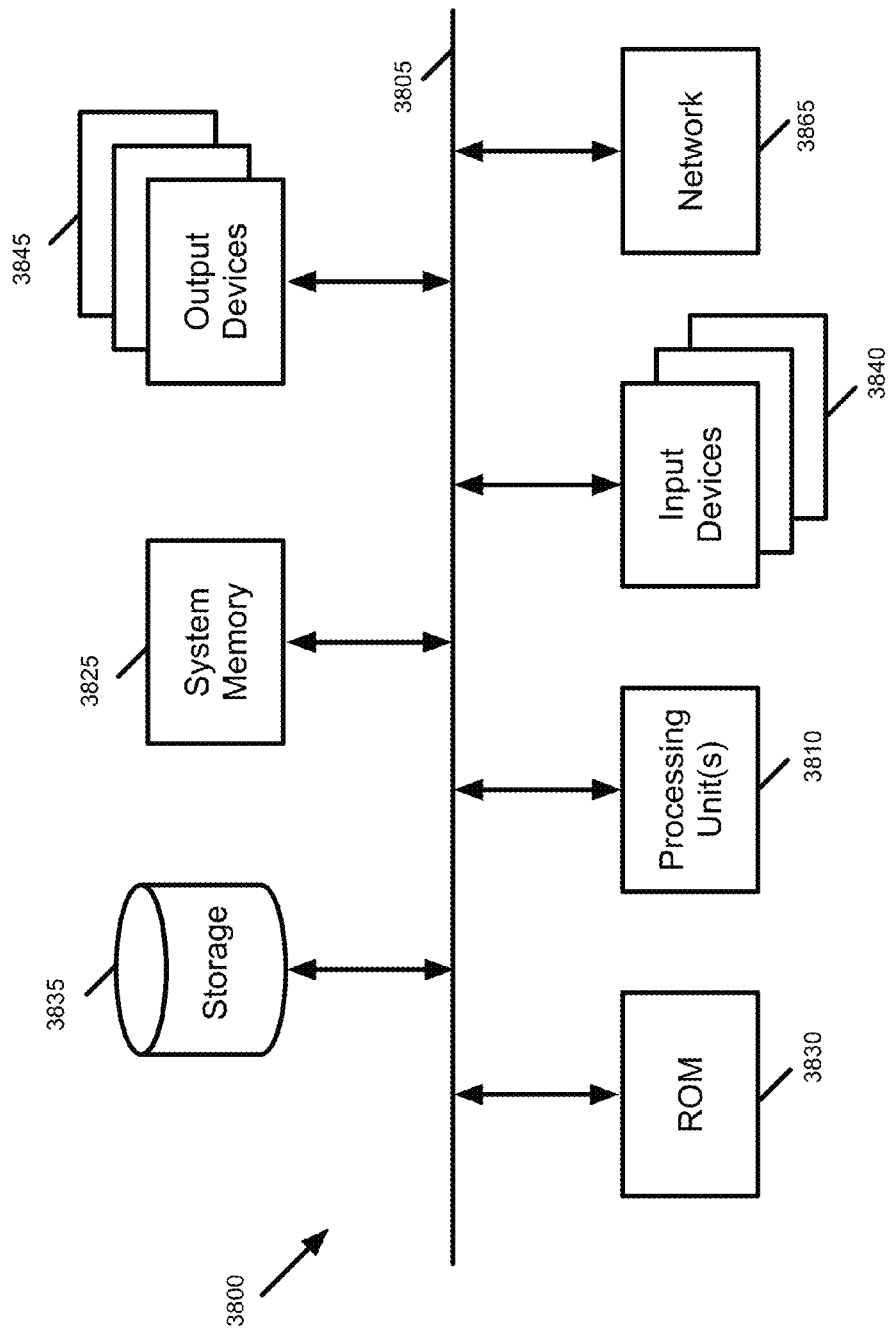
FIG. 38 illustrates an electronic system with which some embodiments of the invention are implemented.

FIG. 38 conceptually illustrates an electronic system 3800 with which some embodiments of the invention are implemented. The electronic system 3800 can be used to execute any of the control, virtualization, or operating system applications described above. The electronic system 3800 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 3800 includes a bus 3805, processing unit(s) 3810, a system memory 3825, a read-only memory 3830, a permanent storage device 3835, input devices 3840, and output devices 3845.

The bus 3805 collectively represents all system, peripheral, and chipset buses that communicatively connect the numerous internal devices of the electronic system 3800. For instance, the bus 3805 communicatively connects the processing unit(s) 3810 with the read-only memory 3830, the system memory 3825, and the permanent storage device 3835.

From these various memory units, the processing unit(s) 3810 retrieve instructions to execute and data to process in order to execute the processes of the invention. The processing unit(s) may be a single processor or a multi-core processor in different embodiments.

The read-only-memory (ROM) 3830 stores static data and instructions that are needed by the processing unit(s) 3810 and other modules of the electronic system. The permanent storage device 3835, on the other hand, is a read-and-write memory device. This device is a non-volatile memory unit that stores instructions and data even when the electronic system 3800 is off. Some embodiments of the invention use a mass-storage device (such as a magnetic or optical disk and its corresponding disk drive) as the permanent storage device 3835.

Other embodiments use a removable storage device (such as a floppy disk, flash drive, etc.) as the permanent storage device. Like the permanent storage device 3835, the system memory 3825 is a read-and-write memory device. However, unlike storage device 3835, the system memory is a volatile read-and-write memory, such a random access memory. The system memory stores some of the instructions and data that the processor needs at runtime. In some embodiments, the invention's processes are stored in the system memory 3825, the permanent storage device 3835, and/or the read-only memory 3830. For example, the various memory units include instructions for processing multimedia clips in accordance with some embodiments. From these various memory units, the processing unit(s) 3810 retrieve instructions to execute and data to process in order to execute the processes of some embodiments.

The bus 3805 also connects to the input and output devices 3840 and 3845. The input devices enable the user to communicate information and select commands to the electronic system. The input devices 3840 include alphanumeric keyboards and pointing devices (also called "cursor control devices"). The output devices 3845 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 38, bus 3805 also couples electronic system 3800 to a network 3865 through a network adapter (not shown). In this manner, the computer can be a part of a network of computers (such as a local area network ("LAN"), a wide area network ("WAN"), or an Intranet, or a network of networks, such as the Internet. Any or all components of electronic system 3800 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. For example, while the examples shown illustrate splitting one or more shapes of a design layout region into two exposures, one of ordinary skill in the art would recognize that some embodiments would use similar processes to split shapes of a design layout region into more than two (e.g., three, four, etc.) exposures. One of ordinary skill in the art will also recognize that in some instances above, when referring to assigning shapes or portions of shapes to multiple exposures, the shapes (or portions thereof) are actually assigned to multiple mask layouts that are used to create multiple masks that enable a design layout layer to be printed in multiple exposures. Similarly, one of ordinary skill would recognize that while many instances above refer to "drawing" a graph, some embodiments do not actually draw the visible graph, but instead define the graph as a data structure.

In addition, a number of the figures (including FIGS. 8, 10, 11, 14, 15, 17, 19, 22, 24, 30, 26, 33, and 34) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details.

What is claimed is:

1. A computer-implemented method for resolving a design rule violation in a circuit design layout including a plurality of shapes, the method comprising:

receiving data that indicates that an odd number of shapes form a loop in which each pair of neighboring-shapes has the pair's two shapes closer than a threshold distance;

generating, using a processor, a set of design solutions based on the received data, each design solution for moving at least one shape of at least one pair of neighboring-shapes so that a distance between the pair of neighboring-shapes exceeds the threshold distance; and prioritizing the generated design solutions based on a certain set of criteria to select a generated design solution to apply to the design layout.

2. The method of claim 1 further comprising selecting the highest priority design solution that does not cause a new design rule violation.

3. The method of claim 1 further comprising computing a cost of applying each of the generated design solutions to the design layout, wherein the certain set of criteria includes costs computed for the generated design solutions.

4. The method of claim 3, wherein the cost relates to likelihood of the design solution to cause a new design violation when applied to the design layout.

5. The method of claim 3, wherein computing the cost of applying the generated design solution comprises:
defining a set of regions based on a distance from the shape to move;
assigning different costs to different shapes in different defined regions; and
adding up the assigned costs.

6. The method of claim 3, wherein computing the cost of applying the generated design solution comprises computing a cost for each shape that would be within the threshold distance from the shape to move.

7. The method of claim 6, wherein the cost for each shape that would be within the threshold distance from the shape to move is computed based on the shape's distance from the moved shape.

8. The method of claim 6, wherein the cost for the shape that would be within the threshold distance from the shape to move is computed based on a type of the shape, wherein types of shapes comprise a regular shape, a via shape, and an instance shape.

9. The method of claim 3, wherein the cost of applying the generated design solution is computed based on a distance by which to move the at least one shape.

10. The method of claim 3, wherein computing the cost of applying the generated design solution comprises:
determining whether a via shape has a non-overlapping portion with the shape to move; and
when the via shape has a non-overlapping portion with the shape to move, adding an additional cost to the cost of applying the generated design solution.

11. The method of claim 1, wherein the certain set of criteria includes one criterion.

12. The method of claim 1, wherein the certain set of criteria includes two or more criteria.

13. A non-transitory machine readable medium storing a program for resolving a design rule violation in a circuit design layout including a plurality of shapes, the program comprising sets of instructions for:
receiving data for indicating a double patterning loop comprising an odd number of shapes, wherein each particular shape in the double patterning loop is within a threshold distance of neighboring shapes in the double patterning loop;
generating a set of design solutions based on the received data, each design solution for breaking the loop by moving at least one of the shapes in the double patterning loop;
setting priorities to the generated design solutions based on a certain set of criteria; and
using the priorities to select a generated design solution for applying to the circuit design layout.

14. The non-transitory machine readable medium of claim 13, wherein the program further comprises a set of instructions for computing a cost of applying each of the generated design solutions to the circuit design layout, wherein the certain set of criteria includes costs computed for the generated design solutions.

15. The non-transitory machine readable medium of claim 14, wherein the cost of applying the generated design solution is computed based on a number of shapes that would be within the threshold distance from the shape to move.

16. The non-transitory machine readable medium of claim 15, wherein the set of instructions for computing the cost comprises a set of instructions for adjusting the cost based on types of the shapes that would be within the threshold distance from the shape to move.

17. The non-transitory machine readable medium of claim 15, wherein the set of instructions for computing the cost comprises a set of instructions for adjusting the cost based on a distance between the shape to move and the shapes that would be within the threshold distance from the shape to move.

18. The non-transitory machine readable medium of claim 14, wherein the set of instructions for computing the cost comprises sets of instructions for:
identifying shapes that would be within the threshold distance from the shape to move;
assigning a cost to each of the identified shapes; and
adding up the assigned costs.

19. The non-transitory machine readable medium of claim 14, wherein shapes in the circuit design layout are grouped into a first set of shapes and a second set of shapes based on lithography masks on which the shapes are to be fabricated, wherein the set of instructions for computing the cost comprises sets of instructions for:
defining a region of the design layout based on a position of the shape to move in the design layout;
identifying shapes that fall within the defined region;
assigning a cost to each of the identified shapes when all of the identified shapes and the shape to move belong to the first set;
assigning a cost to each of the identified shapes when one of the identified shapes belongs to the first set and another of the identified shapes belongs to the second set;
assigning no cost to each of the identified shapes when all of the identified shapes belong to the first set while the shape to move belongs to the second set;
assigning no cost to each of the identified shapes when all of the identified shapes belong to the first set while the shape to move belongs to neither of the two sets; and
adding the assigned costs to the cost of applying the generated design solution.

20. A system comprising:
a processor for executing sets of instructions; and
a memory for storing a computer program for correcting a design rule violation in a circuit design layout including a plurality of shapes, the program comprising sets of instructions for:
receiving data for indicating a double patterning loop comprising number of shapes, wherein each particular shape is within a threshold distance of neighboring shapes in the double patterning loop;

generating a set of design solutions based on the received data, each design solution for breaking the loop by moving at least one of the shapes in the double patterning loop; and selecting a generated solution that has a lowest likelihood of causing a new design rule violation when applied to the design layout.

21. The system of claim 20, wherein the program further comprises a set of instructions for modifying the design layout using the selected design solution.

22. The system of claim 20, wherein the program further comprises a set of instructions for quantifying a likelihood of causing a new design rule violation for each generated design solution when the generated design solution is applied to the design layout.

* * * * *